US007794917B2

(12) United States Patent
Mori et al.

(10) Patent No.: US 7,794,917 B2

(45) Date of Patent: Sep. 14, 2010

(54) CURABLE COMPOSITION, COLOR FILTER AND MANUFACTURING METHOD THEREOF

(75) Inventors: Hisahiro Mori, Kanagawa (JP); Taeko Aizawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/852,864

(22) Filed: Sep. 10, 2007

(65) Prior Publication Data

US 2008/0076043 A1 Mar. 27, 2008

(30) Foreign Application Priority Data

Sep. 25, 2006 (JP) ............................ 2006-259685
Sep. 29, 2006 (JP) ............................ 2006-269373

(51) Int. Cl.
*G03F 1/00* (2006.01)
*G03F 7/00* (2006.01)

(52) U.S. Cl. .................... 430/281.1; 430/7; 430/270.1; 430/283.1; 430/284.1

(58) Field of Classification Search .................... 430/7, 430/270.1, 302
See application file for complete search history.

(56) References Cited

U.S. PATENT DOCUMENTS

2003/0082464 A1 5/2003 Takashima et al.
2003/0190554 A1* 10/2003 Kunita .................... 430/285.1
2005/0170285 A1* 8/2005 Sugasaki et al. ......... 430/270.1
2005/0214660 A1 9/2005 Yamada
2006/0068327 A1* 3/2006 Mori et al. ............... 430/281.1
2006/0229376 A1* 10/2006 Hayashi et al. ................ 522/6
2006/0257759 A1* 11/2006 Okazaki et al. ................ 430/7
2006/0263720 A1* 11/2006 Mori ....................... 430/270.1
2008/0044763 A1* 2/2008 Fujimaki ................ 430/273.1
2008/0088813 A1 4/2008 Takashima et al.

FOREIGN PATENT DOCUMENTS

| | | | |
|---|---|---|---|
| JP | 4864183 | A | 9/1973 |
| JP | 4943191 | B | 11/1974 |
| JP | 5230490 | B | 8/1977 |
| JP | 5170705 | A | 7/1993 |
| JP | 2874091 | B2 | 1/1999 |
| JP | 11038226 | A | 2/1999 |
| JP | 11193325 | A | 7/1999 |
| JP | 2000239332 | A | 9/2000 |
| JP | 2005099488 | A | 4/2005 |
| JP | 2005104842 | A | 4/2005 |
| JP | 2006030541 | A | 2/2006 |
| WO | 03/010602 | A1 | 2/2003 |
| WO | 2006/028060 | A1 | 3/2006 |
| WO | 2006/049264 | A1 | 5/2006 |
| WO | WO 2006049264 | A1 * | 5/2006 |

* cited by examiner

*Primary Examiner*—Cynthia H Kelly
*Assistant Examiner*—Chanceity N Robinson
(74) *Attorney, Agent, or Firm*—Sughrue Mion, PLLC

(57) ABSTRACT

According to the present invention, there is provided a curable composition, containing a compound (A) having at least one ethylenically unsaturated double bond, a photopolymerization initiator (B), a coloring agent (C), an alkali-soluble resin (D), and a compound (E) having in the molecule a partial structure of urethane, amide or urea.

7 Claims, No Drawings

CURABLE COMPOSITION, COLOR FILTER AND MANUFACTURING METHOD THEREOF

CROSS-REFERENCE TO RELATED APPLICATION

This application claims priority under 35 USC 119 from Japanese Patent Applications Nos. 2006-259685 and 2006-269373, the disclosures of which are incorporated by reference herein.

BACKGROUND

1. Technical Field

The present invention relates to a curable composition favorable for forming a color filter for use in liquid crystal display elements (LCD) and solid-state image pickup elements (such as CCD and CMOS), a color filter, and a method for manufacturing the color filter.

Further, the present invention relates to a curable composition which can be utilized in: three-dimensional photofabrication and holography; image forming material such as color filters, photoresists, planographic printing plate materials and color proofs; and photocurable materials such as inks, paints, and adhesives, coating agents, and dental materials. The invention also relates to a color filter using the curable composition, and a manufacturing method thereof.

2. Related Art

A color filter is an essential constituent of liquid crystal displays and solid-state image pickup elements.

Since liquid crystal displays are compact and provide equivalent or greater performance as display devices when compared with CRTs, therefore they are replacing CRTs as television screens, personal computer screens, or other display device. In recent years, the trend in development of liquid crystal displays from conventional monitor applications in which screens are of a relatively small size towards TV applications requiring a large scale screens and high image quality.

In applications of color filter for liquid crystal displays (LCD), the substrate size is being extended due to large size TV production, and curing at a low energy is desired in order to improve productivity when large substrates are used. In addition, in liquid crystal displays in TV applications, higher image quality is required as compared with the previous monitor applications. That is, an improvement in contrast and in color purity is required. For improving the contrast, regarding curable compositions used in manufacturing the color filters, a smaller particle size of coloring agents (organic pigments etc.) used is required (e.g. see Japanese Patent Application Laid-Open (JP-A) No. 2006-30541). Accompanying this, there is a tendency that the addition amount of dispersants for dispersing pigments is increased. In addition, for improving the color purity, content of the coloring agent (organic pigment) within the solid content of the curable composition is required to be higher. Therefore, there is a tendency that the content of photopolymerization initiators and photopolymerizable monomers within the solid content in the curable composition is decreased.

On the other hand, curing at a low energy is also desired in applications of color filters for solid-state image pickup elements. In addition, film patterns are getting thinner and, accompanying this, the concentration of pigments in such compositions is rising. Furthermore, in a pigment-based color filter, there is a tendency that the proportion of pigment dispersant in the composition increases as the pigments get finer. Due to these factors, in both liquid crystal display applications and in solid-state image pickup element applications, since the content of photopolymerization initiator and photopolymerizable monomers, which are necessary components for curing the curable composition, is restricted and as the concentration of the coloring agents is increased, there arises a problem that sensitivity is low, and sufficient curing is not obtained. This means that adhesion to the substrate is insufficient, and there are significant difficulties in forming the desired pattern. As a countermeasure to this problem, the technique of introducing a silane coupling agent for improving substrate adhesion (e.g. see JP-A No. 2006-30541 and JP-A No. H11-38226), and the technique of using a photopolymerization initiator having a particular functional group (e.g. see JP-A No. 2005-99488) are proposed, however in practice further improvement is desired.

In addition, since a curable composition containing a polyfunctional acrylate compound can be cured in a very short time with irradiation of rays of actinic energy such as ultraviolet rays, and is excellent in productivity, it has been conventionally used widely in three-dimensional photofabrication and holography, or as an image forming material in color filters, photoresists, and planographic printing plate materials and color proofs, in inks, paints, adhesives, coating agents and dental materials.

Examples of such the polyfunctional acrylate compound include polyfunctional acrylates such as polyethylene glycol diacrylate, trimethylolethane triacrylate, neopentyl glycol diacrylate, pentaerythritol triacrylate, pentaerythritol tetraacrylate, dipentaerythritol pentaacrylate, dipentaerythritol hexaacrylate, hexanediol acrylate, trimethylolpropane tri(acryloyloxypropyl) ether, tri(acryloyloxyethyl) isocyanurate; compounds obtained by adding ethylene oxide or propylene oxide to polyfunctional alcohols such as glycerin and trimethylolethane, followed by acrylation; urethane group-containing acrylates (e.g. see JP-A No. 5-170705, JP-A No. 11-193325, JP-A No. 2000-239332 and JP-A No. 2005-104842), polyester acrylates (e.g. see JP-A No. S48-64183, Japanese Patent Application Publication (JP-B) No. S49-43191, and JP-B No. S52-30490), polyfunctional acrylates such as epoxy acrylates which are reaction products of an epoxy resin and acrylic acid, and mixtures thereof.

In recent years, demand for such curable compositions is increasing further enhanced in the aforementioned applications, and compositions which are cured at lower energy, compositions which are cured faster, and compositions which form a finer image are required. Among these, since curable compositions for color filters, inks and paints contain coloring matter which absorbs rays of actinic energy such as ultraviolet rays, there is the problem that while the surface is cured, the inside is not sufficiently cured.

In applications of color filters for solid-state image pickup elements (CCD, CMOS, etc.), since a still higher resolution pattern is desired, and a film thickness of 1.2 μm or less is required, a large amount of coloring matter must be added to the curable composition, and there is a tendency that the proportion of polyfunctional acrylate is reduced. In addition, in applications of color filters for liquid crystal displays (LCD), the substrate size is increasing due to the production of large size TVs, and curing at a low energy is desired in order to improve productivity a large substrate is used. In addition, there is a tendency that with pigment getting finer in order to improve the contrast, the proportion of pigment dispersant in the composition is increased, and the proportion of polyfunctional acrylate is reduced. Due to this there is a problem that, in both solid-state image pickup element applications and LCD applications, sensitivity is low, and sufficient curing is not obtained. This means that adhesion to the substrate is insufficient, and fading occurs even at light-exposed portions, and there are significant difficulties in forming a desired pattern.

SUMMARY

The present invention has been made in view of the above circumstances and provides a curable composition, a color filter and a manufacturing method thereof.

A first aspect of the invention provides a curable composition, comprising: a compound (A) having at least one ethylenically unsaturated double bond; a photopolymerization initiator (B); a coloring agent (C); an alkali-soluble resin (D); and a compound (E) having in the molecule a partial structure of urethane, amide, or urea.

A second aspect of the invention provides a curable composition comprising a compound represented by the following formula (I) and a photopolymerization initiator.

(I)

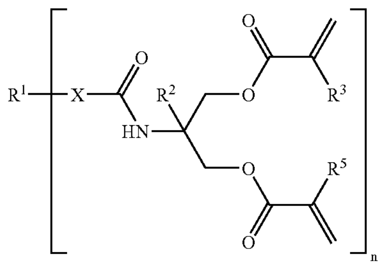

[wherein in the formula (I), $R^1$ represents a n-valent organic group, $R^2$ represents a hydrogen atom or an alkyl group with 1 to 4 carbon atoms, $R^3$ and $R^5$ each independently represent a hydrogen atom or a methyl group, X represents —O—, —NH—, —$NR^4$—, or —S—, $R^4$ represents a hydrogen atom or a monovalent organic group, and n denotes an integer of 1 to 12]

DETAILED DESCRIPTION (First Aspect)

A curable composition related to a first aspect of the present invention, a color filter using the curable composition and a manufacturing method thereof will be explained in detail below.

[Curable Composition]

The curable composition of the invention is a radiation-sensitive composition, particularly suitable for curing with light, contains a compound (A) having at least one ethylenically unsaturated double bond (polymerizable compound); a photopolymerization initiator (B); a coloring agent (C); an alkali-soluble resin (D); and a compound (E) having in the molecule a partial structure of urethane, amide or urea and, if desired, contains a solvent and other component.

Each compound contained in the curable composition of the invention will be sequentially explained below. First, the compound (E) having in the molecule a partial structure of urethane, amide or urea [hereinafter, suitably referred to as (E) component], which is an important constitutional component of the invention, will be explained.

<(E) Compound Having a Partial Structure of Urethane, Amide or Urea in Molecule>

As the (E) compound having a partial structure of urethane, amide or urea in a molecule in the invention, any compound may be used so long as it is selected from a compound having a urethane bond, a compound having an amido group, and a compound having a urea bond in a molecule. From a viewpoint of the pattern forming property, a compound having a urethane bond as a partial structure in a molecule is preferable. The (E) component is preferably a compound having a nitrogen atom-containing heterocycle in its structure, further preferably isocyanurate.

In addition, when influence of the (E) component on physical property of the curable composition of the invention is taken into consideration, for example, from a viewpoint of developability, it is preferable to have an alkylene oxide group in addition to the aforementioned structure in a molecule and, as the alkylene oxide group, an ethylene oxide group and a propylene oxide group are preferable, and an ethylene oxide group is particularly preferable.

Furthermore, from a viewpoint of improvement in curability of the composition, it is preferable to have an ethylenically unsaturated double bond group in a molecule.

Specific examples of a urethane compound and an isocyanurate compound having the ethylenically unsaturated bond group which are suitably used as the (E) component in the invention preferably include a reaction product of a compound having an isocyanate bond and an alcohol compound represented by the following, formula (I').

Formula (I')

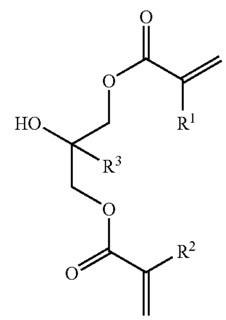

In the formula (I'), $R^1$ and $R^2$ each independently represent a hydrogen atom or an alkyl group and, as this alkyl group, an alkyl group of a carbon number of 1 to 5 is preferable. $R^1$ and $R^2$ are fierier preferably a hydrogen atom or a methyl group, respectively.

$R^3$ represents a hydrogen atom, an alkyl group, an alkoxy group, an allyl group, an aryl group, a frictional group represented by the following formula (II'), or a functional group represented by the following formula (III'). Among these, a hydrogen atom an alkyl group of a carbon number of 1 to 5, an alkoxy group of a carbon number of 1 to 5, or a functional group represented by the formula (III') is preferable, and a methyl group or a functional group represented by the formula (III') is further preferable.

Formula (II')

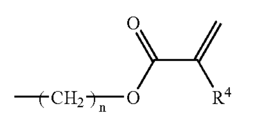

Formula (III')

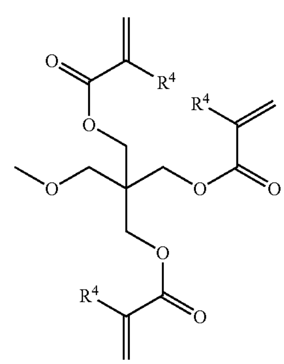

In the formula (II'), n denotes an integer of 1 to 10, preferably 1 to 5. In the formula (II') and the formula (III'), $R^4$ represents a hydrogen atom or an alkyl group and, as the alkyl group, an alkyl group of a carbon number of 1 to 5 is preferable. In the formula (III'), plural $R^4$s present in a molecule may be the same or different. Further preferably, $R^4$ includes a hydrogen atom and a methyl group.

Examples of the alcohol compound represented by the formula (I') are not restricted to, but include Compounds (MA-1) to (MA-4), (MA-11) and (MA-12), and Compounds (MA-5) to (MA-10) which are exemplified below.

[Alcohols: Exemplified Compounds (MA-1) to (MA-12)]

MA-1

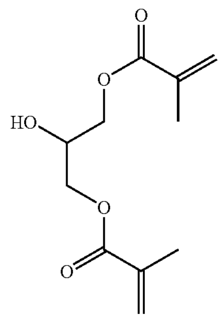

MA-2

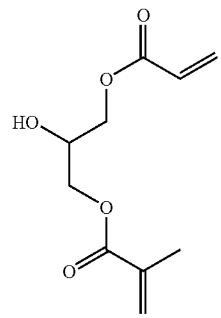

MA-3

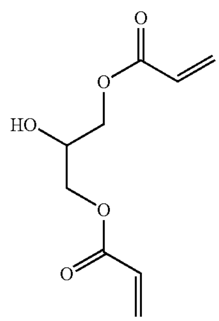

MA-4

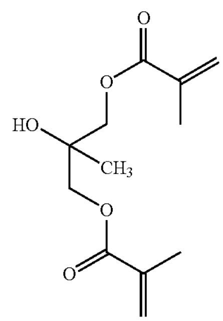

MA-5

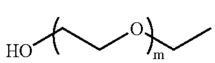

MA-6

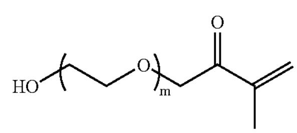

MA-7

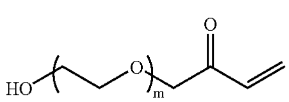

m = integer of 1 to 20

MA-8

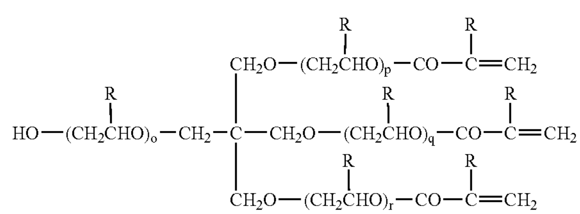

R = hydrogen or methyl group
o, p, q, r, s, t = rational number of 0 to 20

MA-9

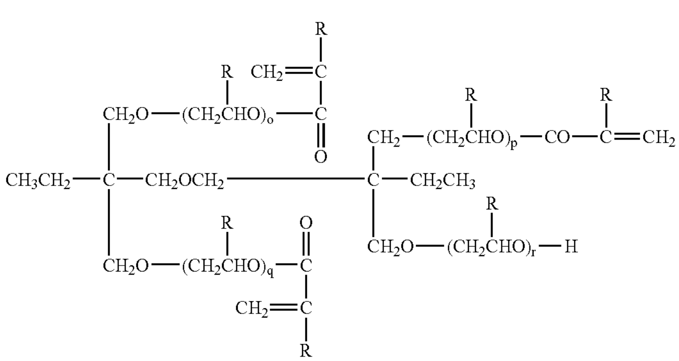

-continued

MA-10

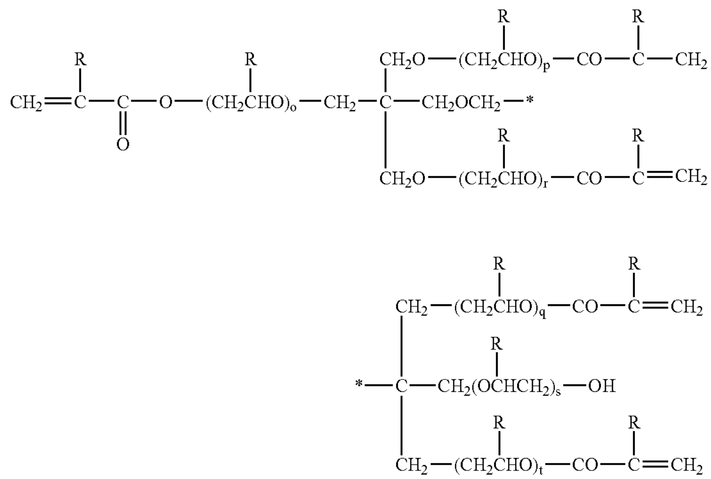

MA-11

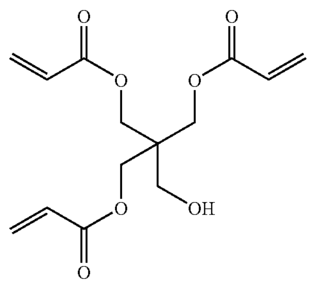

MA-12

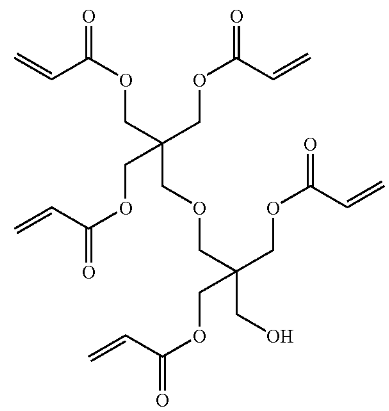

As the (E) component, a reaction product of alcohols selected from the exemplified compounds, and a compound selected from the following isocyanate-based Compounds (MU-1) to (MU-27) is preferable.

A reaction between a compound having an isocyanate bond and an alcohol compound is performed, for example, under the following condition.

Amounts of the isocyanate compound and the alcohol compound to be charged were adjusted so that an isocyanate group number of moles of the isocyanate compound and a hydroxy group number of moles of the alcohol compound become equal.

A reaction catalyst is not particularly restricted, but preferably, organic tin (meth)acrylate such as bismuth tris(2-ethylhexanoate), dibutyltin dilaurate, dibutyltin acetate, dibutyltin dichloride, and tin octylate, organic zinc(meth)acrylate such as zinc octylate, and zinc naphthenate, tertiary amines such as triethylenediamine, and triethylamine, and (meth) acrylate having an amidine skeleton such as 1,8-diazabicyclo [5,4,0]-7-undecene are used, and the catalyst can be added in a range of 0.0001 to 10 parts by weight relative to 100 parts by weight of thiol or isocyanate.

As used herein, when one or both of acrylate and methacrylate is expressed, it is expressed by "(meth)acrylate".

As the reaction condition, usually, a temperature range of −50° C. to 100° C. is applied. At −50° C. or lower, a reaction proceeds extremely slowly and, at 100° C. or higher; not only a byproduct is increased, and a yield is reduced, but also gelation may occur, being not preferable. If necessary, the reaction is performed by dilution with a solvent. As the solvent to be used, solvents except for those reacting with isocyanate such as alcohol, carboxylic acid and amines can be used. From a viewpoint of a reaction rate and solubility, polar solvents such as acetonitrile, N,N-dimethylformamide (DMF), N,N-dimethylacetamide (DMAc), dimethyl sulfoxide (DMSO), and N-methyl-2-pyrrolidone (NMP), chlorine-based solvents such as chloroform, and aromatic solvents such as toluene, and xylene are preferably used. In addition, in order to prevent a reaction between residual water and isocyanate, a dehydrating solvent is suitably used.

After completion of the reaction, this reaction solution was concentrated under reduced pressure, followed by purification with a silica gel column (eluant: ethyl acetate/n-hexane=1:1). The reaction solution may be also purified by chromatography, recrystallization or reprecipitation.

Specific compounds of isocyanates MU which can produce the urethane compound or the isocyanurate compound having an ethylenically unsaturated bond group, which is a preferable (E) component of the invention are shown below.

[Isocyanates: Exemplified Compounds (MU-1) to (MU-27)]

MU-1

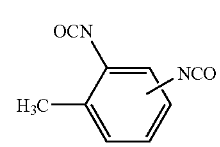

(2,4 and 2,6 bodies)

-continued
MU-2
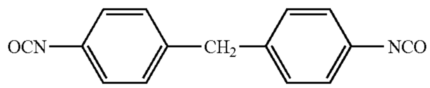
MU-3
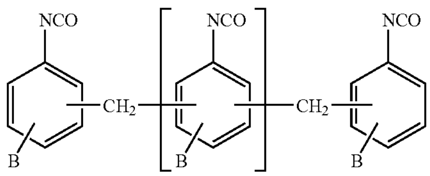
B: H, $CH_3$
m = 0, integer of 1 or more
MU-4
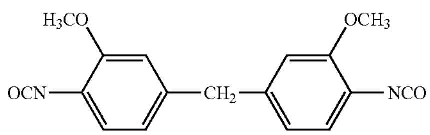
MU-5
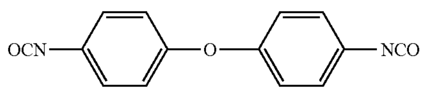
MU-6
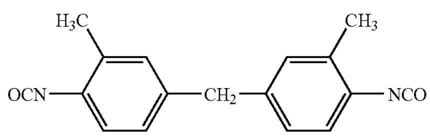
MU-7
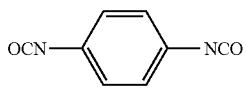
MU-8
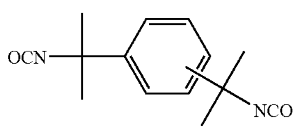
MU-9
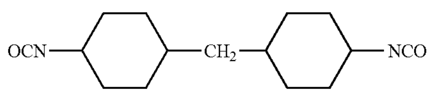
MU-10
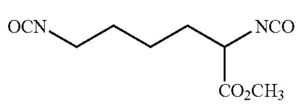
MU-11
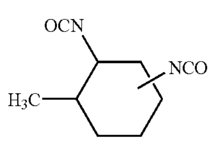
(2,4 and 2,6 bodies)
MU-12
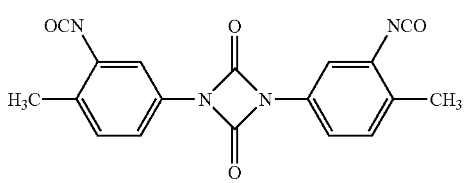
-continued
MU-13
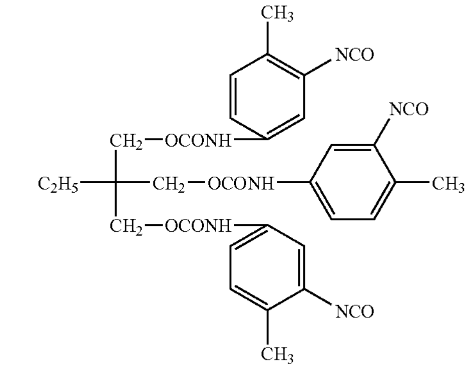
MU-14
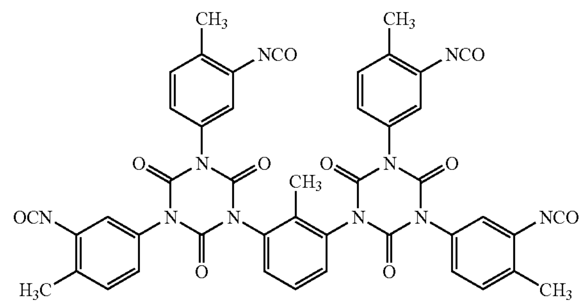
MU-15
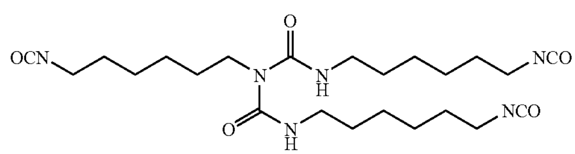
MU-16
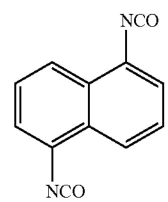
MU-17
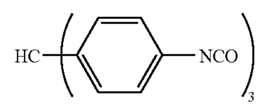
MU-18
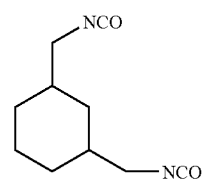
MU-19
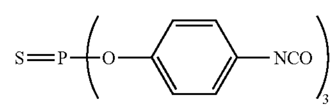
MU-20
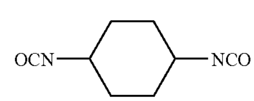
MU-21
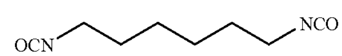

-continued

MU-22

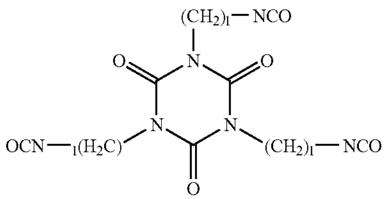

l = integer of 1 to 20

MU-23

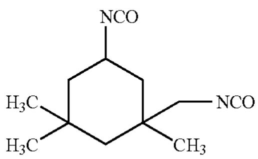

MU-24

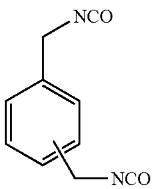

MU-25

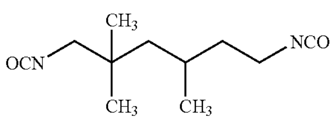

MU-26

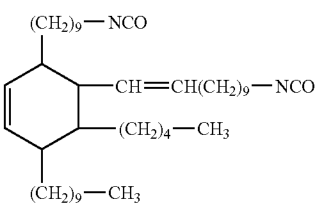

MU-27

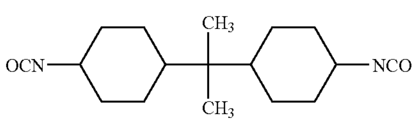

Examples of the urea compound having an ethylenically unsaturated bond group which is other preferable example of the (E) component in the invention include a reaction product of an amine compound and a compound having a urethane bond.

A reaction between the compound having an isocyanate bond and the amine compound is performed, for example, under the following condition.

(Charging Amount)

The charging amount was adjusted so that an isocyanate group number of moles of the isocyanate compound and a urea group number of moles of the urea compound became equal. A catalyst is not particularly restricted, but preferably, organic tin (meth)acrylate such as bismuth tris(2-ethylhexanoate), dibutyltin dilaurate, dibutyltin acetate, dibutyltin dichloride, and tin octylate, organic zinc (meth)acrylate such as zinc octylate, and zinc naphthenate, tertiary amines such as triethylenediamine, and triethylamine, and (meth)acrylate having an amidine skeleton such as 1,8-diazabicyclo[5,4,0]-7-undecene are used, and the catalyst is added in a range of 0.0001 to 10 parts by weight relative to 100 parts by weight of thiol or isocyanate.

(Catalyst, Solvent, Reaction Temperature)

Usually, a temperature range of −20° C. to 80° C. is applied. A temperature range is preferably −10° C. to 50° C., further preferably −5° C. to 30° C. As the solvent, solvents except for those reacting with isocyanate such as alcohol, carboxylic acid and amines can be used. From a viewpoint of a reaction rate and solubility, polar solvents such as acetonitrile, N,N-dimethylformamide (DMF), N,N-dimethylacetamide (DMAc), dimethyl sulfoxide (DMSO), and N-methyl-2-pyrrolidone (NMP), chlorine-based solvents such as chloroform, and aromatic solvents such as toluene, and xylene are preferably used. In addition, in order to prevent a reaction between residual water and isocyanate, a dehydrating solvent is suitably used.

After completion of the reaction, this reaction solution was concentrated under reduced pressure, followed by purification with a silica gel column (eluant: ethyl acetate/n-hexane=1/1). The reaction solution may be also purified by chromatography, recrystallization or reprecipitation.

Specific examples of the amine compound, and the compound having a urethane bond which are a raw material of such the urea compound include amine Compounds (A-1) to (A-15), and Compounds (MU-28) to (MU-30) containing a urethane bond as a partial structure.

(A-1)

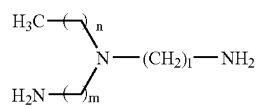

(A-2)

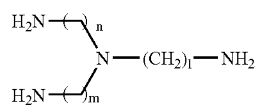

(A-3)

$$H_2N—(CH_2)_m—NH—(CH_2)_n—CH_3$$

(A-4)

$$H_2N—(CH_2)_m—NH—(CH_2)_n—NH_2$$

(A-5)

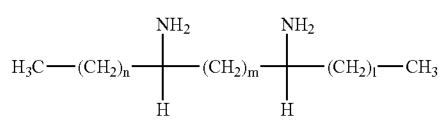

Wherein l, m and n each independently is an integer of 0 to 20.

(A-6)

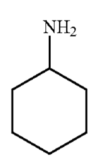

(A-7)

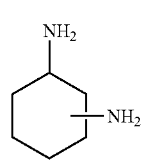

-continued (A-8)

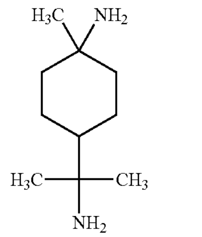

(A-9)

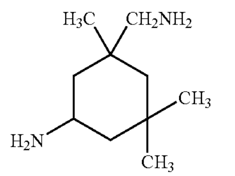

(A-10)

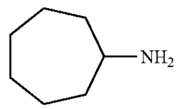

(A-11)

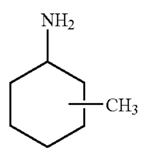

(A-12)

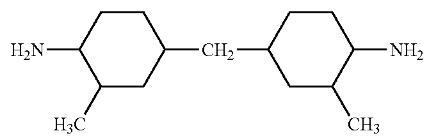

(A-13)

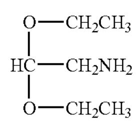

(A-14)

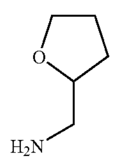

(A-15)

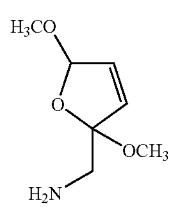

MU-28

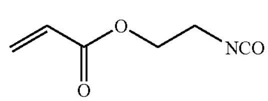

MU-29

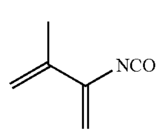

MU-30

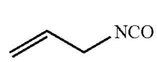

Examples of the amide compound having an ethylenically unsaturated bond group which is another preferable example of the (E) component in the invention include a reaction component of an amine compound and a halogen-containing compound.

As a reaction method, both compounds were charged so that a number of moles of an amino group and a number of moles of an acid halide group were equal, and a catalytic amount to an equal amount to that of acid halide of a base was added. Examples of a basic substance include triethylamine and pyridine. Examples of a solvent include THF, acetonitrile, and dimethylacetamide. A reaction temperature is in a range of preferably −30° C. to 100° C., further preferably −20° C. to 80° C., and more preferably −20° C. to 50° C. After completion of the reaction, this reaction solution was concentrated under reduced pressure, followed by purification with a silica gel column (eluant: ethyl acetate/n-hexane=1/1). The reaction solution may be also purified by chromatography, recrystallization or reprecipitation.

Examples of such the amide compound having an ethylenically unsaturated bond group preferably include a reaction product of amine Compounds (A-1) to (A-15) used in synthesis of the urea compound, and the halogen-containing compound. The halogen-containing compound used in this synthesis [exemplified Compounds (C-1) to (C-33)] is shown below.

(C-1)

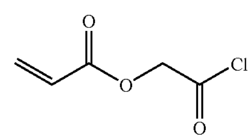

(C-2)

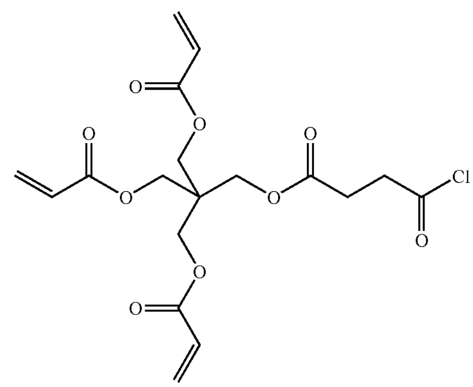

(C-3)

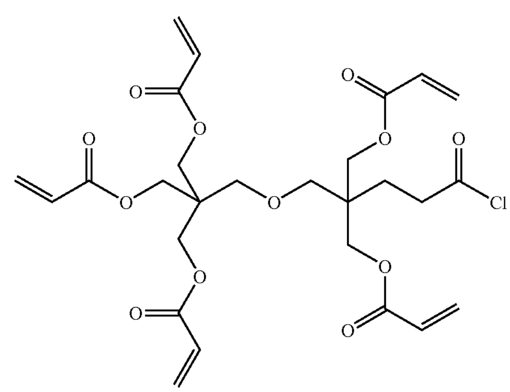

Thus obtained (E) component is contained in a range of preferably 0.3 to 5.0% by mass, further preferably 0.5 to 2.0% by mass in a total solid content of the curable composition of the invention.

In addition, the (E) component is contained at preferably 2 parts by mass or more and less than 25 parts by mass, further preferably 5 parts by mass or more and less than 10 parts by mass relative to 100 parts by mass of an ethylenically unsaturated double bond compound (A) described later.

<(A) Compound Containing Ethylenically Unsaturated Double Bond>

The curable composition of the invention contains a compound (A) containing an ethylenically unsaturated double bond.

The compound containing an ethylenically unsaturated double bond which can be used in the invention is an addition-polymerization compound having at least one ethylenically unsaturated double bond, and is selected from compounds having at least one, preferably two or more terminal ethylenically unsaturated bonds. Such the compound group is widely known in the art and in the invention, these can be used without any restriction. These have a chemical form such as a monomer, a prepolymer, that is, a dimer, a trimer and an oligomer, and a mixture thereof as well as a copolymer thereof. Examples of the monomer and the copolymer thereof include unsaturated carboxylic acids (e.g. acrylic acid, methacrylic acid, itaconic acid, crotonic acid, isocrotonic acid, maleic acid, etc.), and esters, and amides thereof. Preferably, esters of unsaturated carboxylic acid and an aliphatic polyhydric alcohol compound, and amides of unsaturated carboxylic acid and an aliphatic polyvalent amino compound are used. In addition, addition reaction products of unsaturated carboxylic acid esters or amides having a nucleophilic substituent such as a hydroxyl group, an amino group, and a mercapto group, and monofunctional or polyfunctional isocyanates of epoxies, and dehydration condensation reaction products with monofunctional or polyfunctional carboxylic acids are also suitably used. In addition, addition reaction products of unsaturated carboxylic acid esters or amides having an electrophilic substituent such as an isocyanate group, and an epoxy group, and monofunctional or polyfunctional alcohols, amines or thiols, and substitution reaction products of unsaturated carboxylic acid esters or amides having an climbable substituent such as a halogen group, and a tosyloxy group, and monofunctional or polyfunctional alcohols, amines or thiols are also preferable. As another example, a compound group in place of the unsaturated carboxyl acids are substituted with unsaturated phosphonic acid, styrene or vinyl ether may be used.

As a specific example of a monomer of an ester of an aliphatic polyhydric alcohol compound and unsaturated carboxylic acid, there are acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and isocyanuric acid EO-modified triacrylate.

There are methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis-[p-(methacryloxyethoxy)phenyl]dimethylmethane.

There are itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. There are crotonic acid esters such as ethylene glycol dicrotonate, tetramethylene glycol dicrotonate, and pentaerythritol dicrotonate. There are isocrotonic acid esters such as ethylene glycol diisocrotonate, pentaerythritol diisocrotonate, and sorbitol tetraisocrotonate. There are maleic acid esters such as ethylene glycol dimaleate, triethylene glycol dimaleate, pentaerythritol dimaleate, and sorbitol tetramaleate.

As an example of other ester, for example, aliphatic alcohol-based esters described in JP-B No. 51-47334, and JP-A No. 57-196231, esters having an aromatic skeleton described in JP-A No. 59-5240, JP-A No. 59-5241, and JP-A No. 2-226149, and esters containing an amino group described in JP-A No. 1-165613 are also preferably used. Further, the aforementioned ester monomers may be also used as a mixture.

In addition, as a specific example of a monomer of amide of an aliphatic polyhydric amine compound and unsaturated carboxylic acid, there are methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. Examples of other preferable amide-based monomer include monomers having a cyclohexylene structure described in JP-B No. 54-21726.

In addition, a urethane-based addition-polymerization compound which is produced using an addition reaction between isocyanate and a hydroxyl group is also preferable, and specific examples of such the compound include a vinylurethane compound containing two or more polymerizable vinyl groups in one molecule, in which a vinyl monomer containing a hydroxyl group represented by the following formula (V) is added to a polyisocyanate compound having two or more isocyanate groups in one molecule described in JP-B No. 48-41708.

$$CH_2{=}C(R^4)COOCH_2CH(R^5)OH \qquad (V)$$

(Wherein $R^4$ and $R^5$ represent H or $CH_3$)

In addition, urethane acrylates described in JP-A No. 51-37193, JP-B No. 2-32293, and JP-B No. 2-16765, and urethane compounds having an ethylene oxide-based skeleton described in JP-B No. 58-49860, JP-B No. 56-17654, JP-B No. 62-39417, and JP-B No. 62-39418 are also preferable. Furthermore, by using addition-polymerization compounds having an amino structure or a sulfide structure in a molecule, described in JP-A No. 63-277653, JP-A No. 63-260909, and JP-A No. 1-105238, a photopolymerizable composition, which is very excellent in a photosensitive speed, can be obtained.

Other examples include polyfunctional acrylates and methacrylates such as polyester acrylates, and epoxy acrylates obtained by reaction of an epoxy resin and (meth)acrylic acid, described in each gazette of JP-A No. 48-64183, JP-B No. 49-43191, and JP-B No. 52-30490. In addition, examples include specified unsaturated compounds described in JP-B No. 46-43946, JP-B No. 1-40337, and JP-B No. 1-40336, and vinylphosphonic acid-based compounds described in JP-A No. 2-25493. In some cases, a structure containing a perfluoroalkyl group described in JP-A No. 61-22048 is preferably used. Furthermore, compounds which are introduced as a photocurable monomer and oligomer in Journal of Adhesion Society of Japan, vol. 20, No. 7, p. 300-308 (1984) can be also used.

Regarding these addition-polymerization compounds, details of usage such as a structure thereof, whether they are used alone or in combination, and an addition amount can be arbitrarily set depending on performance design of a final sensitive material. For example, details are selected from the following viewpoint.

In respect of a sensitivity, a structure having a higher unsaturated group content per molecule is preferable and, in many cases, di- or higher functional is preferable. In addition, in order to increase a strength of an image part, that is, a cured film, a tri- or higher functional is favorable and, further, a method of regulating both of a sensitivity and a strength by using a different functional number a different polymerizable group (e.g. acrylic acid ester, methacrylic acid ester, styrene-based compound, vinyl ether-based compound) in combination is also effective. From a viewpoint of a curing sensitivity, it is preferable to use a compound containing 2 or more (meth)acrylic acid ester structures, it is more preferable to use a compound containing 3 or more structures, and it is most preferable to use a compound containing 4 or more structures. And, from a viewpoint of a curing sensitivity, and developability of an unexposed part, it is preferable that an EO-modified compound is contained. And, from a viewpoint of a curing sensitivity, and a strength of an exposed part, it is preferable that a urethane bond is contained.

In addition, for compatibility and dispersibility with other component (e.g. binder polymer, initiator, coloring agent (pigment, dye, etc.)) in a polymerizable layer, a method of selecting and using the addition-polymerization compound is an important factor, and for example, compatibility is improved by using a low purity compound, or using two or more kinds in combination, in some cases. Alternatively, for the purpose of improving adhesion of a substrate or an overcoated layer, a specified structure can be selected.

From the above viewpoint, preferable examples include bisphenol A diacrylate. EO-modified bisphenol A diacrylate, trimethylolpropane triacrylate, trimethylolpropane tri(acryloyloxypropyl) ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, EO-modified pentaerythritol tetraacrylate, and EO-modified dipentaerythritol hexaacrylate. As a commercially available product, urethane oligomer UAS-10, UAB-140 (manufactured by Sanyo Kokusaku Pulp), DPHA-40H (manufactured by Nippon Kayaku Co., Ltd.), UA-306H, UA-306T, UA-306I, AH-600, T-600, and AI-600 (manufactured by Kyoeisha Chemical CO., LTd.) are preferable.

Among these, EO-modified bisphenol A diacrylate, pentaerythritol triacrylate, pentaerythritol tetraacrylate, dipentaerythritol pentaacrylate, dipentaerythritol hexaacrylate, tri (acryloyloxyethyl) isocyanurate, EO-modified pentaerythritol tetraacrylate, and EO-modified dipentaerythritol hexaacrylate are more preferable. As a commercially available product, DPHA-40H (manufactured by Nippon Kayaku Co., Ltd.), UA-306H, UA-306T, UA-306I, AH-600, T-600, and AI-600 (manufactured by Kyoeisha Chemical CO., LTd.) are more preferable.

A content of the (A) compound having an ethylenic double bond is preferably 1 to 90% by mass, more preferably 5 to 80% by mass, further preferably 10 to 70% by mass in a solid content of the curable composition of the invention.

Particularly, when the curable composition of the invention is used in forming a coloring pattern of a color filter, the content is preferably 5 to 50% by mass, more preferably 7 to 40% by mass, further preferably 10 to 35% by mass in the aforementioned content range.

<(B) Photopolymerization Initiator>

The curable composition of the invention contains a (B) photopolymerization initiator.

The photopolymerization initiator in the invention is a compound which is degraded with light, and initiates and promotes polymerization of the (A) compound containing an ethylenically unsaturated bond, and preferably has absorption in a region of a wavelength 300 to 500 nm. Photopolymerization initiators can be used alone, or by using two or more kinds in combination.

Examples of the photopolymerization initiator include an organic halogenated compound, an oxydiazole compound, a carbonyl compound, a ketal compound, a benzoin compound, an acridine compound, an organic peroxide compound, an azo compound, a coumarine compound, an azide compound, a metallocene compound, a hexaarylbiimidazole compound, an organic boric compound, a disulfonic compound, an oxime ester compound, an onium salt compound, and an acylphosphine (oxide) compound. In the invention, 2,2'-bis (O-chlorophenyl)-4,4',5,5'-tetraphenylbiimidazole is preferable and, by adopting a photopolymerization initiation system obtained by combining this polymerization initiator with a sensitizing dye, and a mercapto compound, a higher sensitivity becomes possible.

A ratio of combining the initiator, the sensitizing dye and the mercapto compound is such that an amount of 2,2'-bis(O-chlorophenyl)-4,4',5,5'-tetraphenylbiimidazole is preferably 1 to 5 equivalent, flier preferably 1 to 2 equivalent relative to the sensitizing dye.

In addition, an amount of the mercapto compound is preferably 0.5 to 10 equivalent, further preferably 1 to 3 equivalent relative to 2,2'-bis(O-chlorophenyl)-4,4',5,5'-tetraphenylbiimidazole.

A preferable content of the (B) photopolymerization initiator in the curable composition of the invention is in a range of preferably around 3 to 20% by mass, further preferably 5 to 10% by mass in a term of a solid content concentration.

As the sensitizing dye used in the photopolymerization initiation system in the invention, Michler's ketone is preferable, dyes described in paragraph number [00221] to [0042] of JP-A No. 2006-171689 are preferable, and the following compound B is particularly preferable.

Compound B

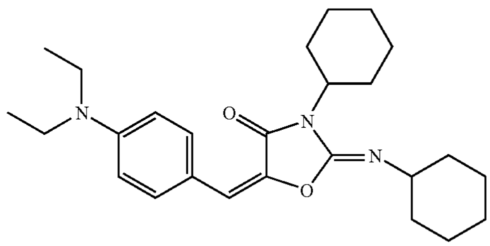

As the mercapto compound used in the photopolymerization initiation system, in addition to mercaptobenzothiazole also used in Example described later, compounds having the following structures are preferable.

A SH group in the following compounds is monofunctional, being not restricting. Even a polyfunctional compound can exert the effect of the invention.

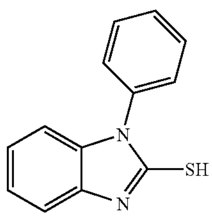

Solubility 20 g/L or more

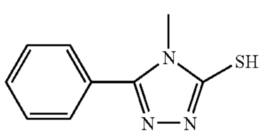

Solubility 20 g/L or more

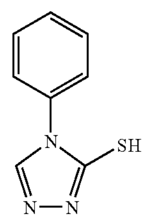

Solubility 20 g/L or more

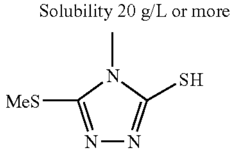

Solubility 20 g/L or more

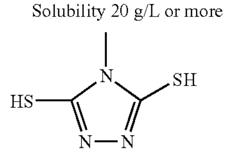

Solubility 20 g/L or more

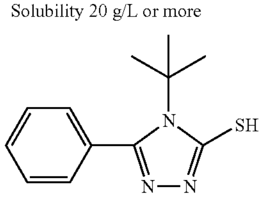

Solubility 20 g/L or more

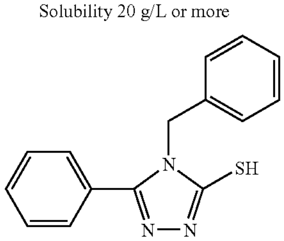

Solubility 20 g/L or more

-continued

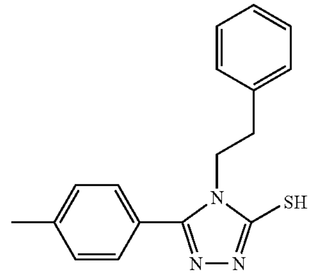

Solubility 20 g/L or more

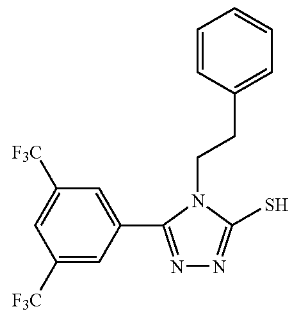

Solubility 20 g/L or more

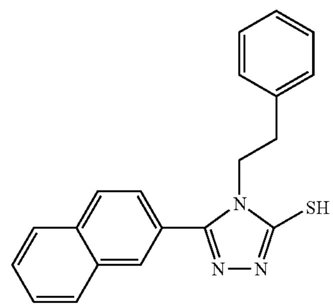

Solubility 20 g/L or more

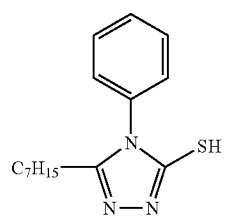

Solubility 20 g/L or more

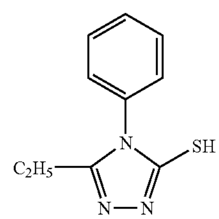

Solubility 20 g/L or more

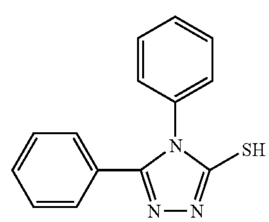

Solubility 20 g/L or more

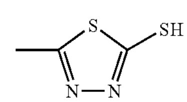

Solubility 20 g/L or more

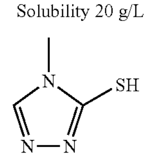

Solubility 20 g/L or more

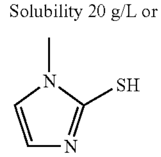

Solubility 20 g/L or more

-continued

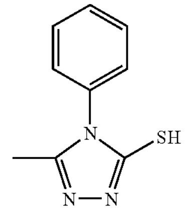

Solubility 20 g/L or more

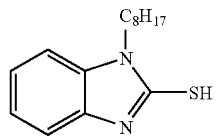

Solubility 20 g/L or more

<(D) Coloring Agent>

The curable composition of the invention can as desired use a coloring agent (D). By using the coloring agent, a colored cured material consisting of a curable composition can be formed, and this can be applied to formation of a coloring pattern of an image forming material and a color filter.

The coloring agent which is as desired added to the curable composition of the invention is not particularly restricted, however the conventionally known various dyes and pigments can be used alone, or by mixing two or more kinds. The coloring agent is preferably a pigment from a viewpoint of durability such as heat resistance, and light resistance.

As the pigment which can be used in the curable composition of the invention, the conventionally known various inorganic pigments or organic pigments can be used. Whether an inorganic pigment or an organic pigment, considering that it is preferable that a pigment has high transmittance, it is preferable to use pigments which are as finer as possible. When handling property is also taken into consideration, an average particle diameter of the pigment is preferably 0.01 μm to 0.1 μm, more preferably 0.01 μm to 0.05 μm. Examples of the aforementioned inorganic pigment include metal compounds such as metal oxides and metal complex salts, specifically metal oxides of iron, cobalt, aluminum, cadmium, lead, copper, titanium, magnesium, chromium, zinc and antimony, and composite oxides of those metals.

Examples of the organic pigment include:

C.I.Pigment Yellow 11, 24, 31, 53, 83, 93, 99, 108, 109, 110, 138, 139, 147, 150, 151, 154, 155, 167, 180, 185, 199;

C.I.Pigment Orange 36, 38, 43, 71;

C.I.Pigment Red 81, 105, 122, 149, 150, 155, 171, 175, 176, 177, 209, 220, 224, 242, 254, 255, 264, 270;

C.I.Pigment Violet 19, 23, 32, 39;

C.I.Pigment Blue 1, 2, 15, 15:1, 15:3, 15:6, 16, 22, 60, 66;

C.I.Pigment Green 7, 36, 37;

C.I.Pigment Brown 25, 28;

C.I.Pigment Black 1, 7;

carbon black.

In the invention, pigments having a basic N atom in a structure thereof can be particularly preferably used. These pigments having a basic N atom exhibit favorable dispersibility in the composition of the invention. Although the cause has not been sufficiently elucidated, it is presumed that favorable affinity between a photosensitive polymerization component and the pigment influences thereon.

As the pigment which can be preferably used in the invention, the following can be exemplified, however the invention is not restricted to them.

C.I.Pigment Yellow 11, 24, 108, 109, 110, 138, 139, 150, 151, 154, 167, 180, 185;

C.I.Pigment Orange 36, 71;

C.I.Pigment Red 122, 150, 171, 175, 177, 209, 224, 242, 254, 255, 264;

C.I.Pigment Violet 19, 23, 32;

C.I.Pigment Blue 15:1, 15:3, 15:6, 16, 22, 60, 66;

C.I.Pigment Black 1.

These organic pigments can be used alone, or by variously combining them in order to enhance a color purity. Examples of the combination are shown below. For example, an anthraquinone-based pigment, a perylene-based pigment, or a diketopyrrolopyrrole-based pigment alone as a red pigment, or a mixture of at least one kind of them, and a disazo-based yellow pigment, an isoindoline-based yellow pigment, a quinophthalone-based yellow pigment or a perylene-based red pigment can be used. For example, the anthraquinone-based pigment includes C.I.Pigment Red 177, the perylene-based pigment includes C.I.Pigment Red 155, and C.I.Pigment Red 224, and the diketopyrrolopyrrole-based pigment includes C.I.Pigment Red 254. From a color reproductivity, a mixture with C.I.Pigment Yellow 139 is preferable. Amass ratio between the red pigment and the yellow pigment is preferably 100:5 to 100:50. When the ratio is 100:4 or less, it is difficult to suppress light transmittance of 400 nm to 500 nm, and a color purity cannot be enhanced in some cases. In addition, when the ratio is 100:51 or more, a main wavelength becomes towards a short wavelength, and a deviation from a NTSC goal hue becomes great in some cases. Particularly, the mass ratio is optimally in a range of 100:10 to 100:30. In the case of a combination of red pigments, the ratio can be adjusted in conformity with a chromaticity.

In addition, as the green pigment, a halogenated phthalocyanine-based pigment can be used alone, or a mixture of this with a disazo-based yellow pigment, a quinophthalone-based yellow pigment, an azomethine-based yellow pigment or an isoindoline-based yellow pigment can be used. As such the example, a mixture of C.I.Pigment Green 7, 36, 37 and C.I.Pigment Yellow 83, C.I.Pigment Yellow 138, C.I.Pigment Yellow 139, C.I.Pigment Yellow 150, C.I.Pigment Red Yellow 180 or C.I.Pigment Red Yellow 185 is preferable. A mass ratio of the green pigment and the yellow pigment is preferably 100:5 to 100:150. The mass ratio is particularly preferably in a range of 100:30 to 100:120.

As the blue pigment, a phthalocyanine-based pigment can be used alone, or a mixture of this with a dioxazine-based purple pigment can be used. For example, a mixture of C.I.Pigment Blue 15:6 and C.I.Pigment Violet 23 is preferable. A mass ratio of the blue pigment and the purple pigment is preferably 100:0 to 100:30, more preferably 100:10 or less.

In addition, as a pigment for a black matrix, carbon, titanium carbon, iron oxide, and titanium oxide are used alone, or a mixture thereof is used. A combination of carbon and titanium carbon is preferable. A mass ratio of carbon and titanium carbon is preferably in a range of 100:0 to 100:60.

When the composition of the invention is used for a color filter, from a viewpoint of color unevenness and contrast, a primary particle diameter of the pigment is preferably 10 to 100 nm, more preferably 10 to 70 nm, further preferably 10 to 50 nm, most preferably 10 to 40 nm.

In addition, when the composition of the invention is used for a color filter, from a viewpoint of color unevenness and contrast it is preferable to use a dye which is uniformly dissolved in the composition.

The dye which can be used as a coloring agent contained in the curable composition of the invention is not particularly restricted, however dyes which have conventionally been known for a color filter can be used. For example, coloring matters disclosed in JP-A No. 64-90403, JP-A No. 64-91102, JP-A No. 1-94301, JP-A No. 6-11614, Japanese Patent No. 2592207, U.S. Pat. No. 4,808,501, U.S. Pat. No. 5,667,920, U.S. Pat. No. 5,059,500, JP-A No. 5-333207, JP-A No.

6-35183, JP-A No. 6-51115, JP-A No. 6-194828, JP-A No. 8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, and JP-A No. 8-151531 can be used.

As a chemical structure, dyes of a pyrazoleazo series, an anilinoazo series, a triphenylmethane series, an anthraquinone series, an anthrapyridone series, a benzylidene series, an oxonol series, a pyrazolotriazol series, a pyridoneazo series, a cyanine series, a phenothiazine series, a pyrrolopyrazoleazomethine series, a xanthene series, a phthalocyanine series, a benzopyran series, and an indigo series can be used.

In addition, when after pattern light exposure of the curable composition and curing of an exposed part, an unexposed part is removed with water or alkali development to form a pattern, for example, when a colored pattern of a resist or a color filter is formed, an acid dye and/or a derivative thereof can be suitably used in some cases, from a viewpoint of that a binder and a dye at a light-unirradiated part resulting from development are completely removed.

In addition, a direct dye, a basic dye, a mordant dye, an acid mordant dye, an azoic dye, a disperse dye, an oil soluble dye, a food dye and/or a derivative thereof can be also used usefully.

The acid dye is not particularly restricted so long as it has an acidic group such as sulfonic acid and carboxylic acid, but is selected by taking into consideration all of required performances such as solubility in an organic solvent and a developer, salt forming property with a basic compound, an absorbance, interaction with other components in the composition, light resistance, and heat resistance.

The following are examples of the acid dye, however the invention is not restricted to them. Examples include:

acid alizarin violet N;

acid black 1, 2, 24, 48;

acid blue 1, 7, 9, 15, 18, 23, 25, 27, 29, 40, 42, 45, 51, 62, 70, 74, 30, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;

acid chrome violet K;

acid Fuchsin;

acid green 1, 3, 5, 9, 16, 25, 27, 50, 58, 63, 65, 80, 104, 105, 106, 109;

acid orange 6, 7, 8, 10, 12, 26, 50, 51, 52, 56, 62, 63, 64, 74, 75, 94, 95, 107, 108, 169, 173;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 230, 281, 195, 308, 312, 315, 316, 339, 341, 345, 346, 349, 382, 383, 394, 401, 412, 417, 418, 422, 426;

acid violet 6B, 7, 9, 17, 19;

acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;

Direct Yellow 2, 33, 34, 35, 38, 39, 43, 47, 50, 54, 58, 68, 69, 70, 71, 86, 93, 94, 95, 98, 102, 108, 109, 129, 136, 138, 141;

Direct Orange 34, 39, 41, 46, 50, 52, 56, 57, 61, 64, 65, 68, 70, 96, 97, 106, 107;

Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;

Direct Violet 47, 52, 54, 59, 60, 65, 66, 79, 80, 81, 82, 84, 89, 90, 93, 95, 96, 103, 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 243, 250, 251, 252, 256, 257, 259, 260, 268, 274, 275, 293;

Direct Green 25, 27, 31, 32, 34, 37, 63, 65, 66, 67, 68, 69, 72, 77, 79, 82;

Mordant Yellow 5, 8, 10, 16, 20, 26, 30, 31, 33, 42, 43, 45, 56, 50, 61, 62, 65;

Mordant Orange 3, 4, 5, 8, 12, 13, 14, 20, 21, 23, 24, 28, 29, 32, 34, 35, 36, 37, 42, 43, 47, 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95;

Mordant violet 2, 4, 5, 7, 14, 22, 24, 30, 31, 32, 37, 40, 41, 44, 45, 47, 48, 53, 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;

Mordant Green 1, 3, 4, 5, 10, 15, 19, 26, 29, 33, 34, 35, 41, 43, 53;

Food Yellow 3;

and derivatives of these dyes.

Among the above acid dyes, dyes such as acid black 24;

acid blue 23, 25, 29, 62, 80, 86, 87, 92, 138, 158, 182, 243, 324:1;

acid orange 8, 51, 56, 74, 63;

acid red 1, 4, 8, 34, 37, 42, 52, 57, 80, 97, 114, 143, 145, 151, 183, 217, 249;

acid violet 7;

acid yellow 17, 25, 29, 34, 42, 72, 76, 99, 111, 112, 114, 116, 134, 155, 169, 172, 184, 220, 228, 230, 232, 243;

Acid Green 25 and derivatives of these dyes are preferable.

In addition to the above dyes, acid dyes of an azo series, a xanthene series, and a phthalocyanine series are also preferable, and acid dyes such as C.I.Solvent Blue 44, 38; C.I.Solvent Orange 45; Rhodamine B, and Rhodamine 110, and derivatives of these dyes are also preferably used.

Among these, the coloring agent (D) is preferably a coloring agent selected from a triallylmethane series, an anthraquinone series, an azomethine series, a benzylidene series, an oxonol series, a cyanine series, a phenothiazine series, a pyrrolopyrazoleazomethine series, a xanthene series, a phthalocyanine series, a benzopyran series, an indigo series, a pyrazoloazo series, an anilinoazo series, a pyrazolotriazolazo series, a pyridoneazo series, and an anthrapyridone series.

A content when a coloring agent is used in the curable composition of the invention is preferably 5 to 80% by mass, more preferably 10 to 70% by mass, further preferably 20 to 70% by mass in a total solid content of the curable composition.

Particularly, when the curable composition of the invention is used in forming a colored pattern of a color filter, a content of the coloring agent is preferably 20% by mass or higher, further preferably 30% by mass or higher in the aforementioned content range.

<(D) Alkali-Soluble Resin>

In the curable composition of the invention, an alkali-soluble resin as a binder polymer is used for the purpose of improving the coated film property. It is preferable to use a linear organic polymer as the alkali-soluble resin. As such the "linear organic polymer", the known linear organic polymers can be arbitrarily used. Preferably, in order to enable water development or weakly alkaline water development, a linear organic polymer, which is soluble or swellable in water or weakly alkaline water, is selected. The linear organic polymer is selectively used depending on utility not only as a film forming agent but also as a water, weakly alkaline water or organic solvent developer. For example, when a water-soluble organic polymer is used, water development becomes possible. Examples of such the linear organic polymer include radical polymers having a carboxylic acid group on a side chain, for example, those described in JP-A No. 59-44615, JP-B No. 54-34327, JP-B No. 58-12577, JP-B No. 54-25957, JP-A No. 54-92723, JP-A No. 59-53836, and JP-A No. 59-71048, that is, a resin obtained by homo- or co-polymerizing a monomer having a carboxyl group, a resin obtained by homo- or co-polymerizing a monomer having acid anhydride, and hydrolyzing, half-esterifying or half-amidating an acid anhydride unit, and epoxy acrylate obtained by modifying an epoxy resin with unsaturated monocarboxylic acid and acid anhydride. Examples of the monomer having a carboxyl group include acrylic acid, methacrylic acid, itaconic acid, crotonic acid, maleic acid, fumaric acid, and 4-carboxylstyrene, and examples of the monomer having acid anhydride include maleic anhydride.

Similarly, there is an acidic cellulose derivative having a carboxylic acid group on a side chain. Additionally, a resin in which a cyclic acid anhydride is added to a polymer having a hydroxy group is useful.

When the alkali-soluble resin is used as a copolymer, as a compound to be copolymerized, monomers other than the aforementioned monomers can be also used. Examples of other monomer include the following (1) to (12) compounds.

(1) Acrylic acid esters, and methacrylic acid esters having an aliphatic hydroxyl group, such as 2-hydroxyethyl acrylate, 2-hydroxypropyl acrylate, 3-hydroxypropyl acrylate, 4-hydroxybutylacrylate, 2-hydroxyethyl methacrylate, 2-hydroxypropyl methacrylate, 3-hydroxypropyl methacrylate, and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate.

(4) Acrylamides or methacrylamides such as acrylamide, methacrylamide, N-methylolacrylamide. N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters such as vinyl acetate, vinyl chloroacetate, vinyl butyrate, and vinyl benzoate.

(7) Styrenes such as styrene, α-methylstyrene, methylstyrene, chloromethylstyrene, and p-acetoxystyrene.

(8) Vinyl ketones such as methyl vinyl ketone, ethyl vinyl ketone, propyl vinyl ketone, and phenyl vinyl ketone.

(9) Olefins such as ethylene, propylene, isobutylene, butadiene, and isoprene.

(10) N-vinylpyrrolidone, acrylonitrile, and methacrylonitrile.

(11) Unsaturated imides such as maleimide, N-acryloylacrylamide, N-acetylmethacrylamide, N-propionylmethacrylamide, N-p-chlorobenzoyl)methacrylamide.

(12) Methacrylic acid-based monomers in which a heteroatom is bound to a α-position, for example, compounds described in Japanese Patent Application No. 2001-115595, and Japanese Patent Application No. 2001-115598.

Among them, a (meth)acryl resin having an allyl group, or a vinyl ester group and a carboxyl group on a side chain, alkali-soluble resins having a double bond on a side chain described in JP-A No. 2000-187322, and JP-A No. 2002-62698, and alkali-soluble resins having an amido group on a side chain described in JP-A No. 2001-242612 are excellent in a balance between a film strength, a sensitivity, and developability, being preferable.

In addition, urethane-based binder polymers having an acid group described in JP-B No. 7-12004, JP-B No. 7-120041, JP-B No. 7-120042, JP-B No. 8-12424, JP-A No. 63-287944, JP-A No. 63-287947, JP-A No. 1-271741, and Japanese Patent Application No. 10-116232, and urethane-based binder polymers having an acid group and a double bond on a side chain described in JP-A No. 2002-107918 are very excellent in a strength and, therefore, are advantageous in printing durability, and low light exposure suitability.

Acetal-modified polyvinyl alcohol-based binder polymers having an acid group described in EP No. 993966, EP No. 1204000, and JP-A No. 2001-318463 are excellent in a balance between a film strength and developability, being suitable.

Furthermore, as a water-soluble linear organic polymer, polyvinylpyrrolidone and polyethylene oxide are useful. In addition, in order to enhance a strength of a cured film, alcohol-soluble nylon, and polyether of 2,2-bis-(4-hydroxyphenyl)-propane and epichlorohydrin are also useful.

A weight average molecular weight of the alkali-soluble resin, which can be used in the invention, is preferably 5,000 or more, farther preferably in a range of 10,000 to 300,000. A number average molecular weight is preferably 1,000 or more, further preferably in a range of 2,000 to 250,000. Polydispersity (weight average molecular weight/number average molecular weight) is preferably 1 or more, further preferably in a range of 1.1 to 10.

These polymers may be any of a random polymer, a block polymer, and a graft polymer.

An addition amount of the alkali-soluble resin is preferably in a range of 5 to 20% by mass, more preferably 5 to 12% by mass in a total solid content of the curable composition of the invention.

<(F) Alkoxysilane Compound>

The curable composition of the invention contains the aforementioned (A) to (E) components as an essential component and, furthermore, from a viewpoint of improvement in adhesion with a substrate, it is preferable to use an alkoxysilane compound in combination, among these, a silane coupling agent.

In the silane coupling agent, a hydrolyzable group which can chemically bind to an inorganic material is preferably an alkoxysilyl group, and a group binding to an organic resin is preferably (meth)acryloyl, phenyl, mercapto, or epoxysilane. Among these, more preferably (meth)acryloylpropyltrimethoxysilane is more preferable.

An addition amount when the silane coupling agent is used is in a range of preferably 0.2 to 3.0% by mass, more preferably 0.5 to 1.0% by mass in a total solid content of the curable composition of the invention.

Other preferable additives will be explained below.

<Cosensitizing Agent>

It is preferable that the curable composition of the invention, if desired, contains a cosensitizing agent. In the invention, the cosensitizing agent has the action of further improving a sensitivity of the sensitizing dye or the initiator to active radiation, and suppressing inhibition of polymerization of the polymerizable compound with oxygen.

Examples of such the cosensitizing agent include amines, for example, compounds described in M. R. Sander et al., "Journal of Polymer Society", Vol. 10, p. 3173 (1972), JP-B No. 44-20189, JP-A No. 51-82102, JP-A No. 52-134692, JP-A No. 59-138205, JP-A No. 60-84305, JP-A No. 62-18537, JP-A No. 64-33104, and Research Disclosure No. 33825, specifically, triethanolamine, p-dimethylaminobenzoic acid ethyl ester, p-formyldimethylaniline, and p-methylthiodimethylaniline.

Other examples of the cosensitizing agent include thiols and sulfides, for example, thiol compounds described in JP-A No. 53-702, JP-B No. 55-5008061, and JP-A No. 5-142772, and disulfide compounds described in JP-A No. 56-75643, specifically, 2-mercaptobenzothiazole, 2-mercaptobenzoxazole, 2-mercaptobenzimidazole, 2-mercapto-4(3H) quinazoline, and β-mercaptonaphthalene.

In addition, other examples of the cosensitizing agent include amino acid compounds (e.g. N-phenylglycine, etc.), organic metal compounds (e.g. tributyltin acetate, etc.) described in JP-B No. 4842965, hydrogen donating compounds described in JP-B No. 55-34414, and sulfur compounds (e.g. trithiane, etc.) described in JP-A No. 6-308727.

A content of these cosensitizing agents, from a viewpoint of improvement in a curing rate due to a balance between a polymerization growing rate and chain transfer, is preferably in a range of 0.1 to 30% by mass, more preferably in a range of 1 to 25% by mass, further preferably in a range of 0.5 to 20% by mass relative to a mass of a total solid content of the curable composition.

<Polymerization Inhibitor>

In the invention, in order to inhibit unnecessary heat polymerization of a compound having a polymerizable ethylenically unsaturated double bond during preparation or during storage of the curable composition, it is desirable to add a few amount of a heat polymerization inhibitor.

Examples of the heat polymerization inhibitor which can be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(2-methyl-6-t-butylphenol), and N-nitrosophenylhydroxyamine cerrous salt.

An addition amount of the heat polymerization inhibitor is preferably about 0.01% by mass to about 5% by mass relative to a mass of a total composition. If desired, in order to prevent polymerization inhibition with oxygen, a higher fatty acid derivative such as behenic acid and behenic acid amide may be added, to be unevenly distributed on a surface of a photosensitive layer during a drying process after coating. An addition amount of the higher fatty acid derivative is preferably about 0.5% by mass to about 10% by mass of a total composition.

<Other Additives>

Further, in the invention, in order to improve physical property of a cured film, the known additives such as inorganic fillers, plasticizers, and a fat-sensitizing agent, which can improve ink-adhering property on a photosensitive layer surface, may be added.

Examples of the plasticizer include dioctyl phthalate, didodecyl phthalate, triethylene glycol dicaprylate, dimethyl glycol phthalate, tricresyl phosphate, dioctyl adipate, dibutyl cebacate, and triacetylglycerin and, when a binder is used, the plasticizer can be added at 10% by mass or less relative to a total mass of the compound having an ethylenically unsaturated double bond and the binder.

The curable composition of the invention is cured at a high sensitivity, and has favorable storage stability. In addition, the composition exhibits high adhesion to a surface of a hard material such as a substrate to which the curable composition is applied. Therefore, the curing composition of the invention can be preferably used in the field of there-dimensional photoshaping and holography, an image forming material such as a color filter, an ink, a paint, an adhesive, and a coating agent.

[Color Filter and Manufacturing Method of the Same]

Then, the color filter of the invention, and a process for manufacturing the same will be explained.

The color filter of the invention is characterized in that it has a colored pattern using the curable composition of the invention on a support.

Then, the color filter of the invention will be described in detail by referring to a process for manufacturing the same (process for manufacturing the color filter of the invention).

The process comprises a step of coating the curable composition of the invention to form a curable composition layer (hereinafter, suitably abbreviated as "curable composition layer forming step"), a step of exposing the curable composition layer to light via a mask (hereinafter, suitably abbreviated as "exposing step"), and a step of developing the curing composition layer after exposure to form a colored pattern (hereinafter, suitably abbreviated as "developing step").

Each step in the process of the invention will be explained below.

<Curable Composition Layer Forming Step>

In the curable composition layer forming step, the curable composition of the invention is coated on a support to form a curable composition layer.

Examples of the support which can be used in the present step include a soda glass, a Pyrex (registered trademark) glass, a quartz glass and those glasses with a transparent conduction film attached thereto which are used in a liquid crystal display element, a photoelectric conversion element substrate used in an image pickup element, for example, a silicon substrate, and a complementary metal oxide film semiconductor (CMOS). On these substrates, a black stripe, which isolates each pixel, is formed in some cases.

If necessary, on these supports, an undercoating layer may be set for improving adhesion with an upper layer, preventing diffusion of a substance, and flattening a substrate surface.

As a method of coating the curable composition of the invention on a support, various coating methods such as slit coating, an inkjet method, spin coating, cast coating, roll coating, and screen printing method can be applied.

A thickness of a coated film of the curable composition is preferably 0.1 to 10 μm, more preferably 0.2 to 5 μm, further preferably 0.2 to 3 μm.

Drying (pre-baking) of the photocurable composition layer coated on a substrate can be performed with a hot plate, or an oven at a temperature of 50° C. to 140° C. for 10 to 300 seconds.

<Exposing Step>

In the exposing step, the curable composition layer formed in the curable composition layer forming step is exposed to light via a mask having a predetermined mask pattern.

In exposure in the present step, pattern exposure of the coated film can be performed by exposing the composition via a predetermined mask pattern to cure only a light-irradiated coated film part, and developing this with a developer to form a pattern-like film consisting of a pixel of each color (three colors or four colors). As radiation which can be used upon exposure, ultraviolet ray such as g-ray, and i-ray is preferably used. An irradiation amount is preferably 5 to 1500 mJ/cm$^2$, more preferably 10 to 1000 mJ/cm$^2$, most preferably 10 to 500 mJ/cm$^2$.

When the color filter of the invention is for a liquid crystal display element, the amount is preferably 5 to 200 mJ/cm$^2$, more preferably 10 to 150 mJ/cm$^2$, most preferably 10 to 100 mJ/cm$^2$ in the above range. And, when the color filter of the invention is for a solid-state image pickup element, the amount is preferably 30 to 1500 mJ/cm$^2$, more preferably 50 to 1000 mJ/cm$^2$, most preferably 80 to 500 mJ/cm$^2$ in the above range.

<Developing Step>

Then, by performing alkali developing treatment, a part which has not been light-irradiated by the exposure is eluted into an aqueous alkali solution, leaving only a photocured part. As the developer, an organic alkali developer, which does not cause damage on a circuit on an undercoat is desirable. A developing temperature is usually 20° C. to 30° C., and a developing time is 20 to 90 seconds.

Examples of the alkali agent used in a developer include organic alkaline compounds such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene. An aqueous alkaline solution obtained by diluting these alkali agents with pure water to a concentration of 0.001 to 10% by mass, preferably 0.01 to 1% by mass is preferably used as a developer. When a developer consisting of such the aqueous alkaline solution is used, generally, after development, the film is washed (rinsed) with pure water.

Then, an extra developer is washed off, and drying is performed, followed by heat treatment (post-baking). Like this, for each color, the above steps are sequentially repeated, thereby, a cured film can be manufactured. Thereby, a color filter is obtained.

Post-baking is heat treatment after development for completing curing, and heat curing treatment at 100° C. to 240° C. is usually performed. When a substrate is a glass substrate or a silicon substrate, 200° C. to 240° C. is preferable in the above temperature range.

This post-baking treatment can be performed continuously or in a batch manner using a heating means such as a hot plate, a convection oven (hot air circulating dryer), and a high frequency heating machine so that the coated film after development is placed under the above condition.

In the process of the invention, after the aforementioned curable composition layer forming step, exposure step and developing step are performed, if desired, a curing step of curing a formed colored pattern by heating and/or exposure may be included.

By repeating the above explained curable composition layer forming step, exposure step, and developing step (further, if needed, curing step) by the number of desired hues, a color filter composed of desired hues is manufactured.

Although as utility of the curable composition of the invention, utility in a pixel of the color filter has been mainly described, it goes without saying that the composition can be also applied to a black matrix provided between pixels of the color filter. The black matrix can be formed by performing pattern exposure, alkali development and, thereafter, post-baking to promote curing of a film, according to the same manner as that of a process for manufacturing the pixel except that a composition with a black coloring agent such as carbon black, and titanium black added thereto is used.

Since the color filter of the invention uses the curable composition of the invention, a formed colored pattern exhibits high adhesion with a support substrate, and a cured composition is excellent in development resistance, therefore, an exposure sensitivity is excellent, and adhesion of an exposed part with a substrate is favorable, and a high resolution pattern giving a desired cross-sectional shape can be formed. Therefore, the color filter can be suitably used in a liquid crystal display element, and a solid-state image pickup element such as CCD and, particularly, is suitably for a CCD element having a high resolution exceeding one million pixels, and CMOS. The color filter of the invention can be used, for example, as a color filter disposed between a light receiving part of each pixel constituting CCD and a microlens for collecting light.

(Second Aspect)

The second aspect of the invention will be explained below.

A curable composition related to the second aspect of the invention contains a compound represented by the formula (I) (hereinafter, referred to as "specified compound according to the invention" or simply "specified compound" in some cases) and a photopolymerization initiator and, if needed, other component such as a sensitizing agent, a coloring agent, a coating solvent, and an alkali-soluble resin.

Hereinafter, the compound represented by the formula (I) is referred to as "specified compound according to the invention" or simply "specified compound" in some cases. And, the curable composition containing a coloring agent is referred to as "colored curable composition" in some cases.

First, the specified compound according to the invention will be explained in detail.

<Compound Represented by the Formula (I)>

The curable composition of the invention contains the compound represented by the following formula (I).

(I)

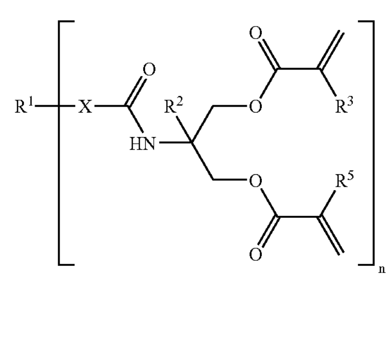

In the formula (I), $R^1$ represents a n-valent organic group, and $R^2$ represents a hydrogen atom or an alkyl group of a carbon number of 1 to 4. $R^3$ and $R^5$ each independently represent a hydrogen atom or a methyl group. X represents —O—, —NH—, —$NR^4$—, or —S—, and $R^4$ represents a hydrogen atom or a monovalent organic group. And, n denotes an integer of 1 to 12. X is preferably —O—, and the formula (I) is represented by the formula (II).

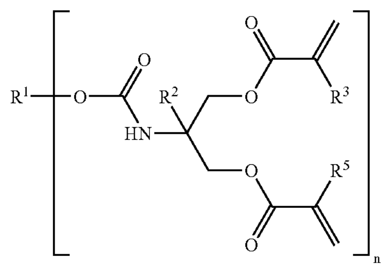

(II)

In the formula (II), $R^1$ represents a n-valent organic group, and $R^2$ represents a hydrogen atom or an alkyl group of a carbon number of 1 to 4. $R^3$ and $R^5$ each independently represent a hydrogen atom or a methyl group, and n denotes an integer of 1 to 12.

Examples of $R^2$ in the formulas (I) and (II) include a hydrogen atom, a methyl group, an ethyl group, a propyl group, and a butyl group, preferably a hydrogen atom, a methyl group, and an ethyl group, more preferably a methyl group. $R^3$ and $R^5$ are preferably a hydrogen atom, and n is preferably an integer of 2 to 9.

The compound represented by the formula (I) is obtained by an urethanation reaction, an ureation reaction or a thiourethanation reaction between a compound having at least one hydroxyl group, primary amine group, secondary amino group and thiol group in a molecule, and monoisocyanate having two acrylates in a molecule.

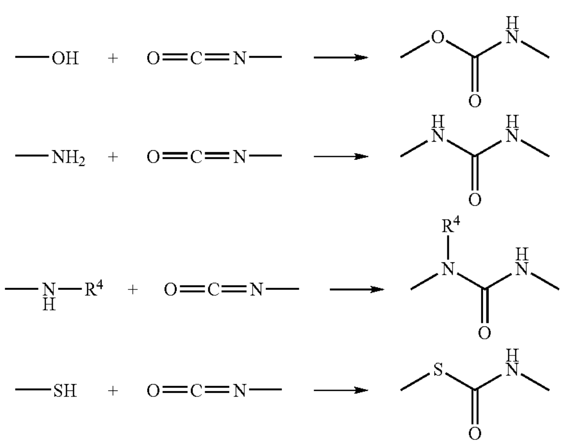

$R^1$ in the formulas (I) and (II) represents an aliphatic residue having an aliphatic residue, an aromatic residue, or a heterocyclic residue, or an aliphatic residue having a hetero atom, an aromatic ring, or a heterocycle in a molecule, of a compound having at least one hydroxy group, primary amino group, secondary amino group, or thiol group in a molecule.

The "aliphatic residue" represents an aliphatic group obtained by removing "a hydroxy group, a primary amino group, a secondary amino group, or a thiol group which reacts with an isocyanate compound at a urethane bond forming reaction" from a structure of a raw material compound, when an aliphatic compound having at least one hydroxy group, primary amino group, secondary amino group or thiol group in a molecule is used as a raw material upon synthesis of the specified compound according to the invention, and may be unsubstituted or may have a substituent (when two or more substituents are possessed, those substituents may be the same or different).

The "substituent" may be a replaceable group and, for example, represents an aliphatic group, an aromatic group, a heterocycle group, a halogen atom, a hydroxy group, a thiol group, a cyano group, a nitro group, a (meth)acrylate group, a carboxy group, an amino group, an aliphatic amino group, an aromatic amino group, a heterocyclic amino group, an aliphatic oxy group, an aromatic oxy group, a heterocyclic oxy group, an aliphatic thio group, an aromatic thio group, a heterocyclic thio group, an aliphatic sulfonamido group, an aromatic sulfonamido group, a heterocyclic sulfonamido group, an acyl group, an acyloxy group, an acylamino group, an aliphatic oxycarbonyl group, an aromatic oxycarbonyl group, a heterocyclic oxycarbonyl group, an aliphatic oxycarbonylamino group, an aromatic oxycarbonylamino group, a heterocyclic oxycarbonylamino group, an aliphatic thiocarbonylamino group, an aromatic thiocarbonylamino group, a heterocyclic thiocarbonylamino group, an aliphatic aminocarbonylamino group, an aromatic aminocarbonylamino group, a heterocyclic aminocarbonylamino group, a carbamoyl group, a carbamoyloxy group, a carbamoylamino group, an aliphatic sulfonyl group, an aromatic sulfonyl group, a heterocyclic sulfonyl group, an aliphatic oxyamino group, an aromatic oxyamino group, a heterocyclic oxyamino group, a silyl group, an aliphatic oxysilyl group, a silyloxy group, an aliphatic oxycarbonyloxy group, an aromatic oxycarbonyloxy group, a heterocyclic oxycarbonyloxy group, a sulfamoyloxy group, an aliphatic sulfonyloxy group, an aromatic sulfonyloxy group, an anilino group, an aliphatic azo group, an aromatic azo group, a heterocyclic azo group, an aliphatic sulfinyl group, an aromatic sulfinyl group, a heterocyclic sulfinyl group, an aliphatic sulfonyloxy group, an aromatic sulfonyloxy group, a heterocyclic sulfonyloxy group, a sulfamoyl group, a sulfo group, a phosphonyl group, a phosphonic acid group, or a phosphinoylamino group.

Among these, examples of a preferable substituent include an aliphatic group, an aromatic group, a heterocyclic group, a halogen atom, a hydroxy group, a thiol group, a cyano group, a nitro group, a (meth)acryloyl group, a carboxy group, an amino group, an aliphatic amino group, an aromatic amino group, a heterocyclic amino group, an aliphatic oxy group, an aromatic oxy group, a heterocyclic oxy group, an aliphatic thio group, an aromatic thio group, an aliphatic sulfonamido group, an aromatic sulfonamido group, an acyl group, an aliphatic oxycarbonyl group, an aliphatic oxycarbonylamino group, an aromatic oxycarbonylamino group, an aliphatic thiocarbonylamino group, an aromatic thiocarbonylamino group, an aliphatic aminocarbonylamino group, an aromatic aminocarbonylamino group, a carbamoyl group, an aliphatic sulfonyl group, an aromatic sulfonyl group, a silyl group, an aliphatic oxysilyl group, a silyloxy group, an aliphatic carbonyloxy group, an aromatic carbonyloxy group, a heterocyclic carbonyloxy group, an aliphatic oxycarbonyloxy group, an aliphatic sulfonyloxy group, a sulfamoyl group, a sulfo group, a phosphonyl group, and a phosphone group.

Particularly, from a viewpoint of a sensitivity and solubility, examples of a more preferable substituent include an aliphatic group, an aromatic group, a heterocyclic group, a halogen atom, a hydroxy group, a thiol group, a (meth)acryloyl group, a carboxy group, an amino group, an aliphatic amino group, an aromatic amino group, an aliphatic oxy group, an aromatic oxy group, a heterocyclic oxy group, an aliphatic thio group, an aliphatic sulfonamido group, an aliphatic oxycarbonyl group, an aliphatic oxycarbonylamino group, a silyl group, an aliphatic oxysilyl group, an aliphatic carbonyloxy group, an aliphatic oxycarbonyloxy group, an aliphatic sulfonyloxy group, a sulfo group, and a phosphone group.

The "aliphatic group" means an alkyl group, an alkenyl group, or an alkynyl group. The aliphatic group may have a branch, or may form a ring. And, the aliphatic group may be unsubstituted, or may have a substituent. When the aliphatic group has a substituent, it may have substituents exemplified in explanation of the above "substituent" and, when two or more substituents are possessed, those may be the same or different. When the aliphatic group is an alkyl group, it may be straight, may have a branch, or may form a ring and, among these, is preferably of a carbon number of 1 to 21, more preferably of a carbon number of 1 to 16, particularly preferably of a carbon number of 1 to 12.

Preferable examples of the alkyl group of a carbon number of 1 to 21 include a methyl group, an ethyl group, a n-propyl group, a n-butyl group, a n-amyl group, a n-hexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, a n-eicosanyl group, an i-propyl group, a sec-butyl group, an i-butyl group, a t-butyl group, a 1-methylbutyl group, a 1-ethylpropyl group, a 2-methylbutyl group, an t-amyl group, a neopentyl group, a 1,2-dimethylpropyl group, a 1,1-dimethylpropyl group, a t-amyl group, a 1,3-dimethylbutyl group, a 3,3-dimethylbutyl group, a 2-ethylbutyl group, a 2-ethyl-2-methylpropyl group, a straight or branched heptyl group, a 1-methylheptyl group, a 2-ethylhexyl group, a 1,5-dimethylhexyl group, a t-octyl group, a branched nonyl group, a branched decyl group, a branched undecyl group, a branched dodecyl group, a branched tridecyl group, a branched tetradecyl group, a branched pentadecyl group, a branched hexadecyl group, a branched heptadecyl group, a branched octadecyl group, a straight or branched nonadecyl group, a straight or branched eicosanyl group, a cyclopropyl group, a cyclopropylmethyl group, a cyclobutyl group, a cyclobutylmethyl group, a cyclopentyl group, a cyclohexyl group, a cyclohexylmethyl group, a cycloheptyl group, a cyclooctyl group, a cyclohexylpropyl group, a cyclododecyl group, a norbornyl group, a bornyl group, a cis-myrtanyl group, an isopinocamphenyl group, a noradamantyl group, an adamantyl group, an adamantylmethyl group, a 1-(1-adamantyl)ethyl group, a 3,5-dimethyladamantyl group, a quinuclidinyl group, a cyclopentylethyl group, and a bicyclooctyl group.

Among the above groups, a methyl group, an ethyl group, a n-propyl group, a n-butyl group, a n-amyl group, a n-hexyl group, a n-heptyl group, a n-octyl group, n-nonyl group, a n-decyl group, a n-undecyl group, a n-dodecyl group, a n-tridecyl group, a n-tetradecyl group, an i-propyl group, a sec-butyl group, an i-butyl group, a t-butyl group, a 1-methylbutyl group, a 1-ethylpropyl group, a 2-methylbutyl group, an i-amyl group, a neopentyl group, a 1,2-dimethylpropyl group, a 1,1-dimethylpropyl group, a t-amyl group, a 1,3-dimethylbutyl group, a 3,3-dimethylbutyl group, a 2-ethylbutyl group, a 2-ethyl-2-methylpropyl group, a straight or branched heptyl group, a 1-methylheptyl group, a 2-ethylhexyl group, a 1,5-dimethylhexyl group, a t-octyl group, a branched nonyl group, a branched decyl group, a branched undecyl group, a branched dodecyl group, a branched tridecyl group, a branched tetradecyl group, a cyclopropyl group, a cyclopropylmethyl group, a cyclobutyl group, a cyclobutylmethyl group, a cyclopentyl group, a cyclohexyl group, a cyclohexylmethyl group, a cycloheptyl group, a cyclooctyl group, a cyclohexylpropyl group, a cyclododecyl group, a norbornyl group, a bornyl group, a cis-myltanyl group, an isopinocamphenyl group, a noradamantyl group, an adamantyl group, an adamantylmethyl group, a 1-(1-adamantyl)ethyl group, a 3,5-dimethyladamantyl group, a quinuclydinyl group, a cyclopentylethyl group, or a bicyclooctyl group is more preferable.

Further, a methyl group, an ethyl group, n-propyl group, a n-butyl group, a n-amyl group, a n-hexyl group, a n-heptyl group, a n-octyl group, a n-nonyl group, a n-decyl group, an i-propyl group, a sec-butyl group, an i-butyl group, a t-butyl group, a 1-methylbutyl group, a 1-ethylpropyl group, a 2-methylbutyl group, an i-amyl group, a neopentyl group, a 1,2-dimethylpropyl group, a 1,1-dimethylpropyl group, a t-amyl group, a 1,3-dimethylbutyl group, a 3,3-dimethylbutyl group, a 2-ethylbutyl group, a 2-ethyl-2-methylpropyl group, a straight or branched heptyl group, a 1-methylheptyl group, a 2-ethylhexyl group, a 1,5-dimethylhexyl group, a t-octyl group, a branched nonyl group, a branched decyl group, a cyclopropyl group, a cyclopropylmethyl group, a cyclobutyl group, a cyclobutylmethyl group, a cyclopentyl group, a cyclohexyl group, a cyclohexylmethyl group, a cycloheptyl group, a cyclooctyl group, a cyclohexylpropyl group, a cyclododecyl group, a norbornyl group, a bornyl group, a noradamantyl group, an adamantyl group, an adamantylmethyl group, a 1-(1-adamantyl)ethyl group, a 3,5-dimethyladamantyl group, a cyclopentylethyl group, or a bicyclooctyl group is particularly preferable.

In the above-exemplified alkyl groups, particularly, alkyl groups substituted with fluorine are also preferable. As the fluorine-substituted alkyl group, a trifluoromethyl group, a trifluoroethyl group, a pentafluoroethyl group, a heptafluoropropyl group, a nonafluorobutyl group, a tridecafluorohexyl group, a pentadecafluoroheptyl group, a heptadecafluorooctyl group, a tridecafluorooctyl group, a nonadecafluorononyl group, a heptadecafluorodecyl group, or a perfluorodecyl group is preferable. Among them, a trifluoromethyl group, a pentafluoroethyl group, a heptafluoropropyl group, a nonafluorobutyl group, a tridecafluorohexyl group, or a pentadecafluoroheptyl group is more preferable and, further, a trifluoromethyl group, a pentafluoroethyl group, a heptafluoropropyl group, a nonafluorobutyl group, or a tridecafluorohexyl group is particularly preferable.

When the aliphatic group is the alkenyl group, it may be unsubstituted, or may have a substituent, and an alkenyl group of a carbon number of 2 to 21 is preferable. An alkenyl group of a carbon number of 2 to 16 is more preferable, and an alkenyl group of a carbon number of 2 to 10 is further preferable. Preferable examples of the alkenyl group of a carbon number of 2 to 21 include a vinyl group, an isopropenyl group, a 2-propenyl group, a 2-methyl-propenyl group, a 1-methyl-1-propenyl group, a 1-butenyl group, a 3-butenyl group, a 1-methyl-1-butenyl group, a 1,1-dimethyl-3-butenyl group, a 1-pentenyl group, a 2-pentenyl group, a 1-ethyl-4-pentenyl group, a 1-hexenyl group, a 1-heptenyl group, a 2,6-dimethyl-5-heptenyl group, a 9-decenyl group, a 1-cyclopentyl group, a 2-cyclopentynylmethyl group, a cyclohexenyl group, a 1-methyl-2-cyclohexenyl group, a 1,4-dihydro-2-methylphenyl group, an octenyl group, a citronelyl group, an oleyl group, a geranyl group, a farnesyl group, and a 2-(1-cyclohexenyl)ethyl group.

Among them, a vinyl group, an isopropenyl group, a 2-propenyl group, a 2-methyl-propenyl group, a 1-methyl-1-propenyl group, a 1-butenyl group, a 3-butenyl group, a 1-methyl-1-butenyl group, a 1,1-dimethyl-3-butenyl group, a 1-pentenyl group, a 2-pentenyl group, a 1-ethyl-1-pentenyl group, a 1-hexenyl group, a 1-heptenyl group, a 1-cyclopentenyl group, a 2-cyclopentenylmethyl group, a cyclohexenyl group, a 1-methyl-2-cyclohexenyl group, or a 1,4-dihydro-2-methylphenyl group is more preferable and, further, a vinyl group, an isopropenyl group, a 2-propenyl group, a 2-methyl-propenyl group, a 1-methyl-1-propenyl group, a 1-butenyl group, a 3-butenyl group, a 1-methyl-1-butenyl group, a 1,1-dimethyl-3-butenyl group, a 1-pentenyl group, a 2-pentenyl group, a 1-ethyl-1-pentenyl group, a 1-hexenyl group, a 1-cyclopentenyl group, a 2-cyclopentenylmethyl group, a cyclohexenyl group, a 1-methyl-2-cyclohexenyl group, or a 1,4-dihydro-2-methylphenyl group is particularly preferable.

The "aromatic group" means an aryl group. The aryl group may be unsubstituted, or may have a substituent, and is preferably of a carbon number of 6 to 21. Among these, an aryl group of a carbon number of 6 to 15 is preferable, and an aryl group of a carbon number of 6 to 10 is more preferable.

Preferable examples of the aryl group of a carbon number of 6 to 21 include a phenyl group, a naphthyl group, a biphenylenyl group, an acenaphthenyl group, a fluorenyl group, an anthracenyl group, an anthraquinonyl group, and a pyrenyl group. Among them, a phenyl group, a naphthyl group, a biphenylenyl group, an acenaphthenyl group, a fluorenyl group, or an anthracenyl group is more preferable and, further, a phenyl group, a naphthyl group, a biphenylenyl group, or a fluorenyl group is particularly preferable.

The aryl is preferably a phenyl group or a naphthyl group, particularly preferably a phenyl group.

"Heterocycle" has a hetero atom (e.g. nitrogen atom, sulfur atom, oxygen atom) in a ring thereof, may be a saturated ring, or an unsaturated ring, may be a monocycle, or a fused ring, and may be unsubstituted, or may have a substituent. A carbon number of the heterocycle is preferably 1 to 32, more preferably 2 to 16. Examples include an isocyanul ring, an epoxy ring, an oxetane ring, a furan ring, a tetrahydrofuran ring, a pyran ring, a tetrahydropyran ring, a dioxane ring, a trioxane ring, a tetrahydrothiophene ring, a thiophene ring, a dithiane ring, a trithiane ring, a pyrrolidine ring, a piperidine ring, a piperazine ring, a triazine ring, a triazacyclononane ring, a morpholine ring, a thiomorpholine ring, a pyrrole ring, a pyrazole ring, an imidazole ring, a triazole ring, a tetrazole ring, an oxazole ring, an isooxazole ring, a thiazole ring, a thiadiazole ring, an indole ring, a carbazole ring, a benzofuran ring, a pyridine ring, a quinoline ring, a pyrimidine ring, a pyridazine ring, a pyrazine ring, a phenanthroline ring, a quinazoline ring, an acridine ring, an uracil ring, and a lactone ring.

Among these, an isocyanul ring, an epoxy ring, a bran ring, a tetrahydrofuran ring, a pyran ring, a tetrahydropyran ring, a tetrahydrothiophene ring, a thiophene ring, a pyrrolidine ring, a piperidine ring, a piperazine ring, a morpholine ring, a thiomorpholine ring, a pyrrole ring, a pyrazole ring, an imidazole ring, a triazole ring, an oxazole ring, a thiazole ring, a thiadiazole ring, an indole ring, a carbazole ring, a benzofuran ring, a pyridine ring, a quinoline ring, a pyrimidine ring, a pyridazine ring, a pyrazine ring, a uracil ring, or a lactone ring is preferable and, particularly, an isocyanul ring, an epoxy ring, a tetrahydrofuran ring, a tetrahydropyran ring, a tetrahydrothiophene ring, a pyrrolidine ring, a piperidine ring, a morpholine ring, a pyrrole ring, a pyrazole ring, an imidazole ring, a triazole ring, an oxazole ring, a thiazole ring, a pyridine ring, a pyrimidine ring, a pyridazine ring, a pyrazine ring, or a lactone ring is preferable.

The "aromatic residue" represents an aromatic group obtained by removing a "hydroxy group which reacts with an isocyanate compound at a urethane bond forming reaction" from a structure of a raw material compound, when an aromatic compound having at least one hydroxy group in a molecule is used as a raw material upon synthesis of a specified compound, and may be unsubstituted or may have a substituent (when two or more substituents are possessed, those may be the same or different).

The "heterocyclic residue" represents a heterocycle group obtained by removing a "hydroxy ring group which reacts with an isocyanate compound at a urethane bond forming reaction" from a structure of a raw material compound, when a heterocyclic compound having at least one hydroxy group in a molecule is used as a raw material upon synthesis of a specified compound, and may be unsubstituted, or may have a substituent (when two or more substituents are possessed, those may be the same or different).

"The aliphatic residue having a hetero atom, aromatic ring, or a heterocycle in a molecule" represents a residue obtained by removing a "hydroxy group which reacts with an isocyanate compound at a urethane bond forming reaction" from a structure of a raw material compound, when an aliphatic compound having at least one hydroxy group in a molecule and, further, having a hetero atom, an aromatic ring, or a heterocycle in a molecular structure is used as a raw material upon synthesis of the specified compound according to the invention, and may be unsubstituted, or may have a substitutent (when two or more substituents are possessed, those may be the same or different). As the heteroatom, an oxygen atom, a sulfur atom or a nitrogen atom is preferable, an oxygen atom or a nitrogen atom is more preferable.

In the formula (I), $R^4$ when X is —$NR^4$— represents a hydrogen atom, or a hydrocarbon residue of a carbon number of 1 to 50, which may have a partial structure selected from the group consisting of an ether bond, an amino bond, a thioether bond, a hydrocarbon ring structure of a carbon number of 3 to 10, an aromatic ring, a heterocycle, a urethane bond, a thiourethane bond, an ester bond, an amido bond, a urea bond, and a thiourea bond in a structure, and may be saturated or unsaturated. The hydrocarbon residue may further have a substituent. When the hydrocarbon residue has a substituent, the substituent has the same meaning as that of the "substituent" explained in $R^1$ of the formulas (I) and (II), and a preferable example thereof is the same.

Among the compound represented by the formula (I), particularly, the "compound having at least one hydroxy group in a molecule" which is used as a raw material of a compound in which X is —O— is not particularly restricted, however examples include methanol, ethanol, propanol, butanol, pentanol, octanol, decyl alcohol, dodecanol, neopentyl alcohol, ethylene glycol, propanediol, neopentyl glycol, butanediol, hexanediol, octanediol, cyclopentanediol, cyclohexanediol, 4,4-isopropylidenedicyclohexanol, 1,3,5-cyclohexanetriol, cyclooctanediol, norbornanediol, decalindiol, inositol, 2-(hydroxymethyl)-1,3-propanediol, threitol, glycerol, erythritol, adonitol, arabitol, xylitol sorbitol, mannitol, iditol, dalcitol, ribose, xylose, galactose, glucose, sucrose, lactose, pentaerythritol, dipentaerythritol, tripentaerythritol, 1,3,5-tris(2-hydroxyethyl)-cyanuric acid, hydroquinone, catechol, resorsinol, fluoroglucinol, dihydroxynaphthalene, bis(4-hydroxyphenyl)methane, bisphenol A, 1,4-benzenedimethanol, dihydroxybenzophenone, furandimethanol, hydroxyindole, (hydroxymethyl)ethylene carbonate, dihydroxypyridine, dihydroxypyridazine, cyanuric acid, dihydroxypyrimidine, 2-(methylthio)ethanol, ethyl 2-hydroxyethyl sulfide, 3-(methylthio)-1-propanol, 4-(methylthio)-1-butanol, 3-(methylthio)-1-hexanol, 2,2'-thiodiethanol, 2-hydroxyethyl disulfide, 3,6-dithia-1,8-octanediol, 3,3'-thiodipropanol, 3-methylthio-1,2-propanediol, 3-ethylthio-1,2-propanediol, D-glucose, diethylmercaptal, 1-thio-β-D-glucose, sodium salt dehydrate, trans-1,2-dithiane-4,5-diol, 1,5-dithiacyclooctane-3-ol, 1,4-dithiaspiro(4.5) decane-8-ol, 1,4-dithiane-2,5-diol, triethanolamine, 2-amino-2-methyl-1,3-propanediol, bis-homotris, N,N,N',N'-tetrakis(2-hydroxypropyl)-ethylenediamine, 1,3-bis[tris(hydroxymethyl)-methylamino]propane, (R)-(+)-3-pyrrolidinol, 1-[2-(2-hydroxyethoxy)ethyl]-piperazine, 4-(2-hydroxyethyl) morpholine, and various diols described in JP-A No. 2005-326556, and these may be unsubstituted, or may have a substituent. When two or more substituents are possessed, those may be the same or different.

Among the compound represented by the formula (I), particularly, the "compound having at least one primary amino group in a molecule" used as a raw material of a compound in which X is —NH— is not particularly restricted, however examples include n-alkylamine of a carbon number of 1 to 32, 1,3-dimethylbutylamine, methylamine, methylamine hydrochloride, methylamine-$^{13}$C hydrochloride, methylhydrazine, ethylamine, ethylamine hydrochloride, propylamine, propylamine hydrochloride, butylamine, amylamine, hexylamine, heptylamine, octylamine, nonylamine, decylamine, undecylamine, dodecylamine, tridecylamine, 1-tetradecylamine, pentadecylamine, 1-hexadecylamine, octadecylamine, isopropylamine, see-butylamine, (S)-(+)-sec-butylamine, (R)-(−)-sec-butylamine, isobutylamine, tert-butylamine, tert-butylhydrazine hydrochloride, 1-methylbutylamine, 1-ethylpropylamine, (S)-(−)-2-methylbutylamine, 2-methylbutylamine, isoamylamine, 1,2-dimethylpropylamine, tert-amylamine, 1,3-dimethylbutylamine, 3,3-dimethylbutylamine, 2-aminoheptane, 3-aminoheptane, 1-methylheptylamine, 2-ethylhexylamine, 1,5-dimethylhexylamine, tert-octylamine, ethylenediamine, ethylenediamine dihydrochloride, 1,3-diaminopropane, 1,3-diaminopropane dihydrochloride, 1,2-diaminopropane, 1,4-diaminobutane, 1,2-diamino-2-methylpropane, DYTEK EP diamine, 1,5-diaminopentane, 2,2-dimethyl-1,3-propanediamine, hexamethylenediamine, DYTEK A amine, 1,7-diaminoheptane, 1,8-diaminooctane, C,C,C-trimethyl-1,6-hexanediamine, 1,9-diaminononane, 1,10-diaminodecane, 1,12-diaminododecane, N,N-dimethylethylenediamine, N,N-diethylethylenediamine, N,N-dibutylethylenediamine, N-(2-aminoethyl)-1,3-propanediamine, 3,3'-diamino-N-methyldipropylamine, N-(3-aminopropyl)-1,3-propanediamine, spermidine, 4-(aminomethyl)-1,8-octanediamine, tris(2-aminoethyl)amine, (aminomethyl)cyclopropane, cyclobutylamine, cyclopentylamine, 5-amino-2,2,4-trimethyl-1-cyclopentanemethylamine, cyclohexylamine, 4,4'-methylenebis(cyclohexyl-amine), 4,4'-methylenebis(2-methylcyclohexylamine), 1,2-diaminocyclohexane, trans-1,4-diaminocyclohexane, cyclohexanemethylamine, 1,3-cyclohexanebis(methylamine), cyclooctylamine, EXO-2-aminonorbornane, 1-adamantaneamine, 2,2'-(ethylenedioxy)-bis(ethylamine), 4,7,10-trioxa-1,13-tridecanediamine, tetrahydrofurfurylamine, ethanolamine, 3-amino-1-propanol, 4-amino-1-butanol, 1,4-bis(3-aminopropyl)piperazine, 4-(2-aminoethyl)morpholine, aniline, 3-aminothiophenol, 4,4'-ethylenediamine, 3,3'-methylenedianiline, 4,4'-methylenedianiline 4,4'-oxydianiline, 4-aminophenol, 4,4'-thiodianiline, o-tolidine, 5,5'-(hexafluoroisopropylidene)-di-o-toluidine, 3,5-bis(trifluoromethyl)-aniline, 4,4'-methylenebis(2,6-diethylaniline), 4,4'-diaminooctafluorobiphenyl, 1,3-phenylenediamine, 1,4-phenylenediamine, pararosaniline base, 2,3-diaminonaphthalene, binaphthyl-2,2'-diamine, meso-1,2-bis(4-methoxyphenyl)-ethylenediamine, 2-[2-(aminomethyl)phenylthio] benzyl alcohol, m-xylilenediamine, and p-xylylenediamine, and these may be unsubstituted, or may have a substituent. When two or more substituents are possessed, those may be the same or different.

Among the compound represented by the formula (I), particularly, the "compound having at least one secondary amino group in a molecule" used as a raw material of a compound in which X is —NR$^4$— is not particularly restricted, however examples include dimethylamine, 1,1-dimethylhydrazine, N-ethylmethylamine, diethylamine, N-methylpropylamine, N-methylisopropylamine, N-ethylisopropylamine, dipropylamine, diisopropylamine, N-methylbutylamine, N-ethylbutylamine, N-methyl-tert-butylamine, N-tert-butylisopropylamine, dibutylamine, di-sec-butylamine, diisobutylamine, tert-amyl-tert-butylamine, dipentylamine, N-methylhexylamine, dihexylamine, tert-amyl-tertoctylamine, dioctylamine, bis(2-ethylhexyl)amine, didecylamine, N-methyloctadecylamine, N-methylethylenediamine, N-ethylethylenediamine, N-propylethylenediamine, N-isopropylethylenediamine, N,N'-dimethylethylenediamine, N,N'-diethylethylenediamine, N,N'-diisopropylethylenediamine, N,N,N'-trimethylethylenediamine, N,N-dimethyl-N'-ethylethylenediamine, N,N-diethyl-N'-methylethylenediamine, N,N,N'-triethylethylenediamine, N,N,N',N'-tetramethylethylenediamine, N-methyl-1,3-propanediamine, N-propyl-1,3-propanediamine, N-isopropyl-1,3-propanediamine, N,N'-diethyl-1,3-propanediamine, N,N'-diisopropyl-1,3-propanediamine, N,N,N'-trimethyl-1,3-propanediamine, N,N'-dimethyl-1,6-hexanediamine, N-methylcyclohexylamine, N-ethylcyclohexylamine, N-isopropylcyclohexylamine, N-tert-butylcyclohexylamine, dicyclohexylamine, (1S,2S)—N,N'-bis(3,3-dimethylbutyl)-1,2-cyclohexanediamine, diallylamine, N-allylcyclopentylamine, allylcyclohexylamine, bis(2-methoxyethyl)amine, diphenylamine, N-phenylbenzylamine, and 1,2-dianilinoethane, and these may be unsubstituted, or may have a substituent. When two or more substituents are possessed, those may be the same or different.

Among the compound represented by the formula (I), particularly, the "compound having at least one thiol group in a molecule" used as a raw material of a compound in which X is —S— is not particularly restricted, however examples include methanethiol, ethanethiol, 1-propanethiol, 1-butanethiol, 1-pentanethiol, 1-hexanethiol, heptylmercaptan, 1-octanethiol, nonylmercaptan, 1-decanethiol, 1-dodecanethiol, hexadecylmercaptan, octadecylmercaptan, 2-methyl-1-propanethiol, 2-methyl-1-butanethiol, 3-methyl-1-butanethiol, 2-propanethiol, 1-methyl-1-propanethiol, 2-methyl-2-propanethiol, 2-methyl-2-butanethiol, arylmercaptan, cyclopentylmercaptan, cyclohexylmercaptan, 1,2-ethanedithiol, 1,3-propanedithiol, 1,4-butanedithiol, 2,3-butanedithiol, 1,5-pentanedithiol, 1,6-hexanedithiol, 1,8-octanedithiol, 1,9-nonanedithiol, 2,2,2-trifluoroethanthiol, 3-chloro-1-propanethiol, 2-mercaptoethanol, 1-mercapto-2-propanol, 3-mercapto-1-propanol, 3-mercapto-2-butanol, 3-mercapto-1,2-propanediol, 2,3-dimercapto-1-propanol, dithiothreitol, dithioerythritol, 1,4-dithio-L-threitol, 2-mercaptoethyl ether, 2-mercaptoethyl sulfide, furfurylmercaptan, thiophenol, thiocresol, ethylthiophenol, benzylmercaptan, 1,2,3-propanetrithiol, 1,1-cyclohexanedithiol, 1,2-cyclohexanedithiol, bicyclo[2,2,1]hepta-exo-cis-2,3-dithiol, 1,1-bis(mercaptomethyl)cyclohexane, ethylene glycol bis (2-mercaptoacetate), diethylene glycol bis(3-mercaptopropanol), bis(2-mercaptoethyl) ether, ethylene glycol bis(2-mercaptoacetate), ethylene glycol bis(3-mercaptopropionate), trimethylolpropanebis(2-mercaptoacetate), trimethylolpropanebis(3-mercaptopropionate), pentaerythritoltetrakis(2-mercaptoacetate), pentaerythritoltetrakis(3-mercaptopropionate), 1,2-dimercaptobenzene, 1,3-dimercaptobenzene, 1,4-dimercaptobenzene, 1,2-bis(mercaptomethyl)benzene, 1,3-bis(mercaptomethyl)benzene, 1,4-bis(mercaptomethyl)benzene, 1,2-bis(2-mercaptoethyl)benzene, 1,3-bis(2-mercaptoethyl)benzene, 1,4-bis(2-mercaptoethyl)benzene, 1,2-bis(2-mercaptoethyleneoxy)benzene, 1,3-bis(2-mercaptoethyleneoxy)benzene, 1,4-bis(2-mercaptoethyleneoxy) benzene, 1,2,3-trimercaptobenzene, 1,2,4-trimercaptobenzene, 1,3,5-trimercaptobenzene, 1,2,3-tris(mercaptomethyl)benzene, 1,2,4-tris(mercaptomethyl)benzene, 1,3,5-tris(mercaptomethyl)benzene, 1,2,3-tris(2-mercaptoethyl)benzene, 1,2,4-tris(2-mercaptoethyl) benzene, 1,3,5-tris(2-mercaptoethyl)benzene, 1,2,3-tris(2-mercaptoethyleneoxy)benzene, 1,2,4-tris(2-mercaptoethyleneoxy)benzene, 1,3,5-tris(2-mercaptoethyleneoxy)benzene, 1,2,3,4-tetramercaptobenzene, 1,2,3,5-tetramercaptobenzene, 1,2,4,5-tetramercaptobenzene, 1,2,3,4-tetrakis(mercaptomethyl) benzene, 1,2,3,5-tetrakis(mercaptomethyl)benzene, 1,2,4,5-tetrakis(mercaptomethyl)benzene, 1,2,3,4-tetrakis(2-mercaptoethyl)benzene, 1,2,3,5-tetrakis(2-mercaptoethyl) benzene, 1,2,4,5-tetrakis(2-mercaptoethyl)benzene, 1,2,3,4-tetrakis(2-mercaptoethyleneoxy)benzene, 1,2,3,5-tetrakis(2-mercaptoethyleneoxy)benzene, 1,2,4,5-tetrakis(2-mercaptoethyleneoxy)benzene, 2,2'-dimercaptobiphenyl, 4,4'-thiobisbenzenethiol, 4,4'-dimercaptobiphenyl, 4,4'-dimercaptobibenzyl, 2,5-toluenedithiol, 3,4-toluenedithiol, 1,4-naphtalenedithiol, 1,5-naphthalenedithiol, 2,6-naphthalenedithiol, 2,7-naphthalenedithiol, 2,4-dimethylbenzene-1,3-dithiol, 4,5-dimethylbenzene-1,3-dithiol, 9,10-anthoaracenedimethanethiol, 2-bis(2-mercaptoethylthio)benzene, 1,3-bis(2-mercaptoethylthio)benzene, 1,4-bis(2-mercaptoethylthio)benzene, 1,2-bis(2-mercaptoethylthiomethyl)benzene, 1,3-bis(2-mercaptoethylthiomethyl)benzene, 1,4-bis(2-mercaptoethylthiomethyl)benzene, 1,2,3-tris(2-mercaptoethylthio)benzene, 1,2,4-tris(2-mercaptoethylthio)benzene, 1,3,5-tris(2-mercaptoethylthio)benzene, 1,2,3,4-tetrakis(2-mercaptoethylthio)benzene, 1,2,3,5-tetrakis(2-mercaptoethylthio)benzene, 1,2,4,5-tetrakis(2-mercaptoethylthio)benzene bis(2-mercaptoethyl)sulfide, bis(2-mercaptoethylthio)methane, 1,2-bis(2-mercaptoethylthio)ethane, 1,3-bis(2-mercaptoethylthio)propane, 1,2,3-tris(2-mercaptoethylthio)propane, tetrakis(2-mercaptoethylthiomethyl)methane, 1,2-bis(2-mercaptoethylthio)propanethiol, 2,5-dimercapto-1,4-dithiane, bis(2-mercaptoethyl)disulfide, 3,4-thiophenedithiol, 1,2-bis (2-mercaptoethyl)thio-3-mercaptopropane, and bis-(2-mercaptoethylthio-3-mercaptopropane) sulfide, and these may be unsubstituted, or may have a substituent. When two or more substituents are possessed, those may be the same or different In addition, as the monoisocyanate compound having two acrylates, specifically, 1,1-(bisacryloyloxymethyl)ethyl isocyanate is used.

Then, examples (I-1) to (I-62) of the polyfunctional acrylate compound represented by the formula (I) will be shown, however the invention is not restricted to them.

(I-1)

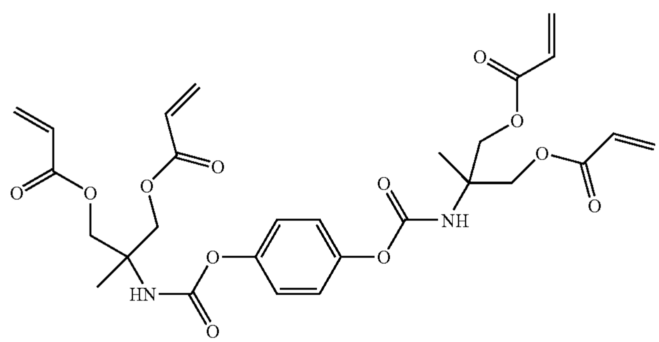

(I-2)

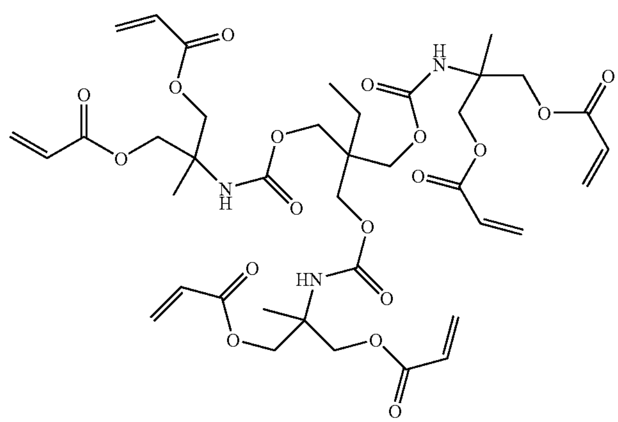

-continued
(I-3)
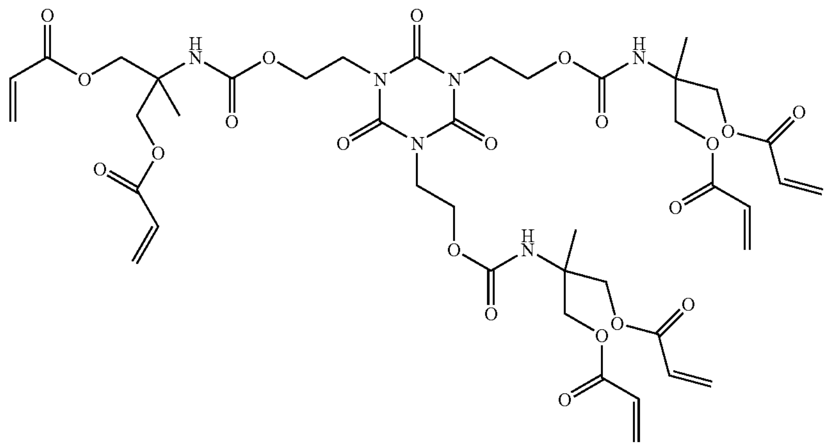
(I-4)
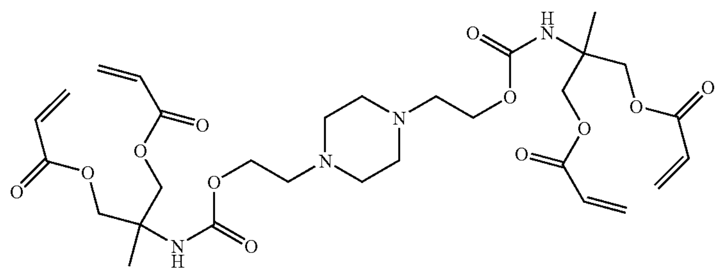
(I-5)
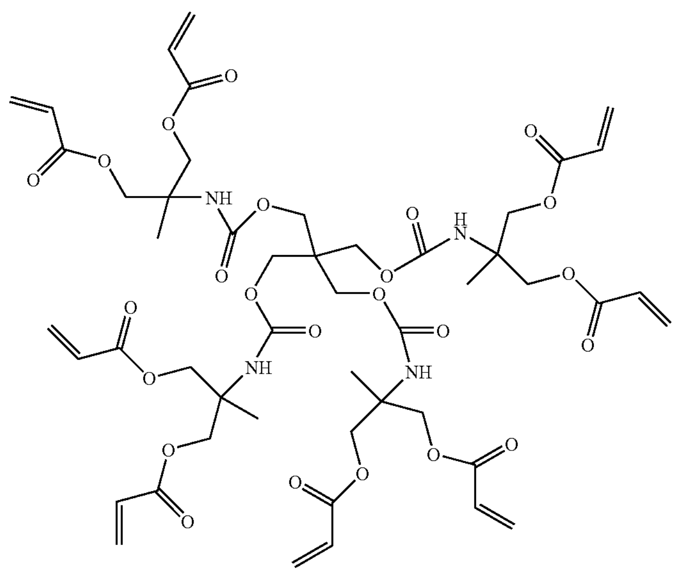
(1-6)
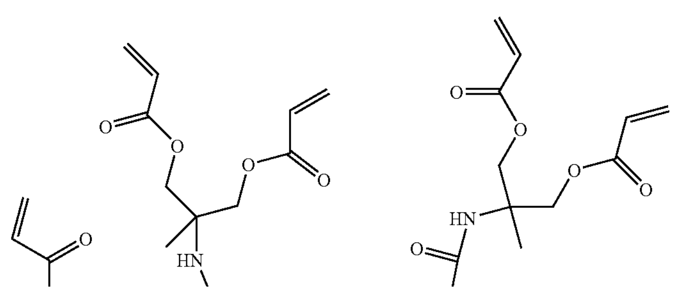

-continued
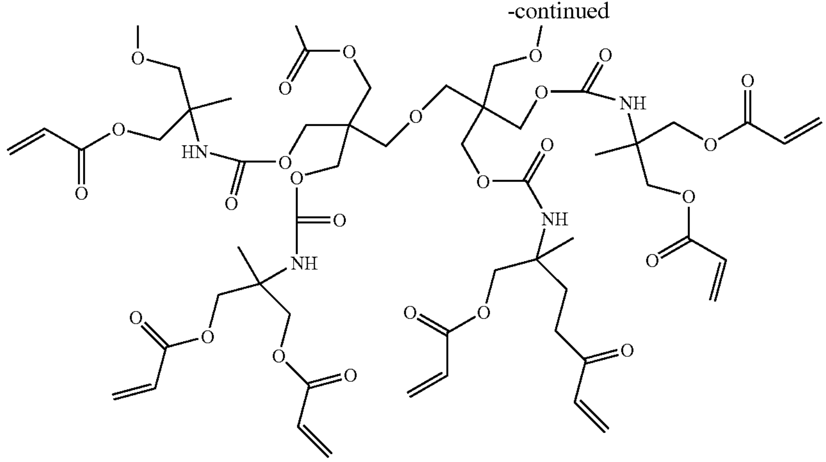
(I-7)
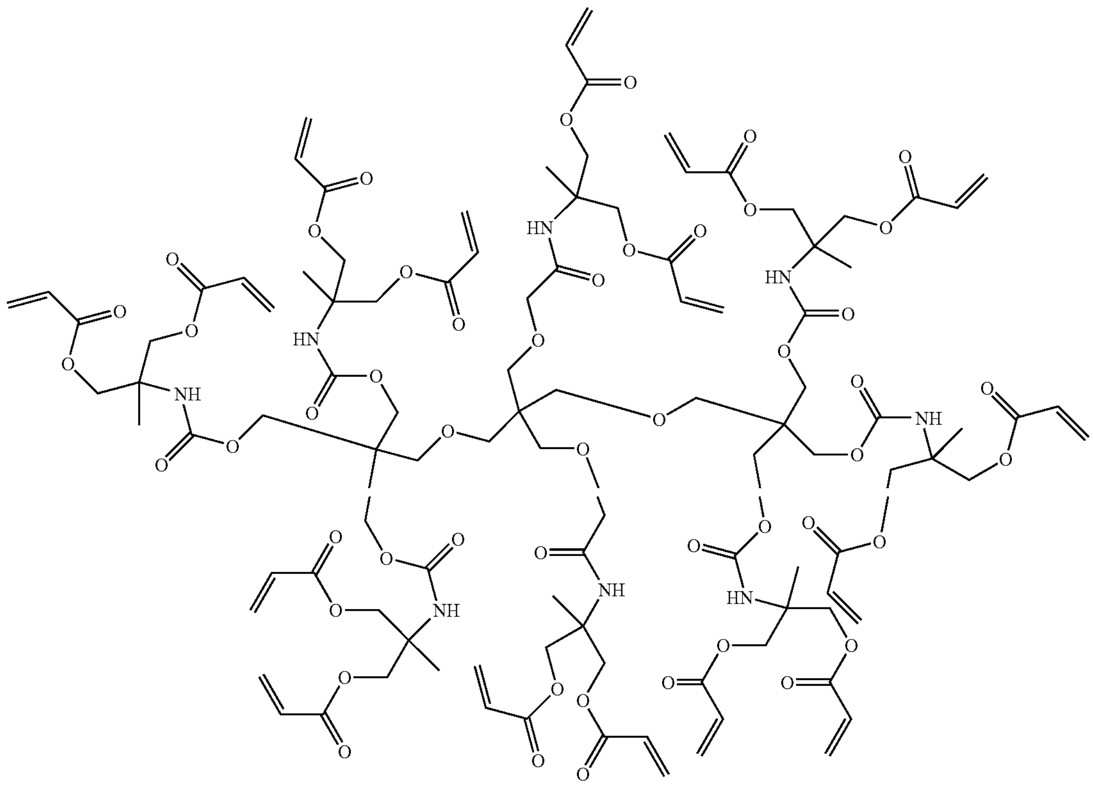
(I-8)
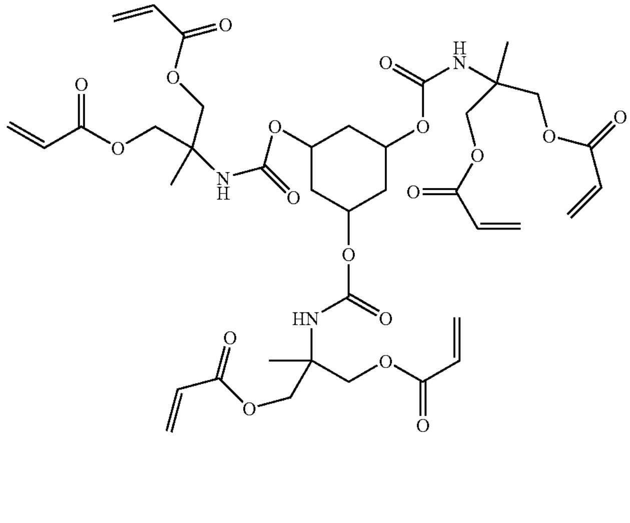

-continued
(I-9)
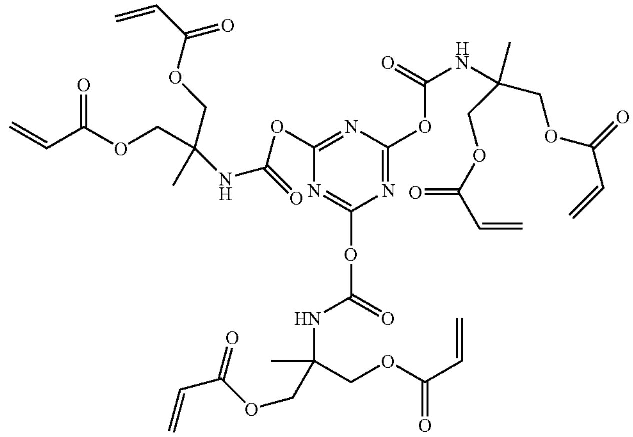
(I-10)
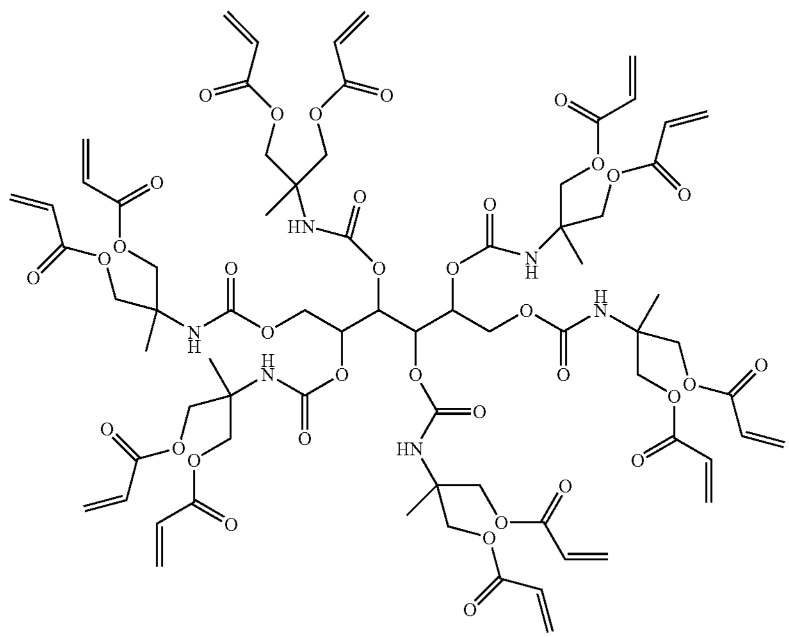
(I-11)
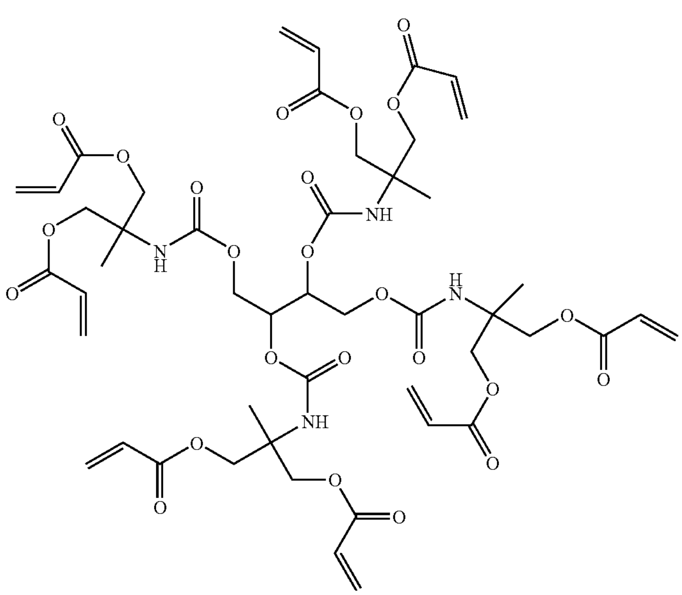

-continued
(I-12)
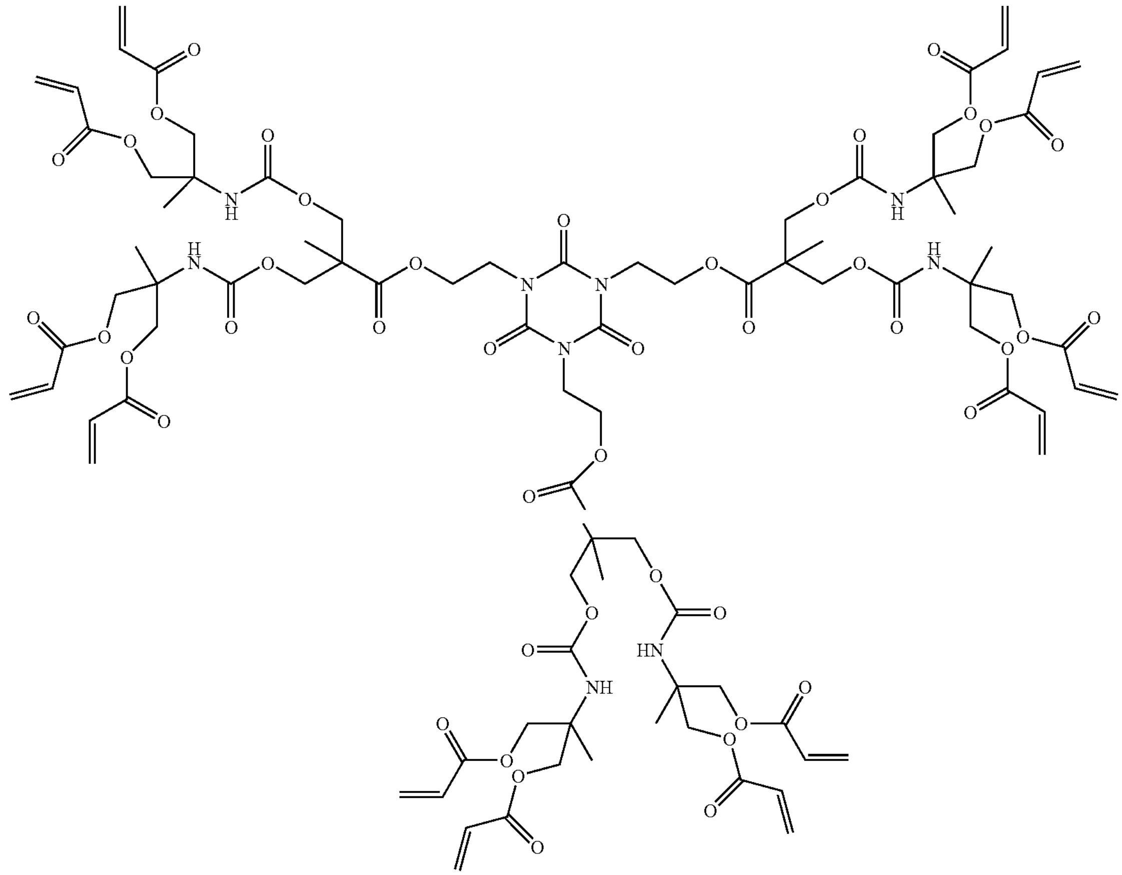
(I-13)
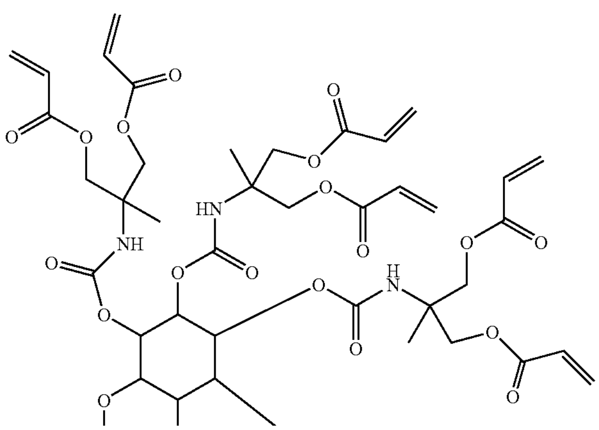

-continued
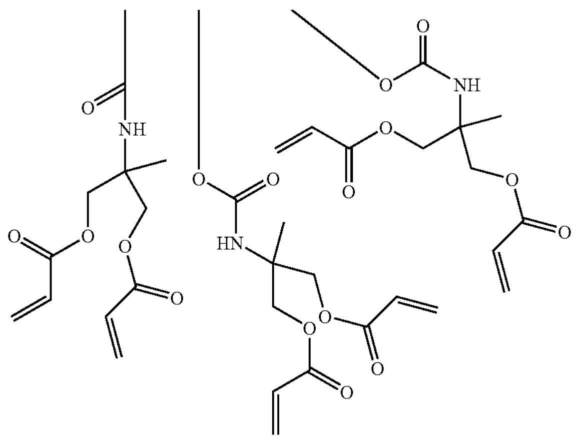
(I-14)
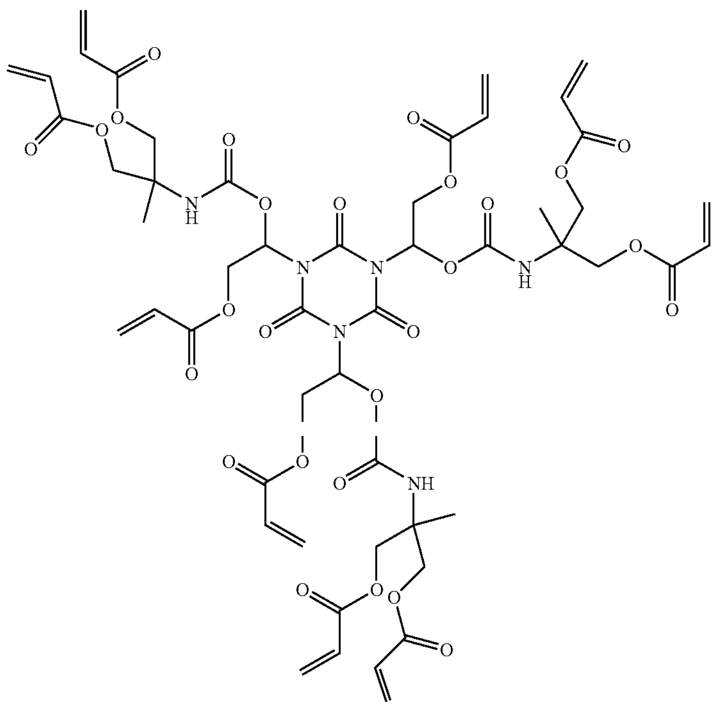
(I-15)
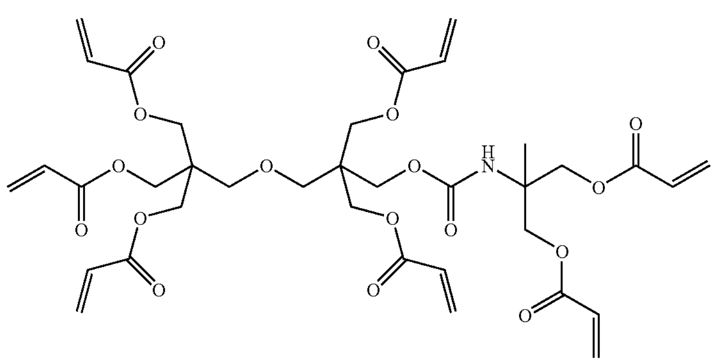

-continued
(I-16)
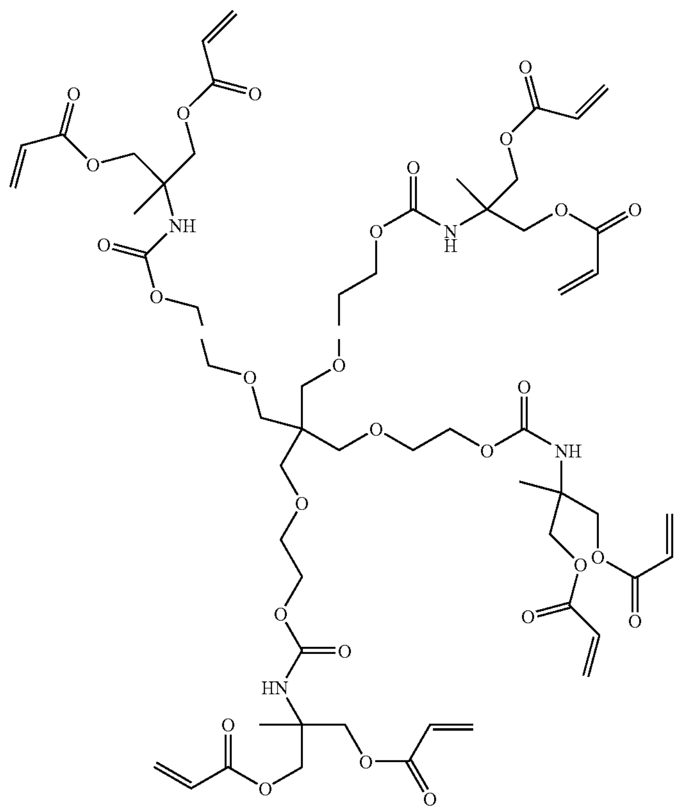
(I-17)
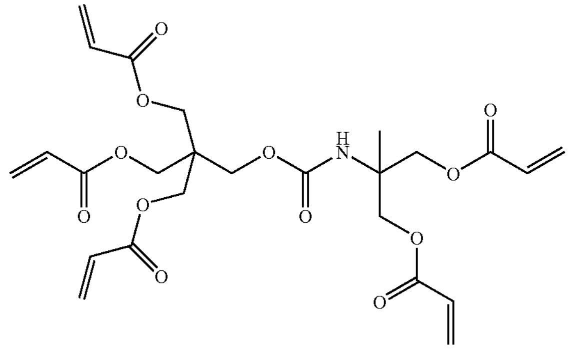
(I-18)
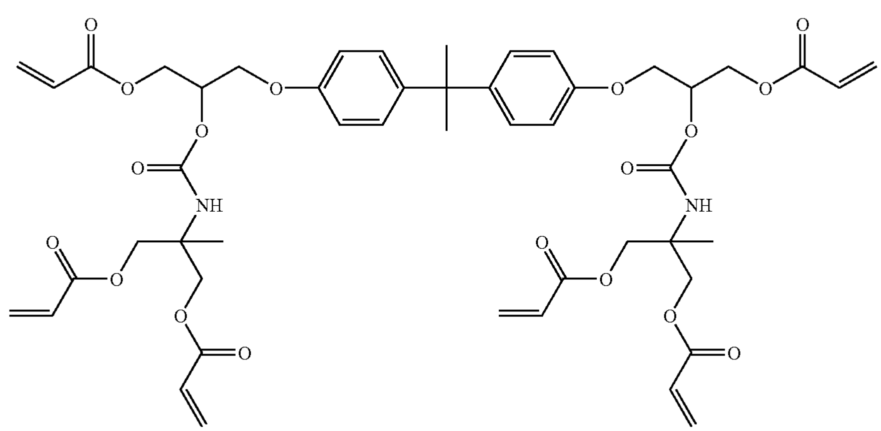

-continued
(I-19)
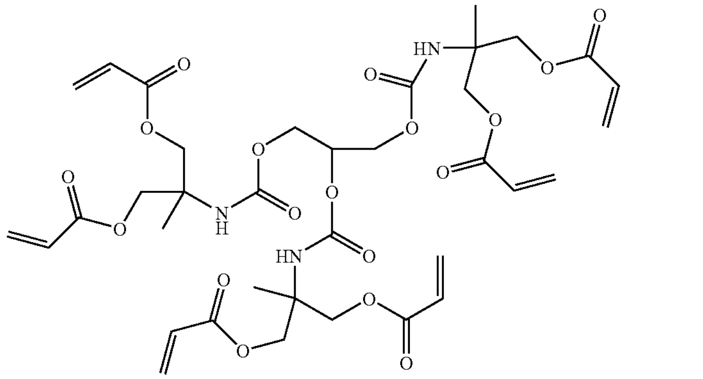
(I-20)
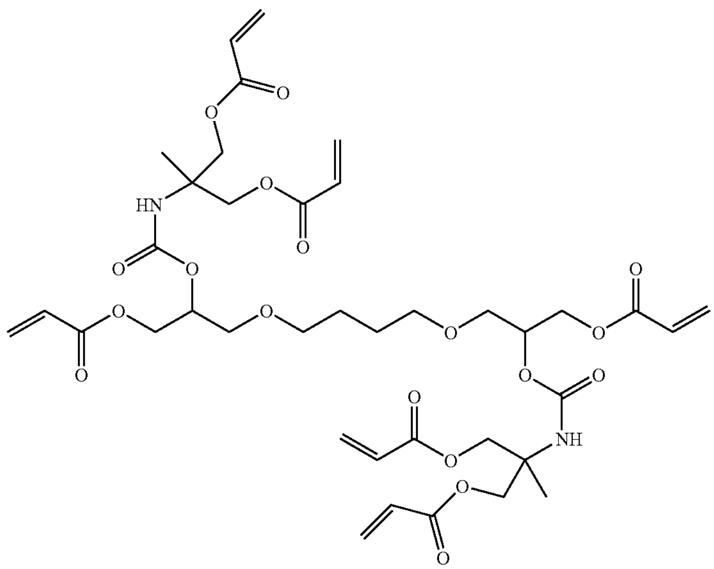
(I-21)
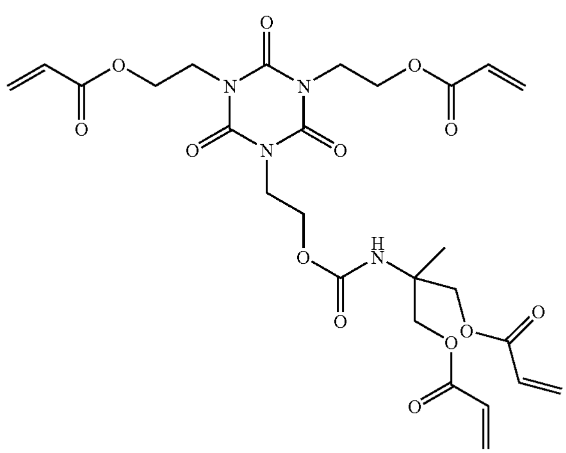

-continued
(I-22)
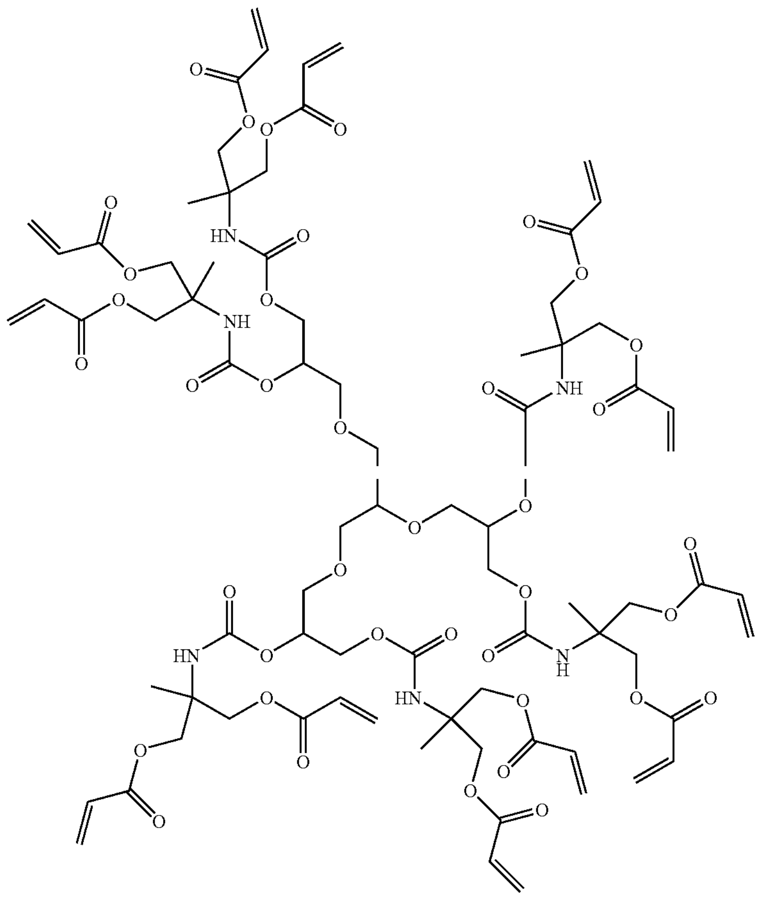
(I-23)
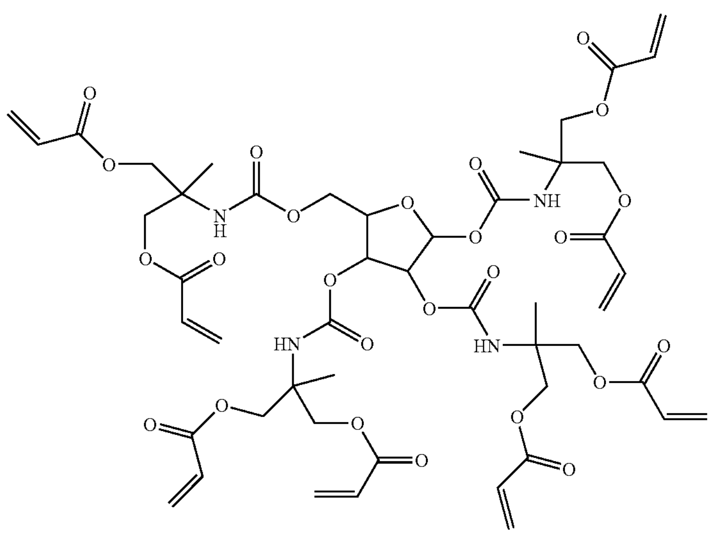

-continued
(I-24)
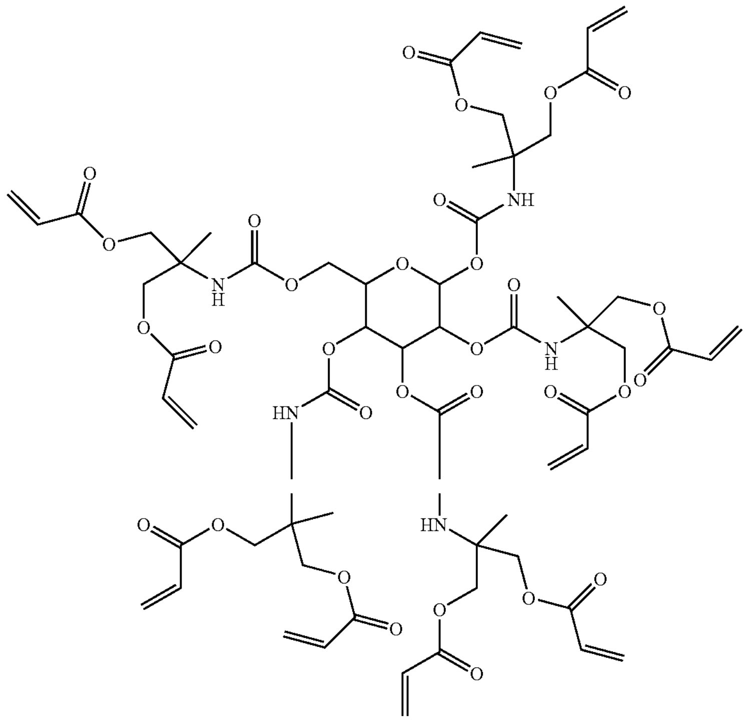
(I-25)
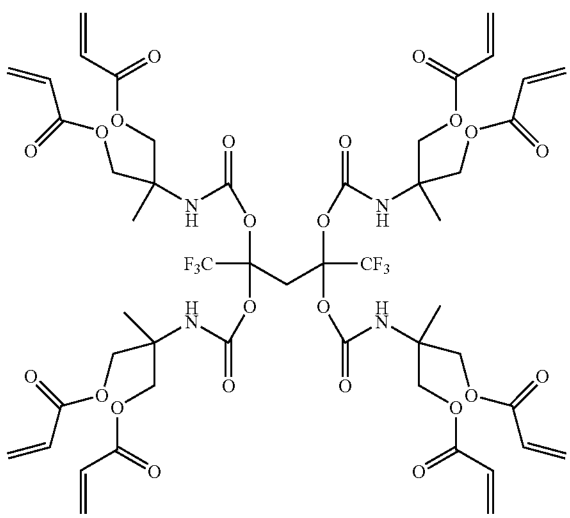

-continued
(I-26)
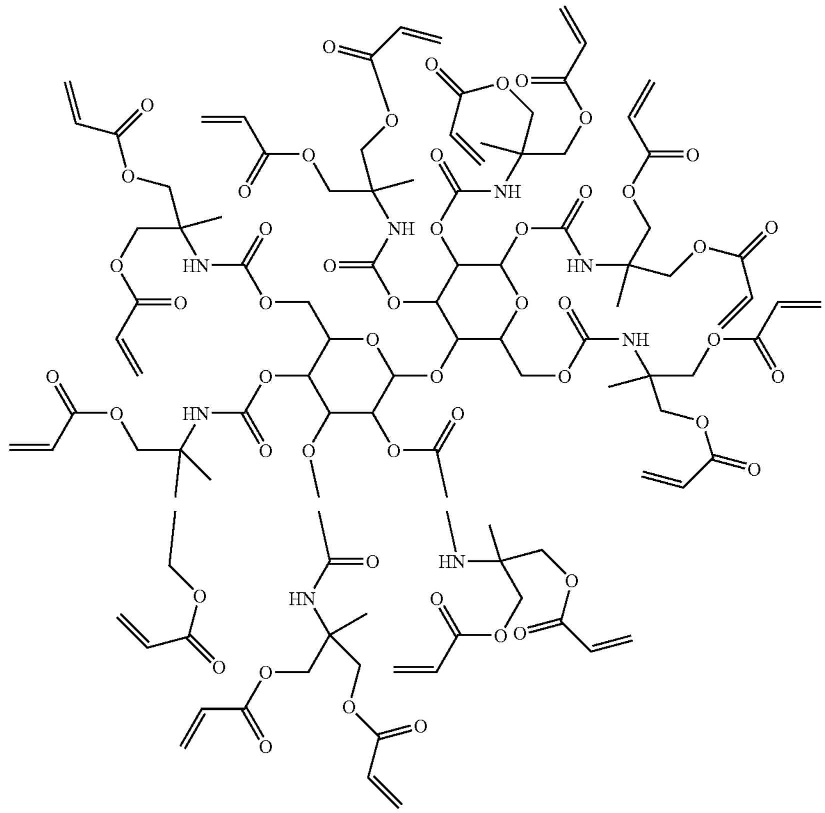
(I-27)
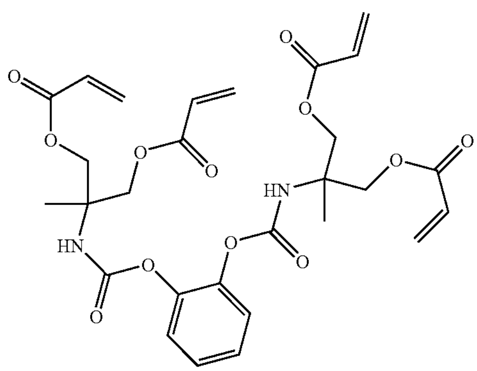

-continued
(I-28)
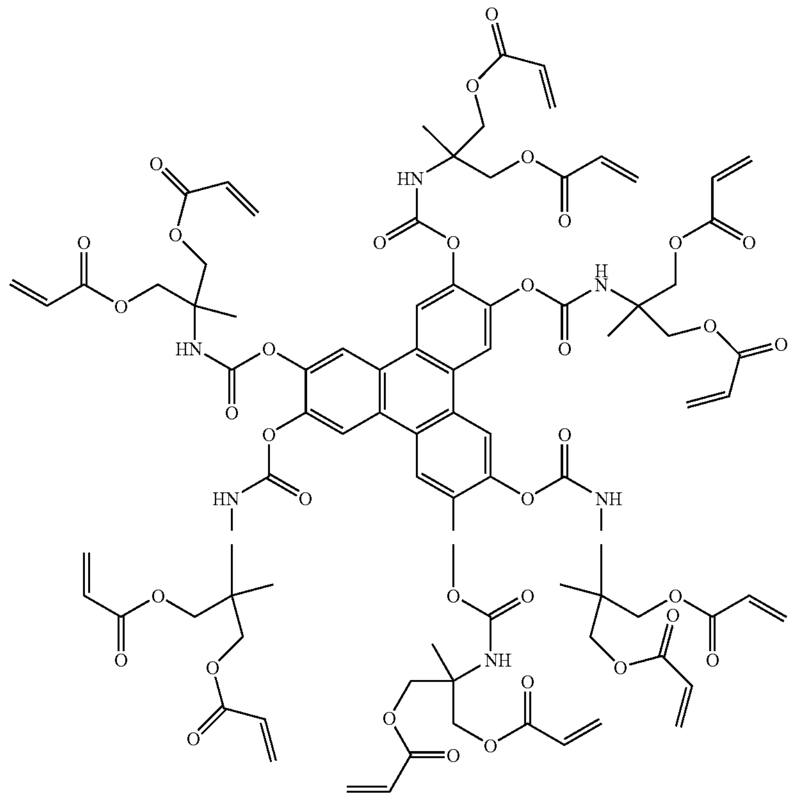
(I-29)
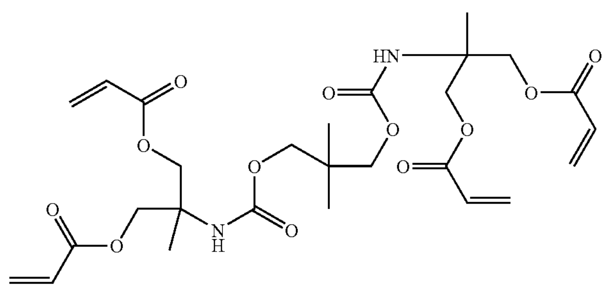
(I-30)
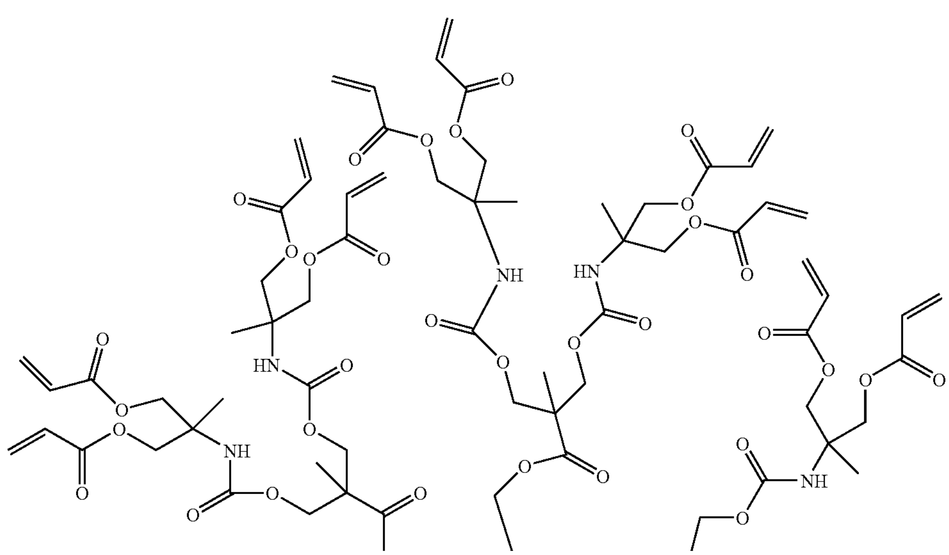

-continued
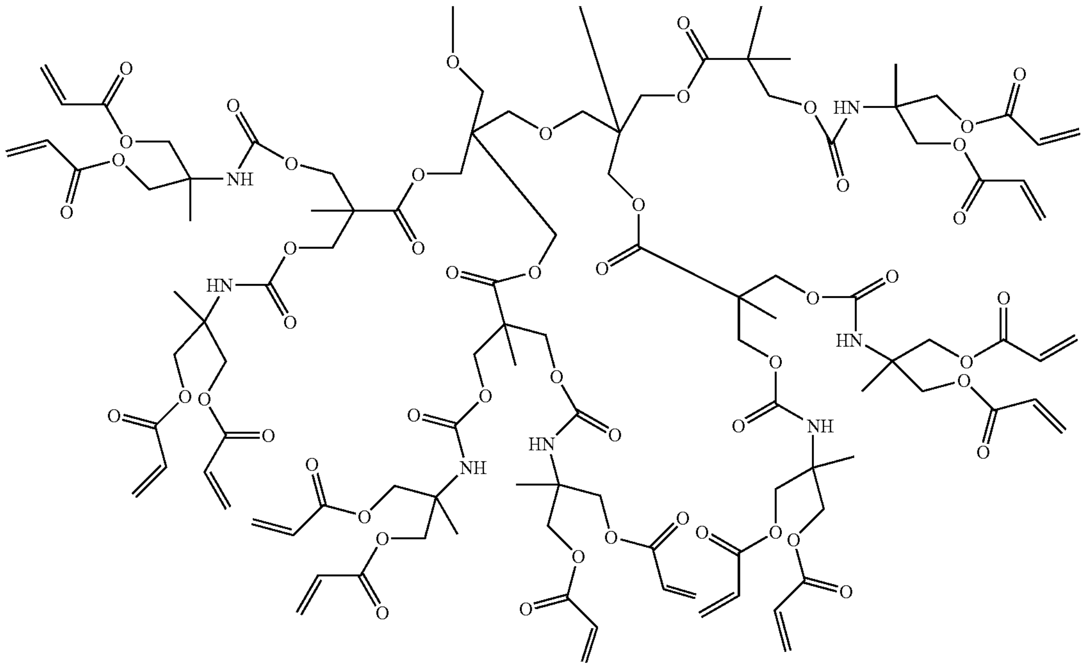
(I-31)
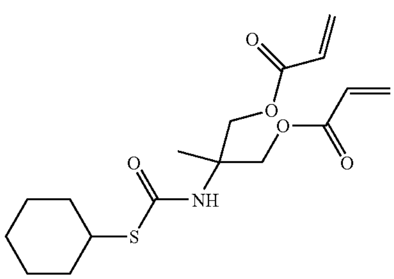
(I-32)
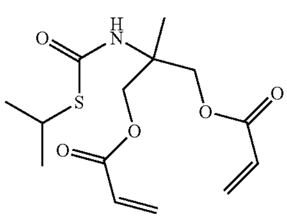
(I-33)
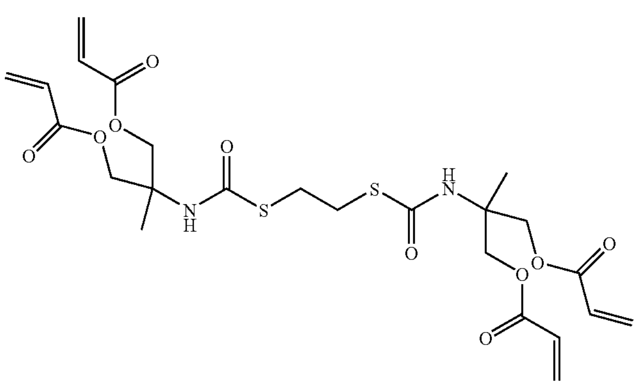

-continued
(I-34)
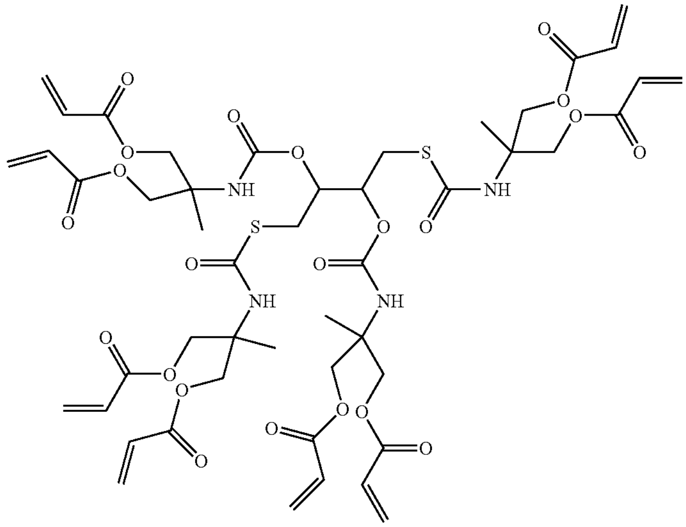
(I-35)
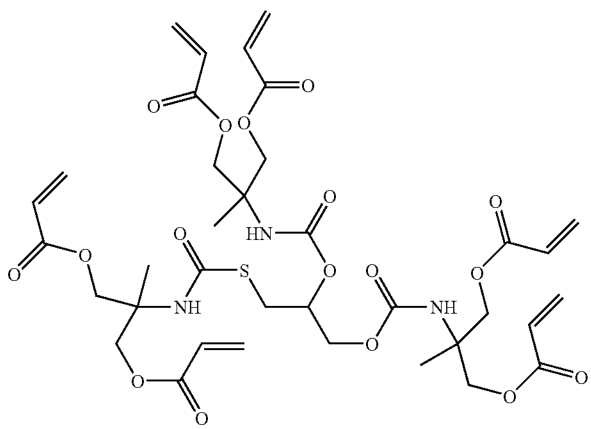
(I-36)
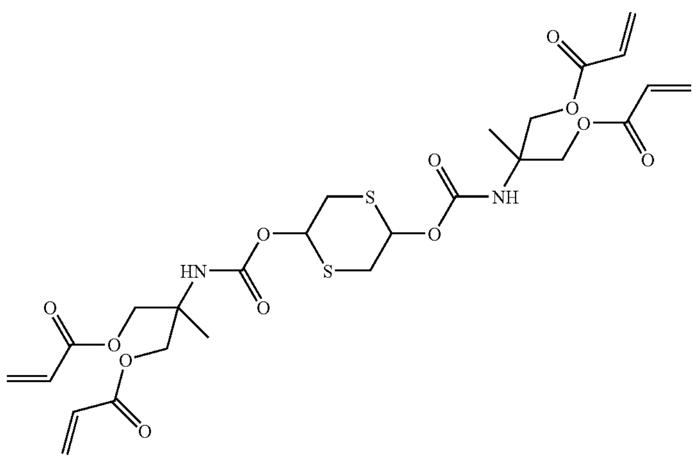

-continued
(I-37)
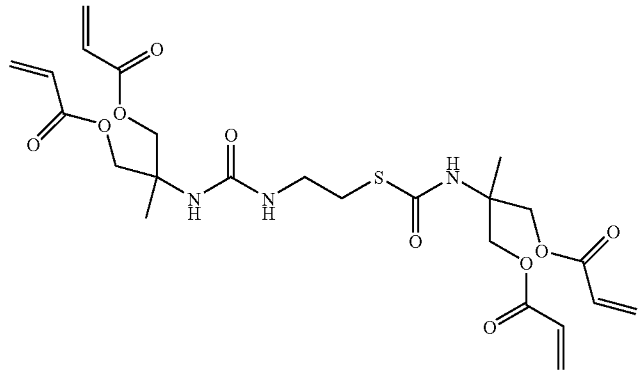
(I-38)
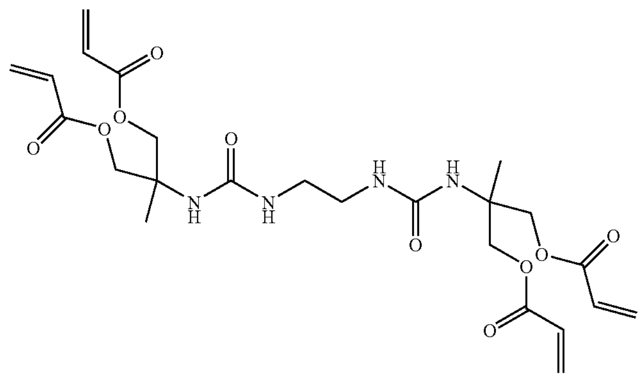
(I-39)
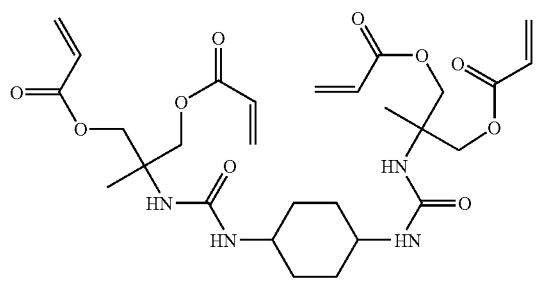
(I-40)
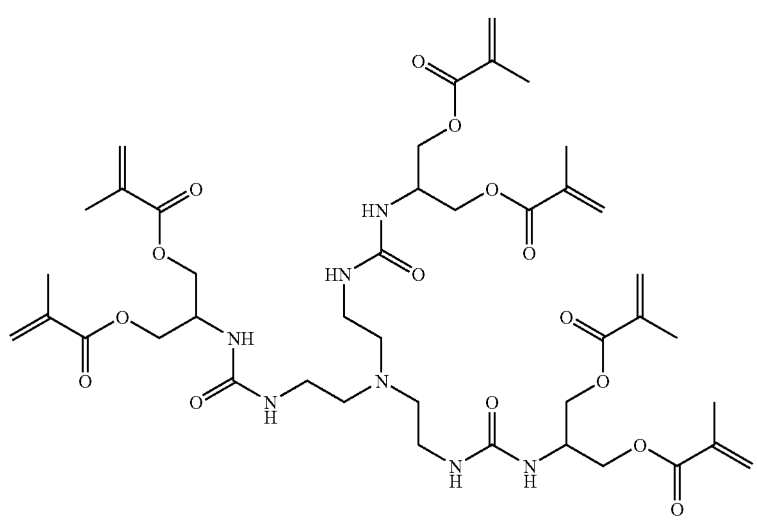

-continued
(I-41)
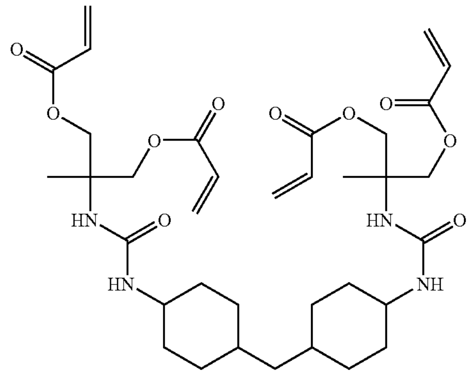
(I-42)
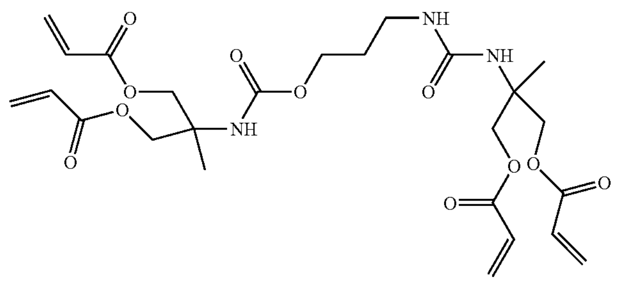
(I-43)
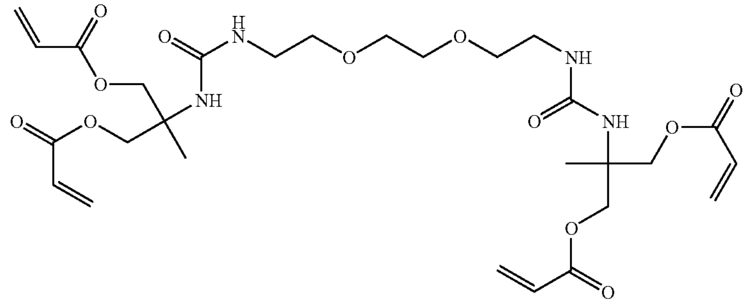
(I-44)
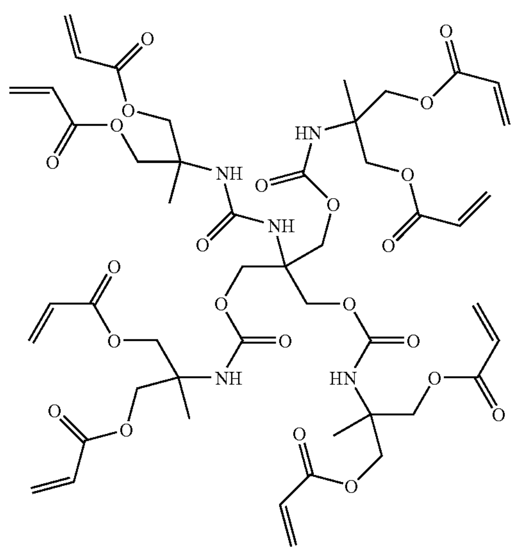

-continued
(I-45)
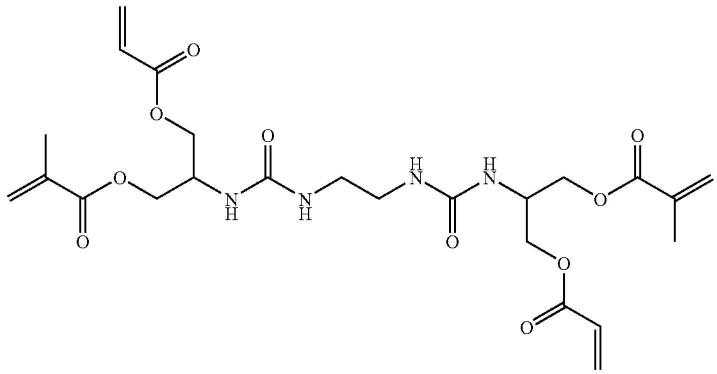
(I-46)
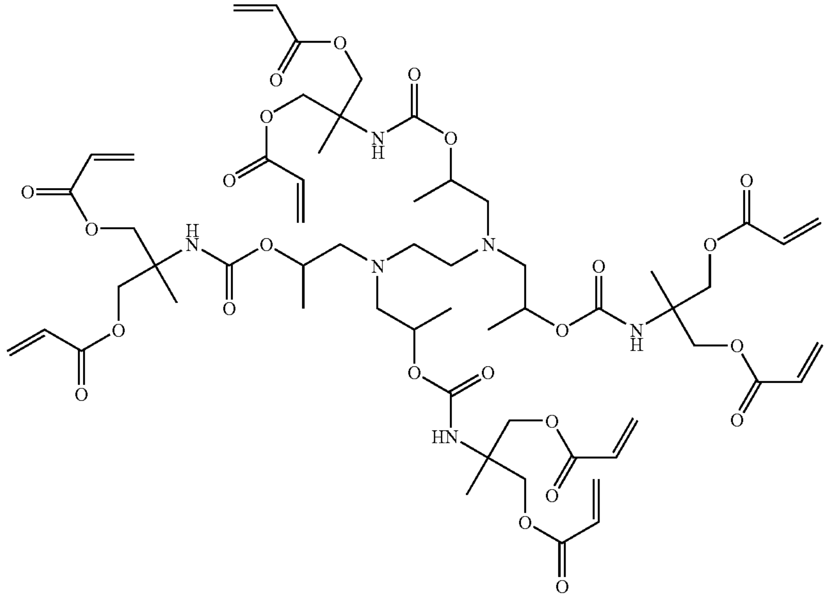
(I-47)
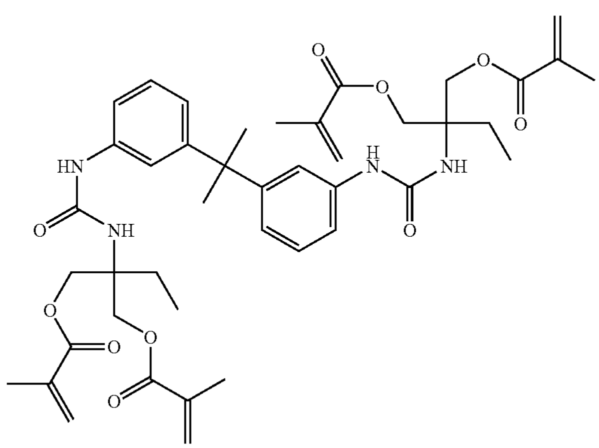

-continued
(I-48)
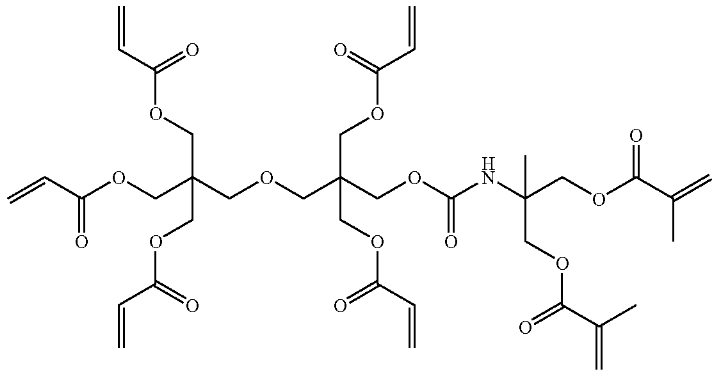
(I-49)
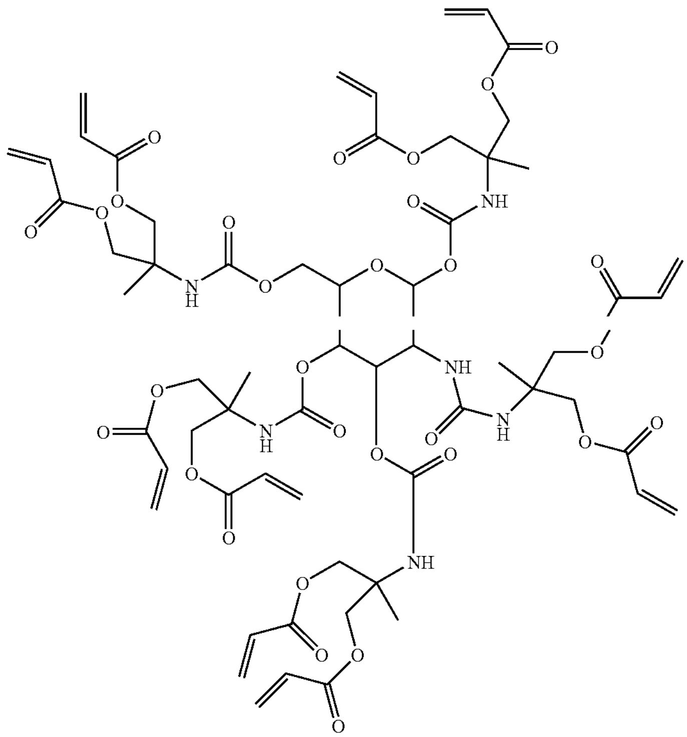
(I-50)
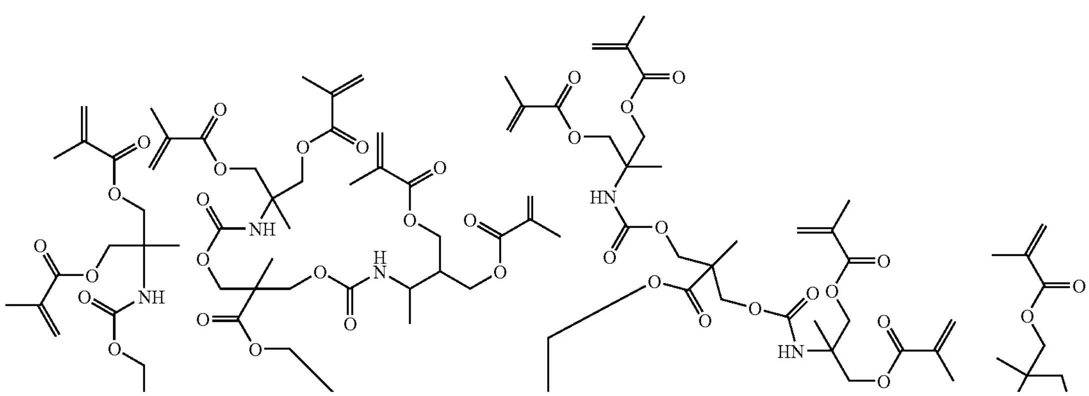

-continued
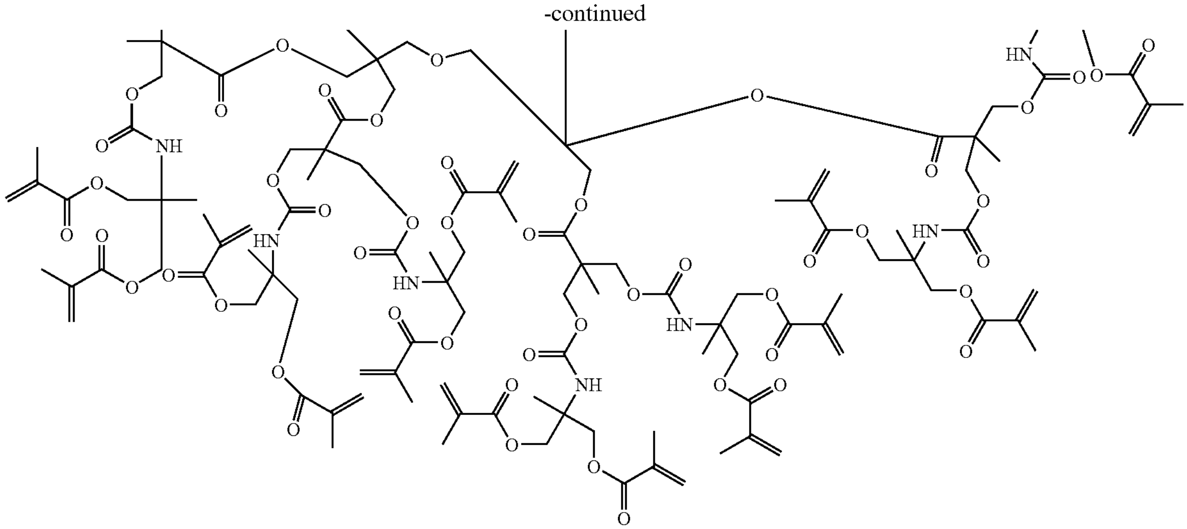
(I-51)
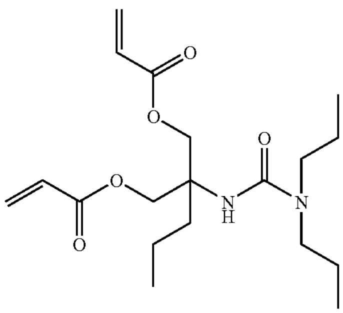
(I-52)
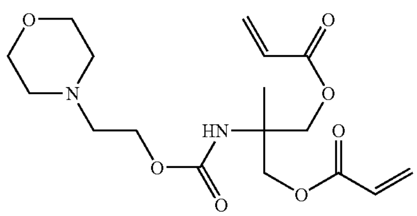
(I-53)
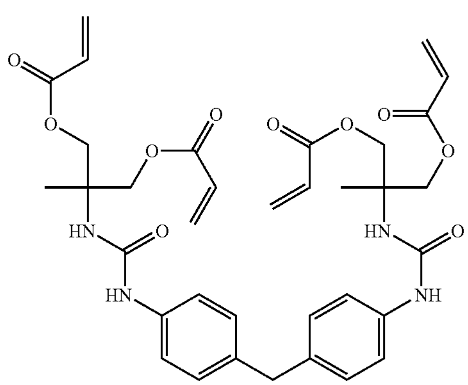
(I-54)
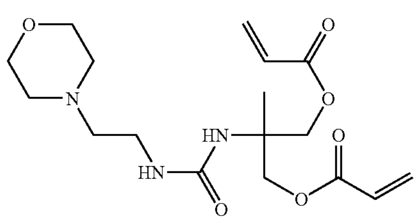

-continued
(I-55)
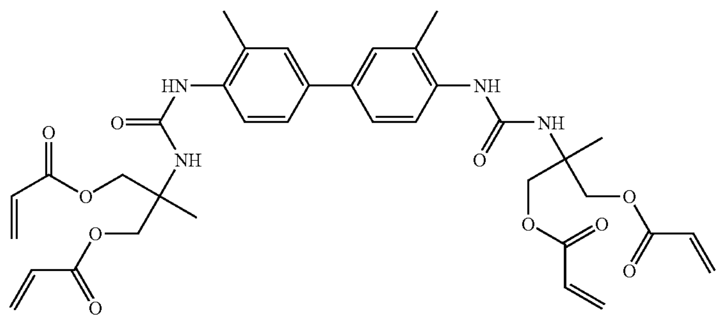
(I-56)
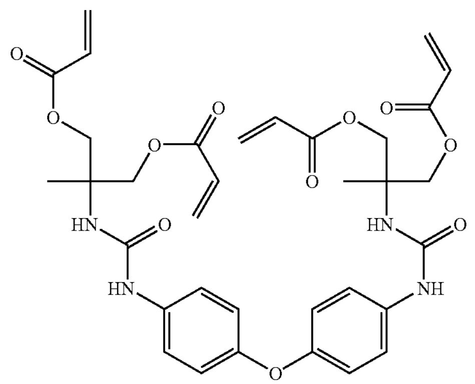
(I-57)
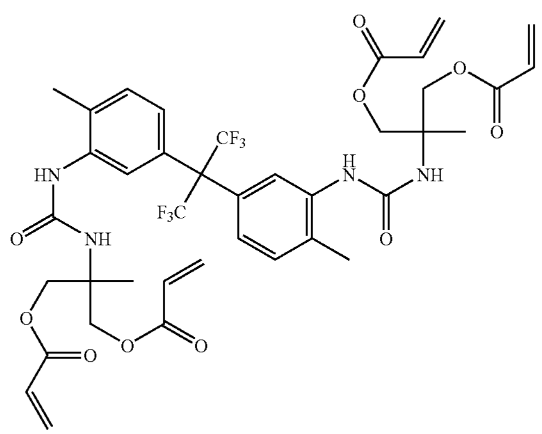
(I-58)
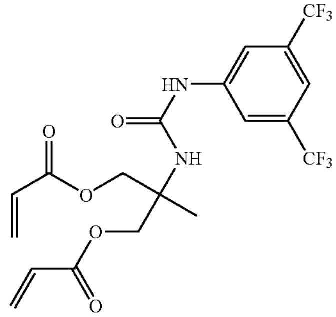

-continued
(I-59)
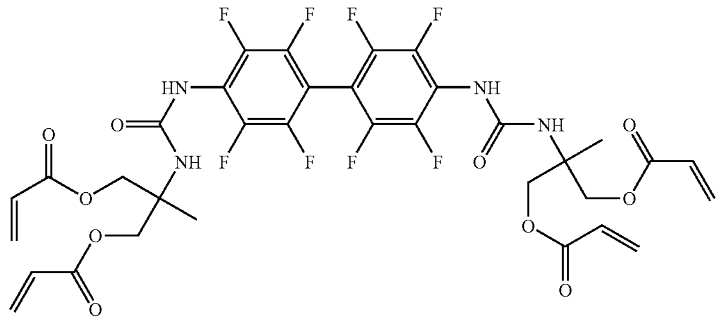
(I-60)
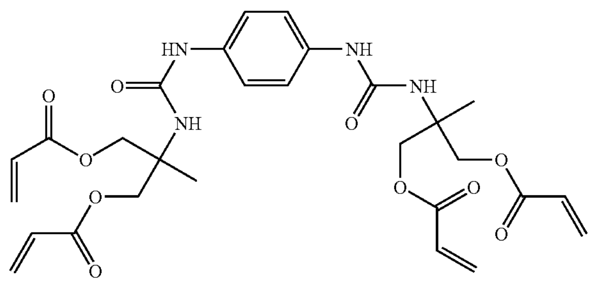
(I-61)
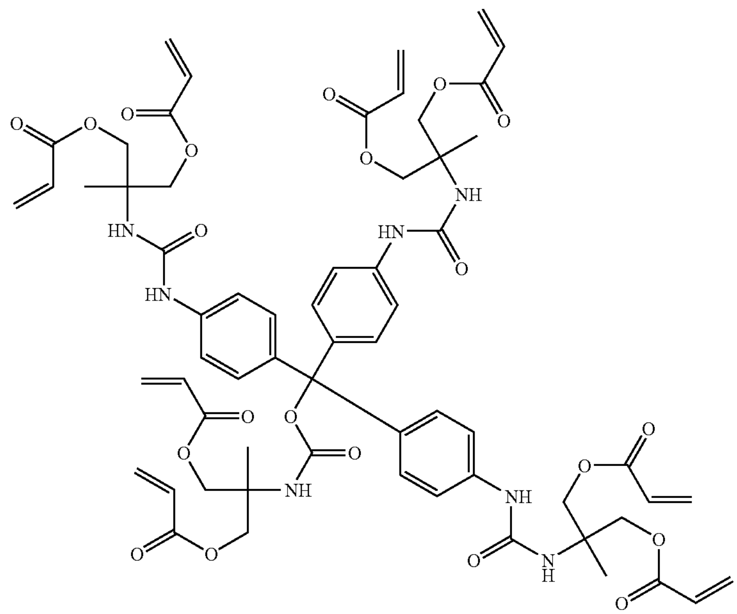
(I-62)
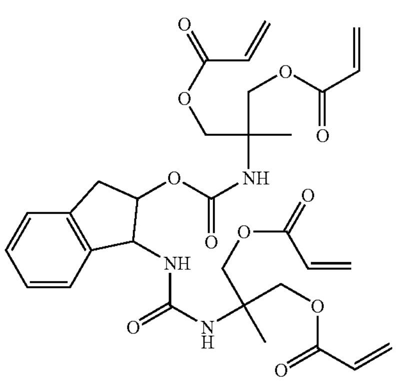

Then, a process for preparing the compound represented by the formula (I) will be explained.

Among the compound represented by the formula (I), particularly, in order to obtain a compound in which X is —O—, a molar ratio of an isocyanate group of monoisocyanate having two acrylates in a molecule is prepared to be 0.7 to 1.3, preferably 0.8 to 1.3, more preferably 0.9 to 1.2, most preferably 0.95 to 1.4 relative to a hydroxyl group of a compound having at least one hydroxy group in a molecule. When the ratio is less than 0.7, a proportion of a product having an unreacted hydroxy group is increased, and purification may become difficult. On the other hand, when the ratio is greater than 1.5, there is a possibility that, also after completion of a reaction, a not preferable side reaction proceeds leading to gelation.

In addition, among the compound represented by the formula (I), particularly, in order to obtain a compound in which X is —NH—, a molar ratio of an isocyanate group of monoisocyanate having two acrylates in a molecule is prepared to be 0.7 to 1.5, preferably 0.8 to 1.3, more preferably 0.9 to 1.2, most preferably 0.95 to 1.1 relative to a primary amino group of a compound having at least one primary amino group in a molecule. When the ratio is less than 0.7, a proportion of a product having an unreacted primary amino group is increased, and purification may become difficult. On the other hand, when the ratio is greater than 1.5, there is a possibility that, also after completion of a reaction, a not preferable side reaction proceeds, leading to gelation.

Similarly, among the compound represented by the formula (I), particularly, in order to obtain a compound in which X is —$NR^4$—, a molar ratio of an isocyanate group of monoisocyanate having two acrylates in a molecule is prepared to be 0.7 to 1.5, preferably 0.8 to 1.3, more preferably 0.9 to 1.2, most preferably 0.95 to 1.1 relative to a secondary amino group of a compound having at least one secondary amino group in a molecule. When the ratio is less than 0.7, a proportion of a product having an unreacted secondary amino group is increased, and purification may become difficult. On the other hand, when the ratio is greater than 1.5, there is a possibility that also after completion of a reaction, a not preferable side reaction proceeds, leading to gelation.

Further, among the compound represented by the formula (I), particularly, in order to obtain a compound in which X is —S—, a molar ratio of an isocyanate group of monoisocyanate having two acrylates in a molecule is prepared to be 0.7 to 1.5, preferably 0.8 to 1.3, more preferably 0.9 to 1.2, most preferably 0.95 to 1.1 relative to a thiol group of a compound having at least one thiol group in a molecule. When the ratio is less than 0.7, a proportion of a product having an unreacted thiol group is increased, and purification may become difficult. On the other hand, when the ratio is greater than 1.5, there is a possibility that, also after completion of a reaction, a not preferable side reaction proceeds, leading to gelation.

A catalyst used in the urethanation reaction, amidation reaction or thiourethanation reaction is not particularly restricted, but preferably, bismuth tris(2-ethylhexanoate), organic tin (meth)acrylate such as dibutyltin dilaurate, dibutyltin acetate, dibutyltin dichloride, tin octylate and organic zinc (meth)acrylate such as zinc octylate, zinc naphthenate, tertiary amines such as triethylenediamine, and triethylamine, or (meth)acrylate having an amidine skeleton such as 1,8-diazabicyclo[5,4,0]-7-undecene is used, and the catalyst is added in a range of 0.0001 to 10 parts by mass relative to 100 parts by mass of thiol or isocyanate.

In the above reaction, usually, a temperature range of −50° C. to 100° C. is applied. At −50° C. or lower, progression of a reaction is extremely slow, and at 100° C. or higher, a byproduct is increased, and there is a possibility that not only a yield is reduced, but also gelation is caused, being not preferable. If necessary, the reaction is performed by dilution with a solvent. As the solvent, solvents except for solvents, which react with isocyanate, such as alcohol, carboxylic acid and amines, can be used. From a viewpoint of a reaction rate, and solubility, polar solvents such as acetonitrile, N,N-dimethylformamide (DMF), N,N-dimethylacetamide (DMAc), dimethyl sulfoxide (DMSO), and N-methyl-2-pyrrolidone (NMP), chlorine-based solvents such as chloroform, and aromatic solvents such as toluene and xylene are preferably used. In order to prevent a reaction between remaining water and isocyanate, a dehydrated solvent is suitably used.

In addition, in order to prevent a not preferable side reaction (reaction of acrylate polymerization) during an urethanation reaction, it is preferable to add a polymerization inhibitor. As the polymerization inhibitor, quinones such as hydroquinone, and benzoquinone, phenols such as p-methoxyphenol, or N-nitrosophenylhydroxylamine salts are used.

In the curable composition of the invention, the compound represented by the formula (I) can be used alone, or two or more kinds may be used in combination.

A content of the specified compound in the curable composition of the invention, from a viewpoint of a sensitivity and developability, is preferably 0.01 to 90% by mass, more preferably 0.1 to 70% by mass, particularly preferably 0.5 to 50% by mass relative to a total solid content of the composition.

It is preferable that the curable composition of the invention contains a compound containing an ethylenically unsaturated double bond other than the specified compound (hereinafter, simply referred to as "compound containing ethylenically unsaturated double bond" in some cases).

The compound containing an ethylenically unsaturated double bond which can be used in the invention is other than the specified compound, and is selected from compounds which are an addition-polymerization compound having at least one ethylenically unsaturated double bond, and have at least one, preferably two or more terminal ethylenically unsaturated bonds. Specific examples of such the compound group include compounds described in the first aspect of the invention. In addition, a viewpoint for selection of these addition-polymerization compounds, and a preferable compound from the viewpoint are similar.

A content of the compound containing an ethylenically unsaturated double bond other than the specified compound is preferably 1% by mass to 90% by mass, more preferably 5% by mass to 80% by mass, further preferably 10% by mass to 70% by mass in a solid content of the curable composition of the invention.

Particularly, when the curable composition of the invention is used in formation of a colored pattern of a color filter, a content of the compound containing an ethylenically unsaturated double bond other than the specified compound is preferably 5% by mass to 50% by mass, more preferably 7% by mass to 40% by mass, further preferably 10% by mass to 35% by mass in the aforementioned range.

In addition, as a content ratio (mass ratio) of the specified compound and the compound containing an ethylenically unsaturated double bond other than the specified compound, from a viewpoint of a sensitivity and removability (developability) of an unexposed part, (specified compound)/(compound containing ethylenically unsaturated double bond other than the specified compound) is preferably 0.001 to 100, more preferably 0.005 to 50, further preferably 0.01 to 10.

<Photopolymerization Initiator>

The curable composition of the invention contains a photopolymerization initiator in addition to the specified compound. The photopolymerization initiator which can be used in the curable composition of the invention is a compound which can give rise to a chemical reaction generating a radical for light which is radiation, such as UV, DeepUV, visible light, infrared light, and electron beam, and is used for the purpose of acting on a binder described later coexist in a curable composition layer consisting of the curable composition by a radical (initiation species) produced by this compound to insolubilize the binder by a reaction such as cross-linking, polymerization, and degradation of an acidic group, or insolubilize the curable composition layer against an alkali developer by giving rise to, and progressing a reaction such as polymerization of a polymerizable monomer and oligomer described later coexist in the curable composition layer, and cross-linking of a cross-linking agent.

Examples of the radiation-sensitive compound which can give rise to a chemical reaction such as acid generation and base generation by radiation like this include, in addition to the photopolymerization initiator, a light acid generator and a light base generator, and it is suitable to use a photopolymerization initiator in order to give rise to and promote a polymerization reaction of the polyfunctional acrylate compound in the invention.

The photopolymerization initiator is not particularly restricted so long as it can polymerize the polyfunctional acrylate compound and the polymerizable monomer in the invention by an initiation species generated from the initiator, but is preferably selected from a viewpoint of the property, initiation efficiency, an absorption wavelength, availability, and the cost. And, the photopolymerization initiator can be used alone, or two or more kinds may be used in combination Examples of the photopolymerization initiator include at least one active halogenated compound selected from a halomethyloxadiazole compound, and a halomethyl-s-triazine compound, a benzyldimethylketal compound, an α-hydroxyketone compound, and an α-aminoketone compound, and a acylphophine-based compound, a phosphine oxide-based compound, a metallocene compound, a 3-aryl-substituted coumarin compound, a triallylimidazole dimer, an onium-based compound, a benzothiazole-based compound, a benzophenone compound, an acetophenone compound and a derivative thereof, a cyclopentadiene-benzene-iron complex and a salt thereof, and an oxime-based compound.

Examples of the active halogen compound such as halomethyloxadiazole include 2-halomethyl-5-vinyl-1,3,4-oxadiazole compounds described in JP-B No. 57-6096, 2-trichloromethyl-5-styryl-1,3,4-oxadiazole, 2-trichloromethyl-5-(p-cyanostyryl)-1,3,4-oxadiazole, and 2-trichloromethyl-5-p-methoxystyryl)-1,3,4-oxadiazole.

Examples of the photopolymerization initiator include vinyl-halomethyl-s-triazine compounds describe in JP-B No. 59-1281, 2-(naphtho-1-yl)-4,6-bis-halomethyl-s-triazine compounds and 4-(p-aminophenyl)-2,6-di-halomethyl-s-triazine compounds described in JP-A No. 53-133428.

Other examples include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2,4-trichloromethyl(pipenyl)-6-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-diphenyl)aminophenyl]-2,6-di(trichloromethyl)-s-triazine, 4-(p-N-choroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-[m-bromo-p-N-ethoxycarbonylmethylaminophenyl]-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-

N-chloroethylaminophenyl)-2,6-di(trichloromethyl)-s-triazine, 4-(o-chloro-p-N-chloroethylaminophenyl)-2,6-di(trichloromethyl)3-s-triazine, and 4-(o-fluoro-p-N-chloroethylaminophenyl)-2,6-di(trichloromethyl)-s-triazine.

Other examples favorably used include TAZ series compounds manufactured by Midori Chemical Co. such as TAZ-107, TAZ-110, TAZ-104, TAZ-109, TAZ-140, TAZ-204, TAZ-113 and TAZ-123; T-series compounds manufactured by Panchim Co. such as T-OMS, T-BMP, T-R and T-B; IRGACURE series compounds manufactured by Ciba Specialty Chemicals such as IRGACURE 369, IRGACURE 784, IRGACURE 651, IRGACURE 184, IRGACURE 500, IRGACURE 1000, IRGACURE 149, IRGACURE 819 and IRGACURE 261; DAROCURE series compounds manufactured by Ciba Specialty Chemicals such as DAROCURE 1173; 4,4'-bis(diethylamino)-benzophenone, 2-(O-benzoyloxime)-1-[4-(phenylthio)phenyl]-1,2-octanedione, 2-benzyl-2-dimethylamino-4-morpholinobutylophenone, 2,2-dimethoxy-2-phenyl acetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, and benzoin isopropylether.

Known photopolymerization initiators other than the photopolymerization initiators described above may be used together in the curable composition of the invention.

Specific examples thereof include vicinal polyketol aldonil compounds disclosed in U.S. Pat. No. 2,367,660, α-carbonyl compounds disclosed in U.S. Pat. Nos. 2,367,661 and 2,367,670, acyloin ether disclosed in U.S. Pat. No. 2,448,828, aromatic acyloin compounds substituted with α-hydrocarbons disclosed in U.S. Pat. No. 2,722,512, polynucleic quinone compounds disclosed in U.S. Pat. Nos. 3,046,127 and 2,951,758, combinations of triallyl imidazole dimer and p-aminophenylketone disclosed in U.S. Pat. No. 3,549,367, benzothiazole compounds/trihalomethyl-s-triazine compounds disclosed in JP-B No. 5148516.

A content of the photopolymerization initiator in the curable composition is preferably 0.01 to 50% by mass, more preferably 1 to 40% by mass, particularly preferably 1 to 30% by mass relative to a total solid content of the polyfunctional acrylate compound and the polymerizable monomer in the invention. When the content is less than 0.01% by mass, it is difficult for polymerization to progress and, when the content exceeds 50% by mass, a polymerization rate becomes greater, however a molecular weight is reduced, and a film strength is decreased in some cases.

<Sensitizer>

In the curable composition in the invention, for the purpose of improving an efficiency of radical generation, and rendering a photosensitive wavelength longer, a sensitizer and a photostabilizing agent may be used in combination with the photopolymerization initiator. As the sensitizer which can be used in the invention, an agent which sensitizes the photopolymerization initiator by an electron transfer mechanism or an energy transfer mechanism is preferable.

Specific examples of sensitizer and photostabilizing agent include benzoin, benzoin methylether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methyl xanthone, 2-methoxy xanthone, 2-methoxy xanthone, thioxanthone, 2,4-diethylthioxanthone, acrydone, 10-butyl-2-chloroacrydone, benzyl, dibenzalacetone, p-(dimethylamino)phenyl styrylketone, p-(dimethylamino)phenyl-p-methyl styrylketone, benzophenone, p-(dimethylamino)benzophenone (or Michller's ketone), p-(diethylamino)benzophenone, benzoanthrone and benzothiazole compounds described in JP-B No. 51-48516, and Tinuvin 11 30 and 400.

In addition, sensitizers belonging to compounds listed below and having an absorption wavelength in a wavelength region of 300 nm to 450 nm are also exemplified.

Examples of a preferable sensitizer include sensitizers belonging to the following compounds and having an absorption wavelength in a region of 330 nm to 450 nm.

Examples include polynuclear aromatic compounds (e.g. phenanthrene, anthracene, pyrene, perylene, triphenylene, 9,10-dialkoxyanthracene), xanthenes (e.g. fluorescein, eosine, erythirosine, rhodamine B, rosebengal), thioxanthones (isopropylthioxanthone, diethylioxanthone, chlorothioxanthone), cyanines (e.g. thiacarbocyanine, oxacarbocyanine), merocyanines (e.g. merocyanine, carbo merocyanine), phthalocyanines, thiazines (e.g. thionine, methylene blue, toluidine blue), acridines (e.g. acridine orange, chloroflavin, acriflavine), anthraquinones (e.g. anthraquinone), squaliums (e.g. squalium), acridine orange, coumarins (e.g. 7-diethylamino-4-methylcoumarin), ketocoumarin, phenothiazines, phenazines, styrylbenzenes, azo compound, diphenylmethane, triphenylmethane, distyrylbenzenes, carbazoles, porphyrin, spiro compound, quinacridone, indigo, styryl, pyrylium compound, pyromethene compound, pyrazolotriazole compound, benzothiazole compound, barbituric acid derivative, thiobarbituric acid derivative, acetophenone, benzophenone, thioxanthone, aromatic ketone compound such as Michler's ketone, and heterocycle compound such as N-aryloxazolidinone, and further examples include compounds described in EP No. 568,993, U.S. Pat. No. 4,508,811, U.S. Pat. No. 5,227,227, JP-A No. 2001-125255, and JP-A No. 11-271969.

Examples of a more preferable sensitizer include compounds represented by the following formulas (i) to (iv).

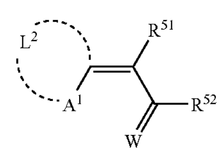

(i)

In the formula (i), $A^1$ represents a sulfur atom or $NR^{50}$, $R^{50}$ represents an alkyl group or an aryl group, $L^2$ is taken together with adjacent $A^1$ and an adjacent carbon atom to represent a non-metal atomic entity forming a basic nucleus of a coloring matter, $R^{51}$ and $R^{52}$ each independently represent a hydrogen atom or a monovalent non-metal atomic entity, $R^{51}$ and $R^{52}$ may be taken together to form an acidic nucleus of a coloring matter, and W represents an oxygen atom or a sulfur atom.

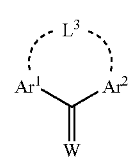

(ii)

In the formula (ii), $Ar^1$ and $Ar^2$ each independently represent an aryl group, and are connected via a bond by $-L^3-$, wherein $L^3$ represents —O— or —S—. W is as defined in the formula (i).

(iii)

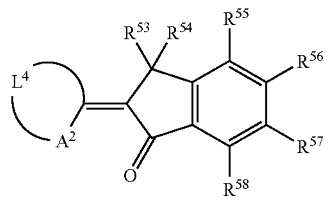

In the formula (iii), $A^2$ represents a sulfur atom or $N^{59}$, $L^4$ is taken together with adjacent $A^2$ and a carbon atom to represent a non-metal atomic entity forming a basic nucleus of a coloring matter, $R^{53}$, $R^{54}$, $R^{55}$, $R^{56}$, $R^{57}$ and $R^{58}$ each independently represent a monovalent non-metal atomic entity, and $R^{59}$ represents an alkyl group or an aryl group.

(iv)

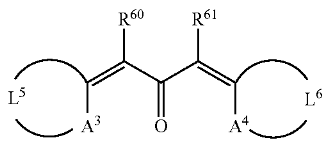

In the formula (iv), $A^3$ and $A^4$ each independently represent —S— or —$NR^{62}$— or —$NR^{63}$—, $R^{63}$ and $R^{64}$ each independently represent a substituted or unsubstituted alkyl group, or a substituted or unsubstituted aryl group, $L^5$ and $L^6$ each independently are taken together with adjacent $A^3$ and $A^4$ and an adjacent carbon atom to represent a non-metal atomic entity forming a basic nucleus of a coloring matter, and $R^{60}$ and $R^{61}$ each independently are a monovalent non-metal atomic entity, or may be taken together to form an aliphatic or aromatic ring.

In addition, examples of a preferable sensitizing dyematter, which can be contained in the curable composition of the invention, include at least one kind selected from compounds represented by the following formulas (VI) to (VIII), in addition to the (e) sensitizing dye. These may be used alone, or two or more kind may be used in combination.

(VI)

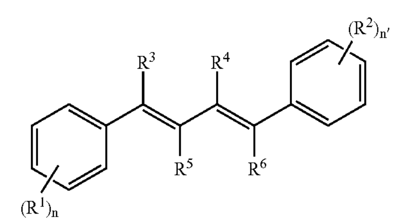

(VII)

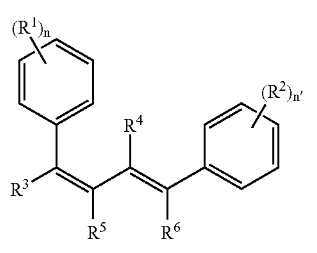

In the formula (VI) or the formula (VII), $R^1$ and $R^2$ each independently represent a monovalent substituent, $R^3$, $R^4$, $R^5$ and $R^6$ each independently represent a hydrogen atom or a monovalent substituent, n denotes an integer of 0 to 5, and n' denotes an integer of 0 to 5, provided that n and n' do not represent 0 at the same time. When n is 2 or more, plural $R^1$s may be the same or different. When n' is 2 or more, plural $R^2$s may be the same or different.

The compound represented by the formula (VI) is preferably the compound represented by the following formula (VI-1) from a viewpoint of a sensitivity, and the coloring property when a pigment is contained.

(VI-1)

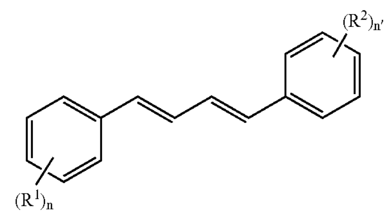

In the formula (VI-1), $R^1$ and $R^2$ each independently represent a monovalent substituent, n denotes an integer of 0 to 5, and n' denotes an integer of 1 to 5 When n is 2 or more, plural $R^1$s may be the same or different and, when n' is 2 or more, plural $R^2$s may be the same or different.

In the formula (VI-1), the monovalent substituent represented by $R^1$ and $R^2$ has the same meaning as that of the monovalent substituent represented by $R^1$ and $R^2$ in the formula (VI), and a preferable range is similar.

The compound represented by the formula (VI) or the formula (VII) has a molar extinction coefficient ε at a wavelength 365 nm of preferably 500 $mol^{-1}\cdot L\cdot cm^{-1}$ or more, ε at a wavelength 365 nm of more preferably 3000 $mol^{-1}\cdot L\cdot cm^{-1}$ or more, ε at a wavelength 365 nm of most preferably 20000 $mol^{-1}\cdot L\cdot cm^{-1}$ or more. When a value of a molar extinction coefficient ε at each wavelength is in the above range, the effect of improving a sensitivity is high, being preferable from a viewpoint of the light absorption efficiency.

Herein, a molar extinction coefficient ε is obtained by using, as a sample, a coloring matter solution prepared to a concentration of 0.01 g/l in a 1-methoxy-2-propanol solution, measuring a transmission spectrum of the sample at 365 nm, and obtaining an absorbance from a UV-visible absorption spectrum of the sample. As the measurement apparatus, UW-Vis-MR Spectrophotometer Cary5G-type spectrophotometer manufactured by Varian was used.

Preferable examples of the compound represented by the formula (VI) or the formula (VII) are shown below, however the sensitizer used in the curable composition of the invention is not restricted to them.

In the present specification, a chemical formula is described by a simplified structural formula in some cases and, particularly, a solid line not expressly showing an element or a substituent represents a hydrocarbon group. In the following examples, Me represents a methyl group, Et represents an ethyl groups fu represents a butyl group, n-Bu represents a n-butyl group, and Ph represents a phenyl group.

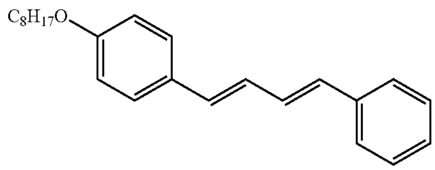
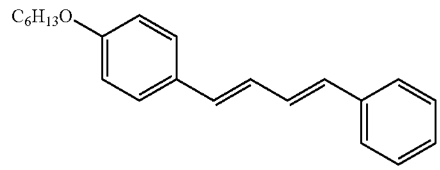
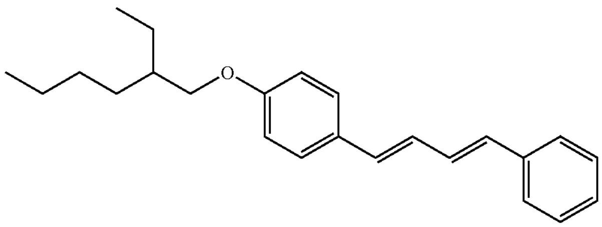
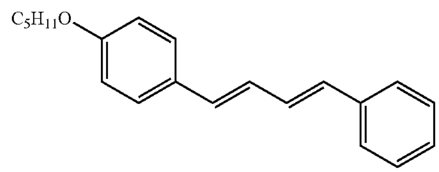
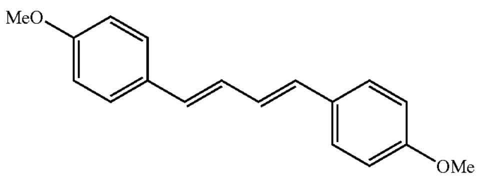
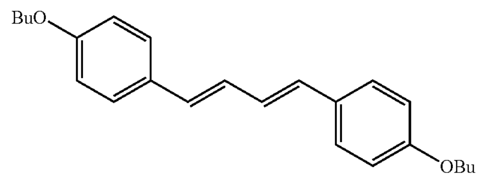
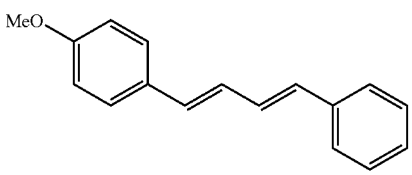
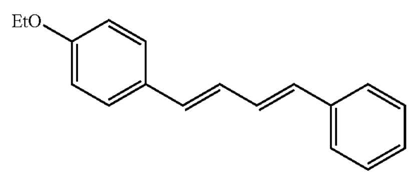
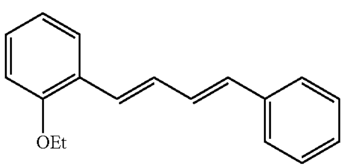
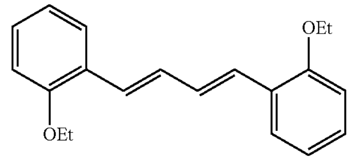
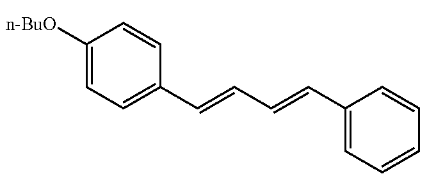
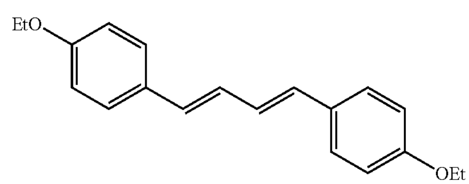
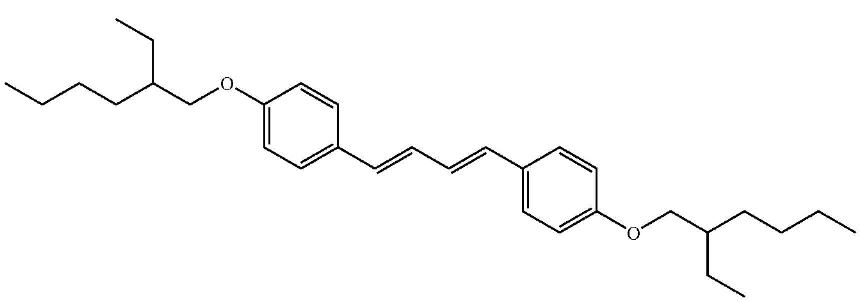
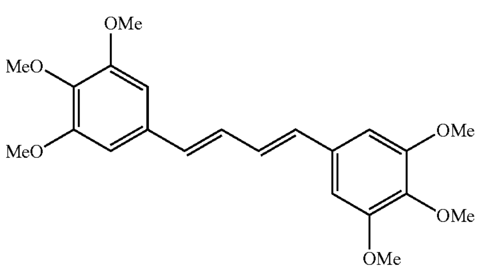
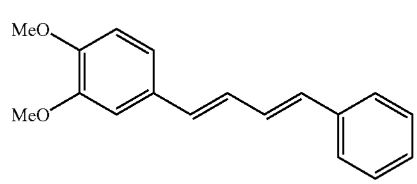

-continued
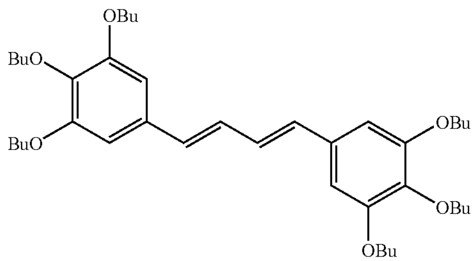
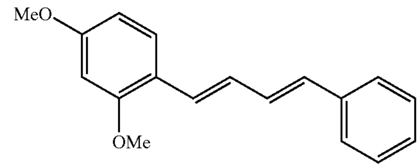
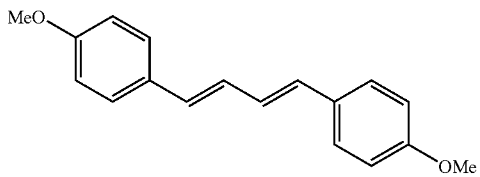
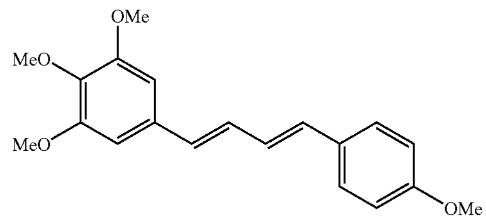
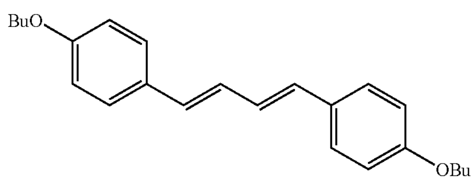
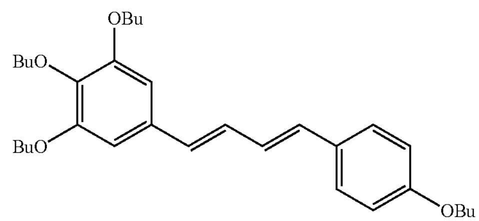
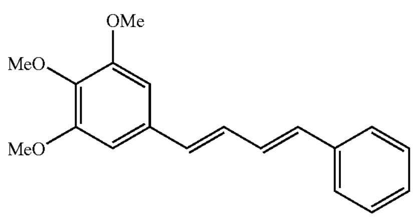
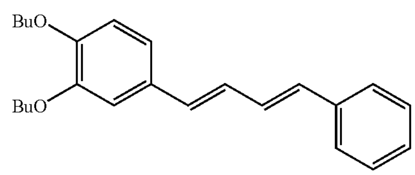
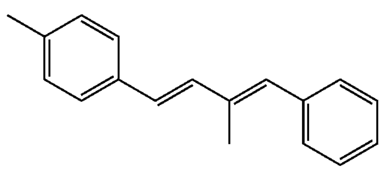
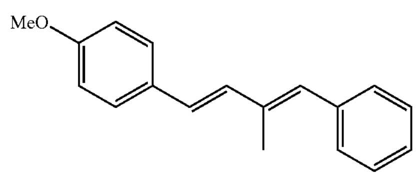
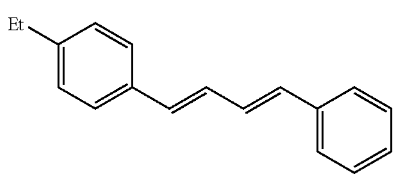
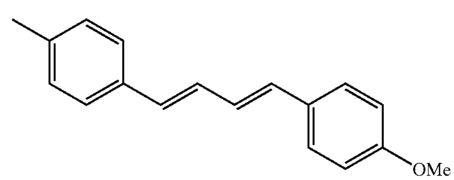
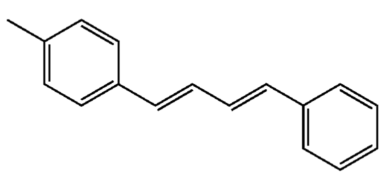
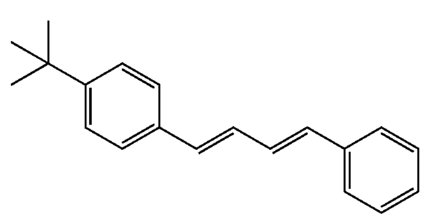
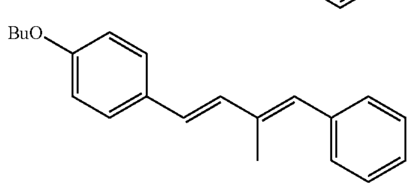
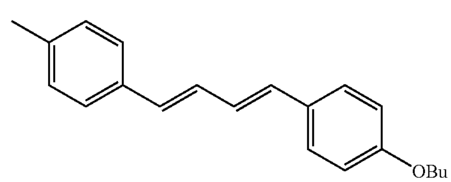

-continued
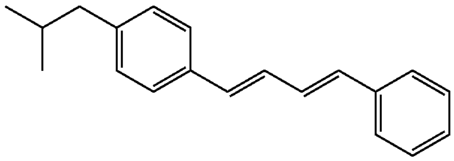
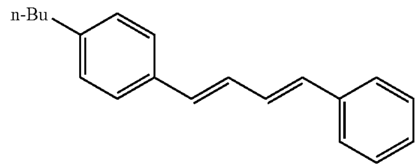
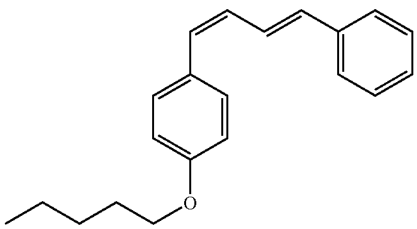
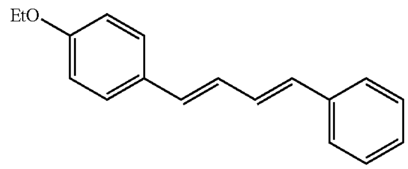
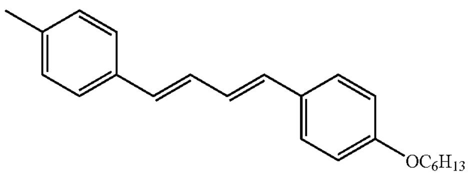
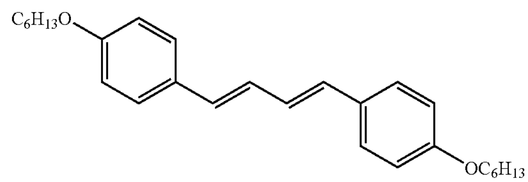
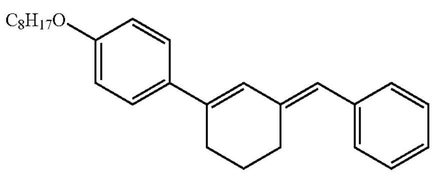
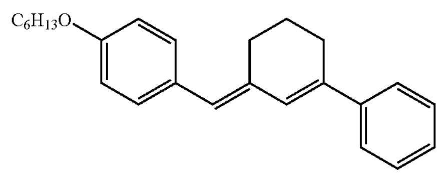
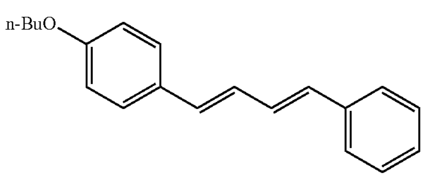
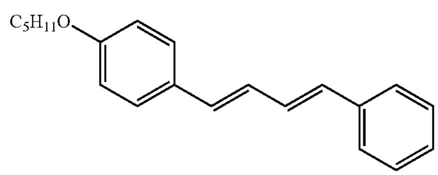
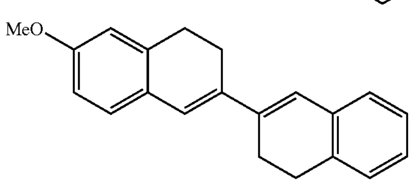
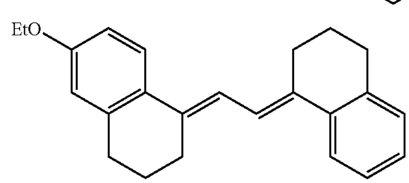
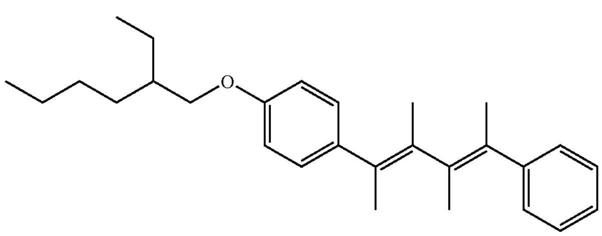
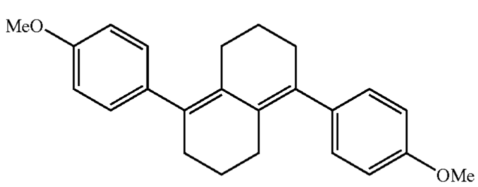
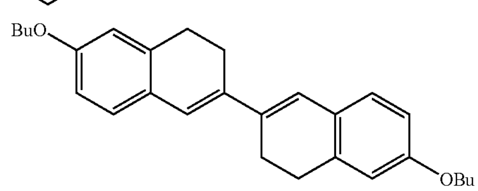

-continued
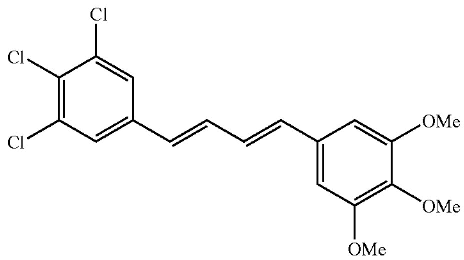
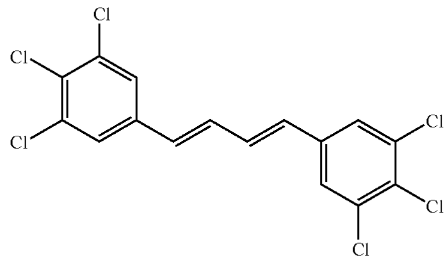
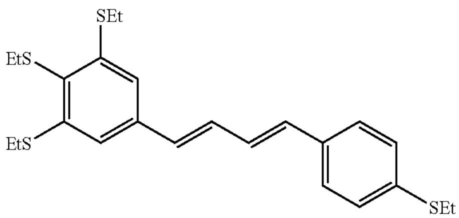
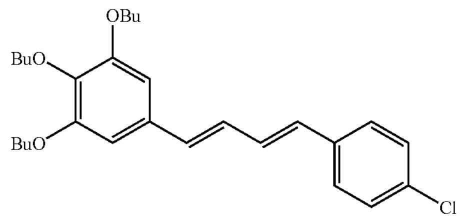
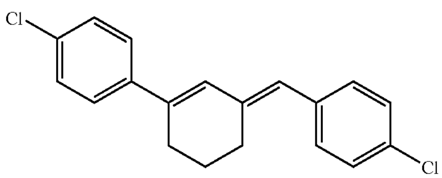
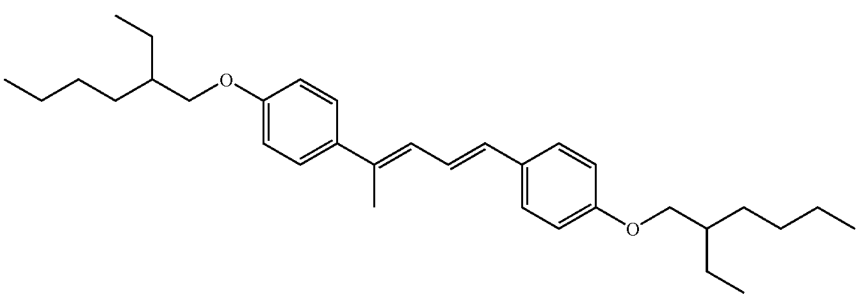
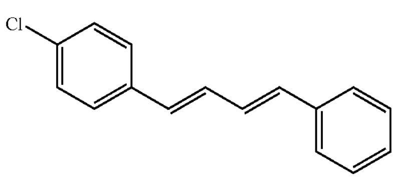
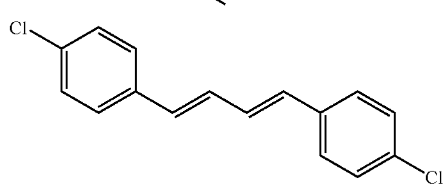
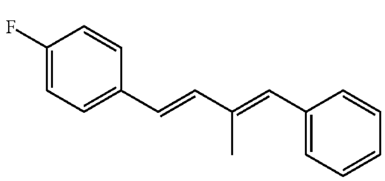
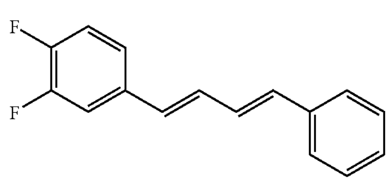
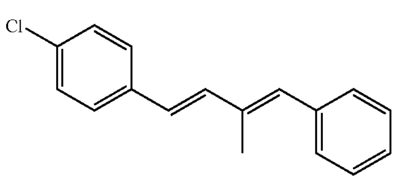
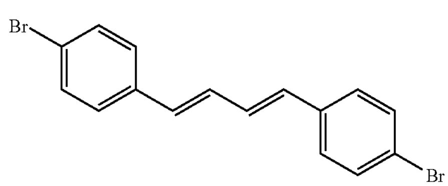
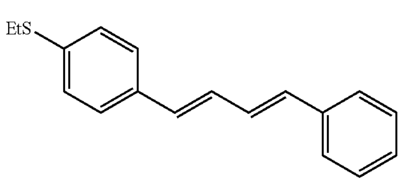
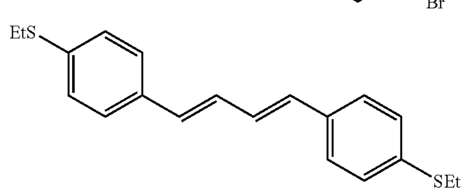

-continued
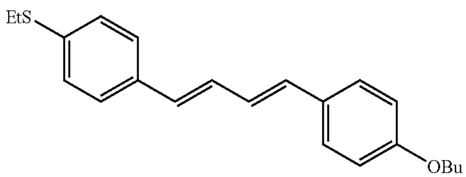
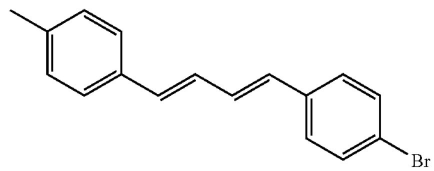
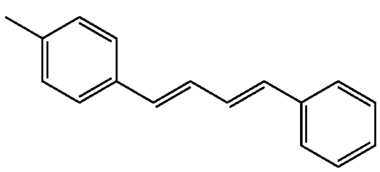
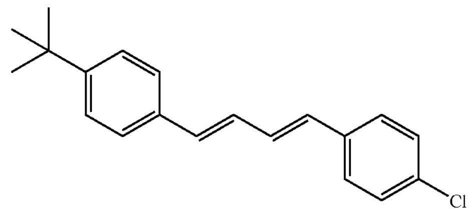
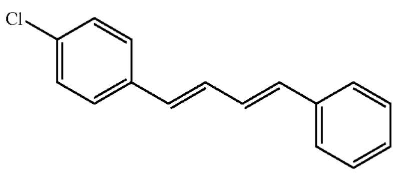
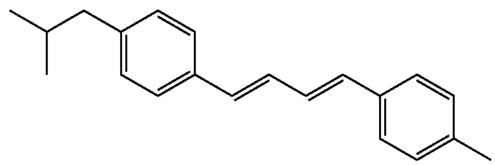
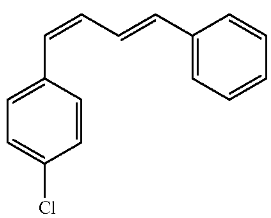
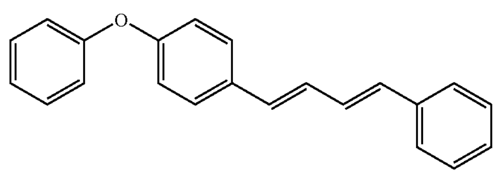
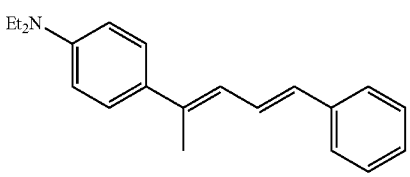
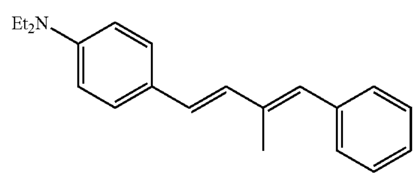
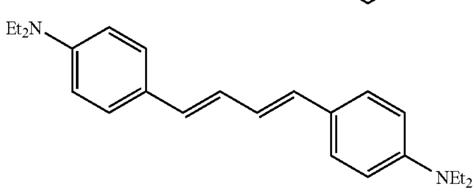
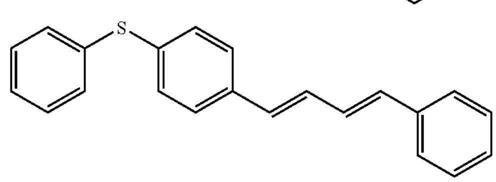
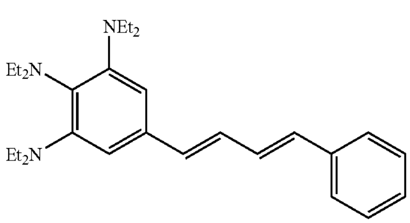
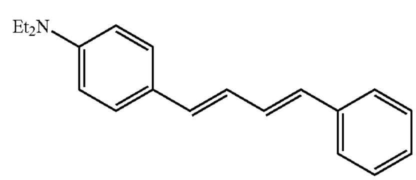
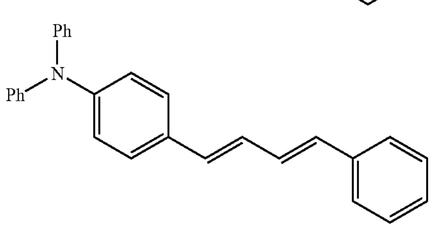
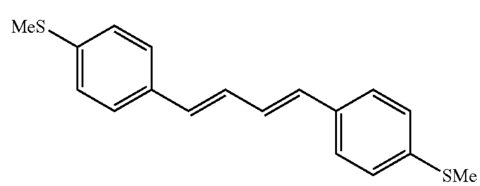

-continued
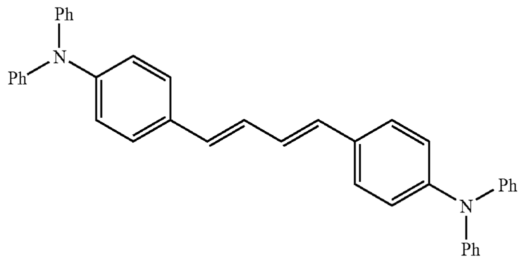
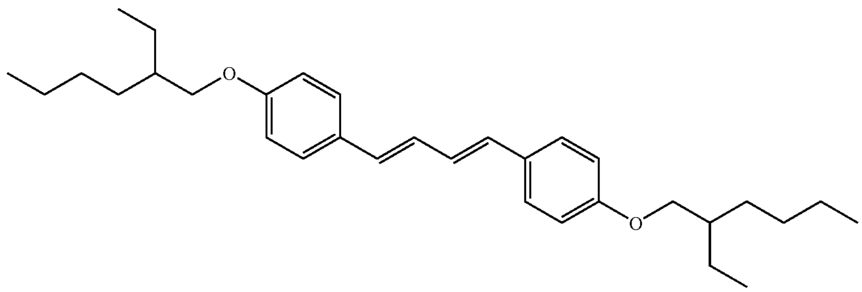
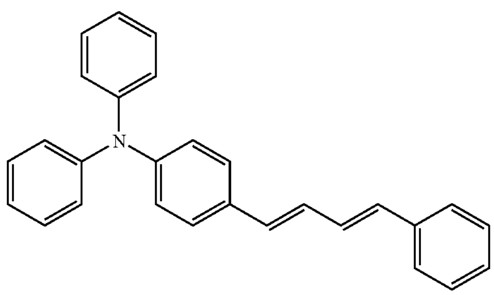
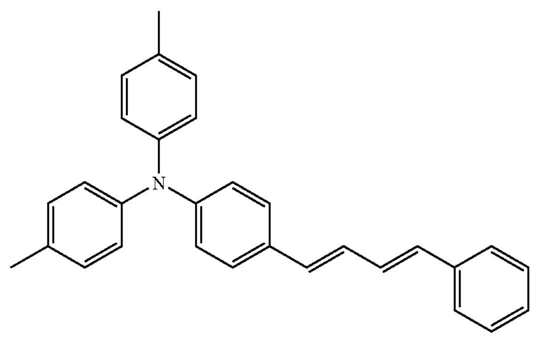
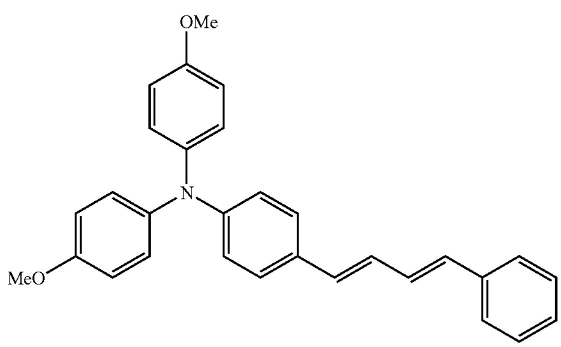
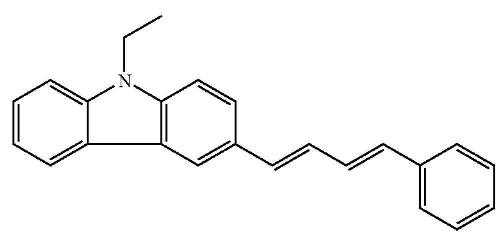
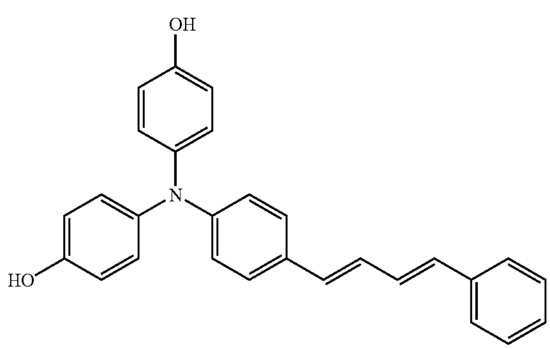
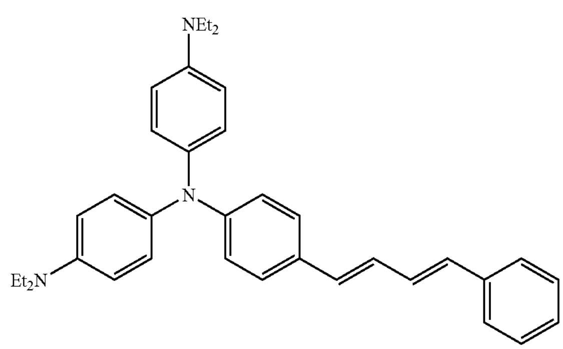

-continued
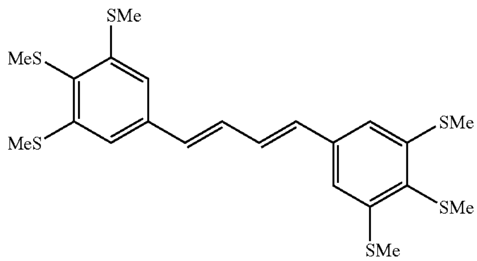
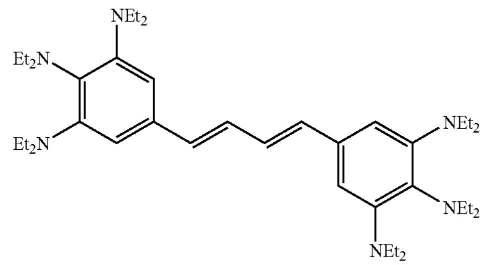
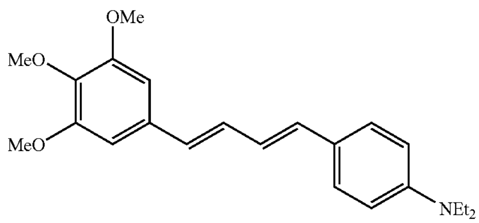
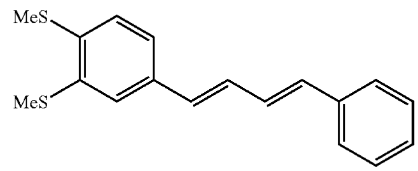
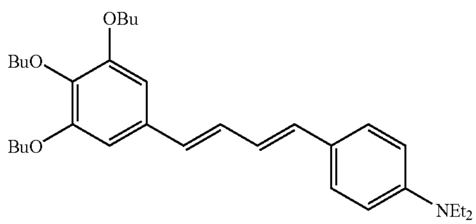
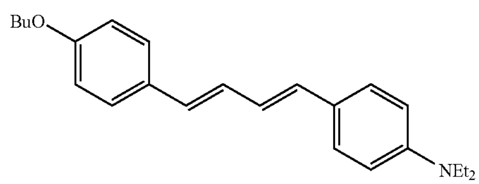
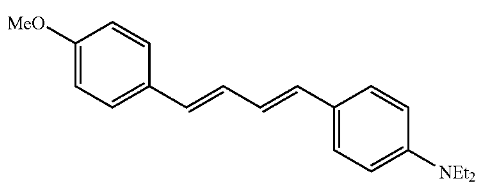
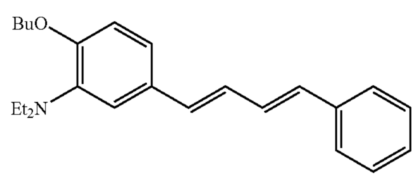
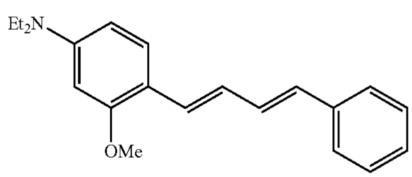
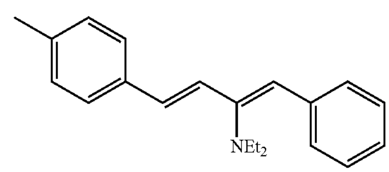
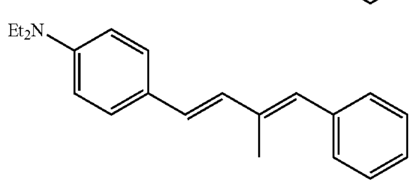
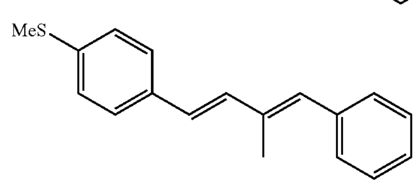
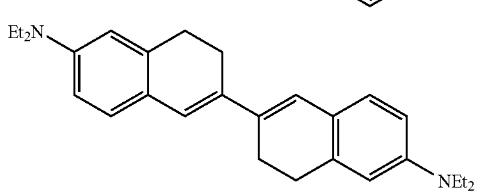
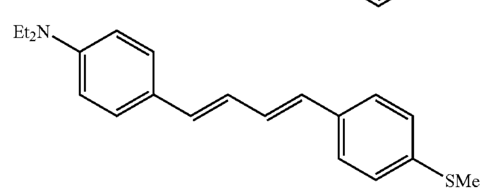
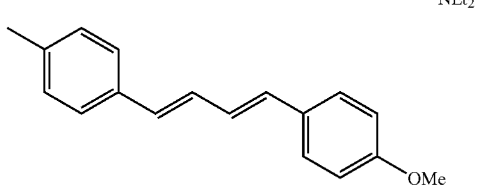
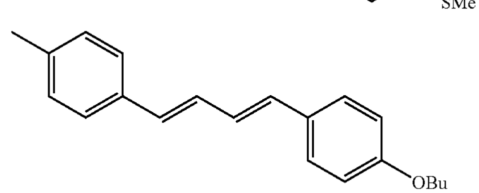

-continued

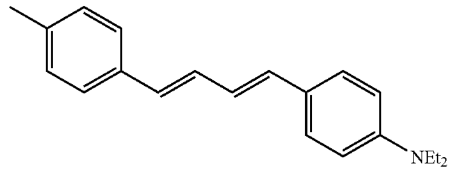

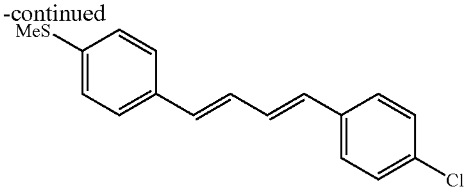

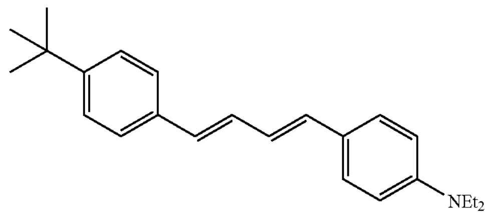

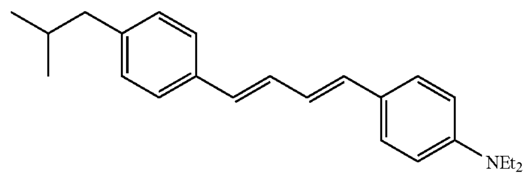

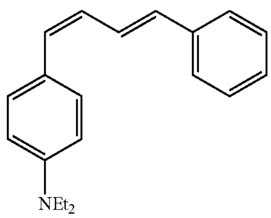

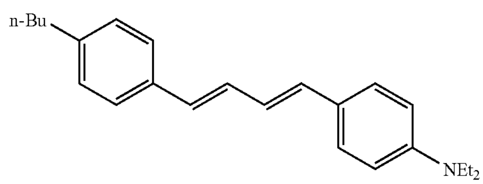

(VIII)

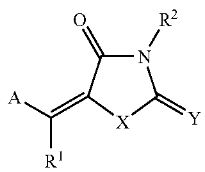

In the formula (VIII), A represents an aromatic ring or a heterocycle optionally having a substituent, X represents an oxygen atom, a sulfur atom, or —N($R^3$)—, and Y represents an oxygen atom, a sulfur atom, or —N($R^3$)—. $R^1$, $R^2$, and $R^3$ each independently represent a hydrogen atom or a monovalent non-metal atomic entity, and A, $R^1$, $R^2$ and $R^3$ may be taken together to form an aliphatic or aromatic ring.

In the formula (VIII), when $R^1$, $R^2$ and $R^3$ represent a monovalent non-metal atom, a substituted or unsubstituted alkyl group, a substituted or unsubstituted aryl group, a substituted or unsubstituted alkenyl group, or a substituted or unsubstituted aromatic heterocycle residue, a substituted or unsubstituted alkoxy group, a substituted or unsubstituted alkylthio group, a hydroxy group, or a halogen atom is preferable.

From a viewpoint of improvement in a degradation efficiency of the photopolymerization initiator, in the compound represented by the formula (VIII), Y is preferably an oxygen atom, or —N($R^3$)—. $R^3$s each independently represent a hydrogen atom or a monovalent non-metal atomic entity. Further, Y is most preferably —N($R^3$)—;

Preferable examples (VIII-1) to (VIII-124) of the compound represented by the formula (VIII) are shown below, however the sensitizer used in the curable composition of the invention is not restricted to them. In addition, isomers due to a double bond connecting an acidic nucleus and a basic nucleus are not clear, and the invention is not restricted to any of isomers.

(VIII-1)

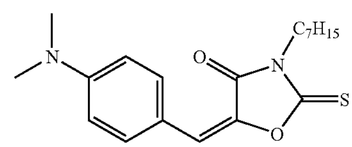

(VIII-2)

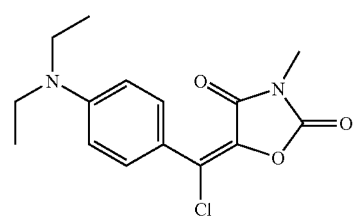

(VIII-3)

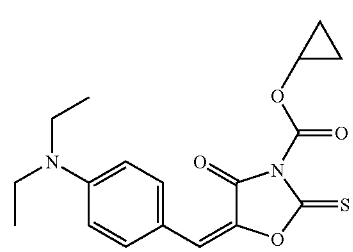

-continued
(VIII-4)
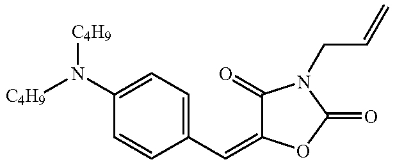
(VIII-5)
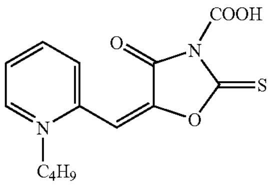
(VIII-6)
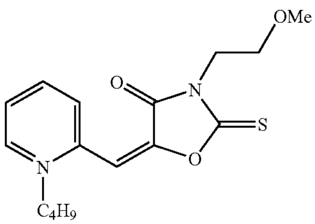
(VIII-7)
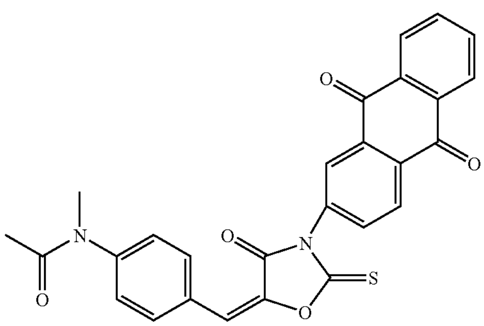
(VIII-8)
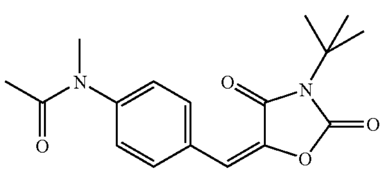
(VIII-9)
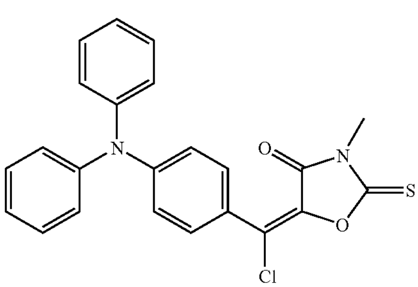
(VIII-10)
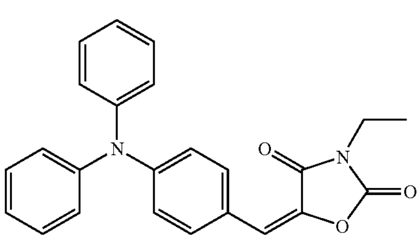
-continued
(VIII-11)
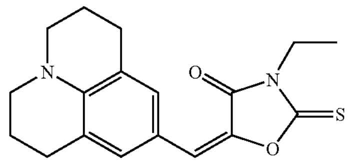
(VIII-12)
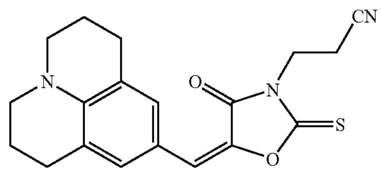
(VIII-13)
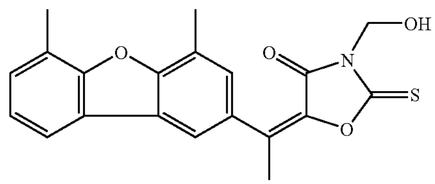
(VIII-14)
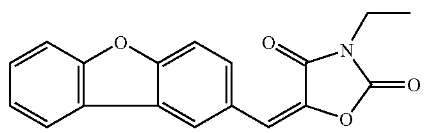
(VIII-15)
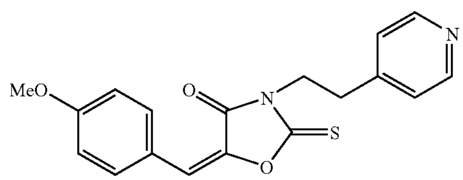
(VIII-16)
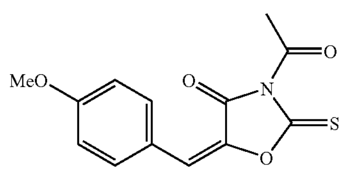
(VIII-17)
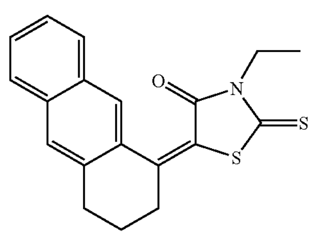
(VIII-18)
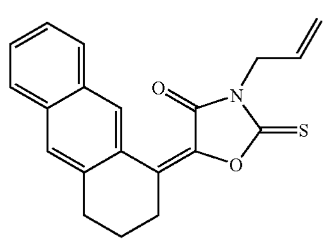

-continued
(VIII-19)
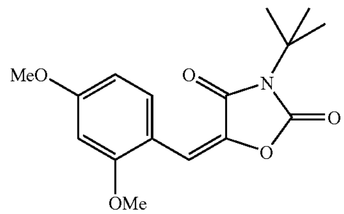
(VIII-20)
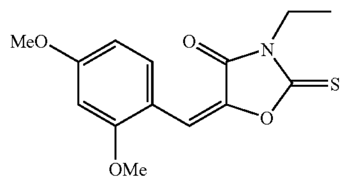
(VIII-21)
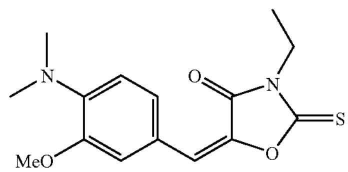
(VIII-22)
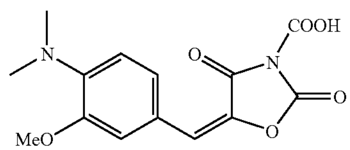
(VIII-23)
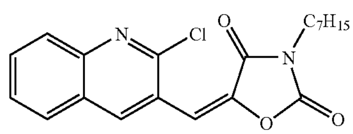
(VIII-24)
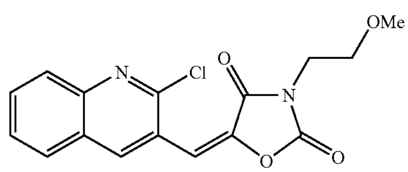
(VIII-25)
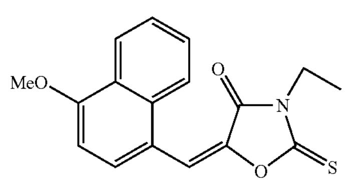
(VIII-26)
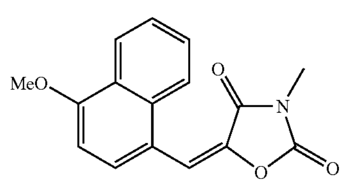
(VIII-27)
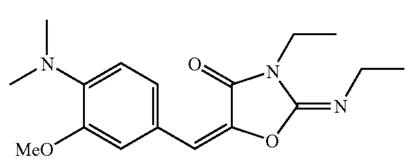
-continued
(VIII-28)
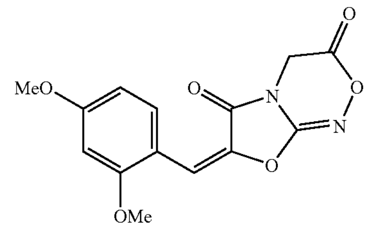
(VIII-29)
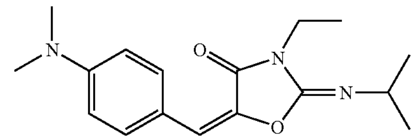
(VIII-30)
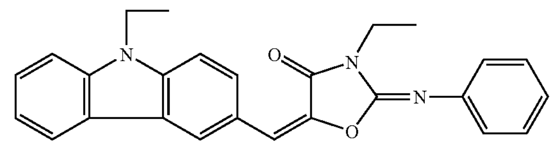
(VIII-31)
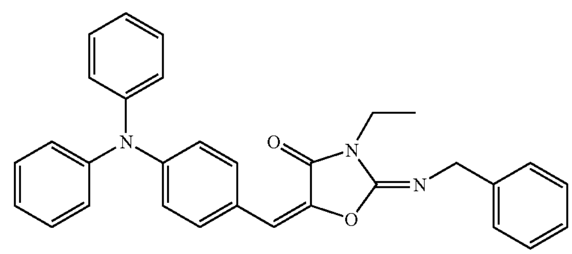
(VIII-32)
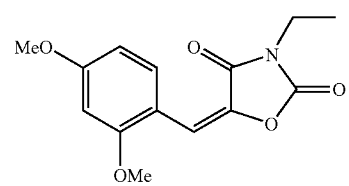
(VIII-33)
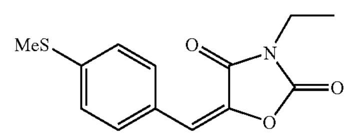
(VIII-34)
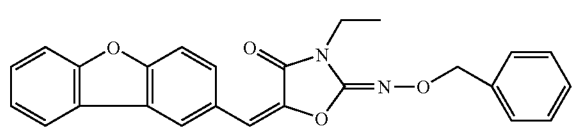
(VIII-35)
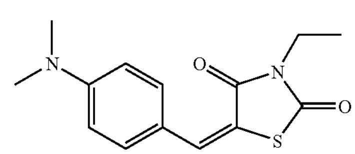
(VIII-36)
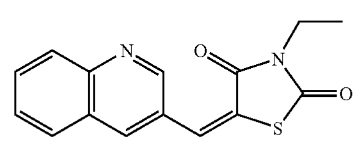

-continued
(VIII-37)
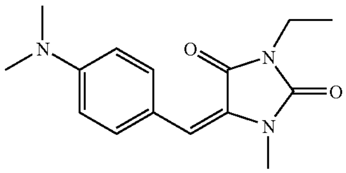
(VIII-38)
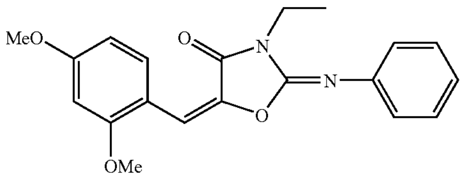
(VIII-39)
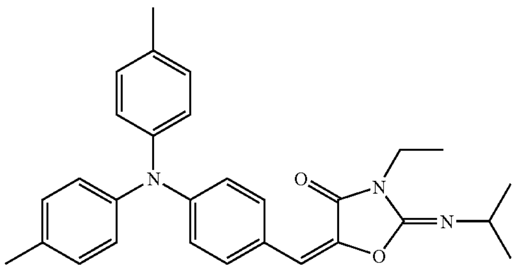
(VIII-40)
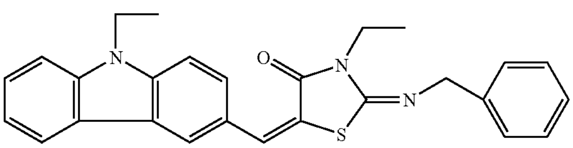
(VIII-41)
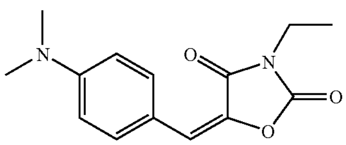
(VIII-42)
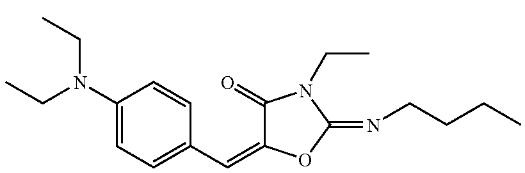
(VIII-43)
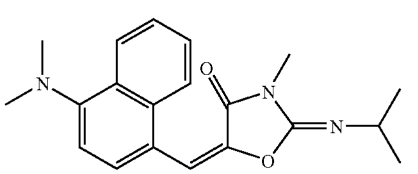
(VIII-44)
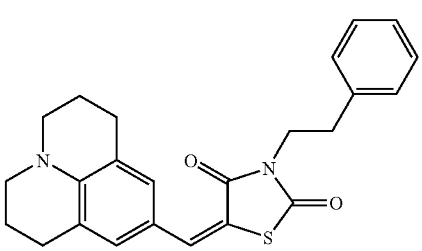
-continued
(VIII-45)
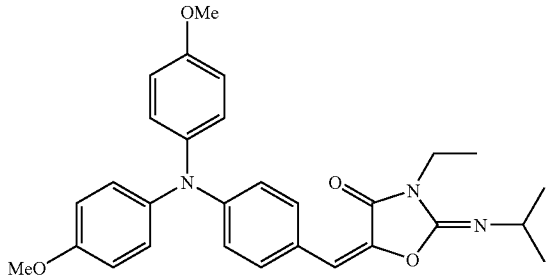
(VIII-46)
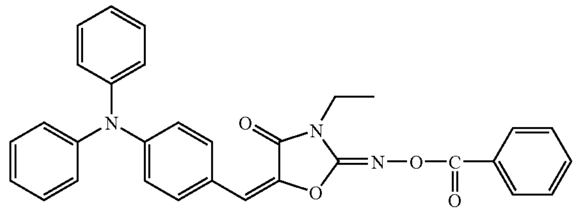
(VIII-47)
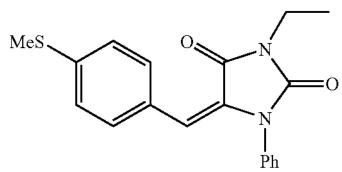
(VIII-48)
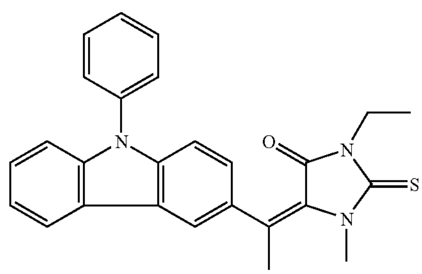
(VIII-49)
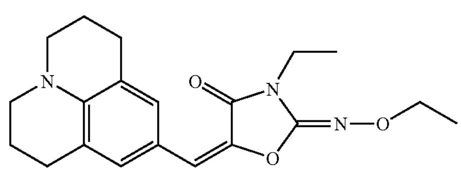
(VIII-50)
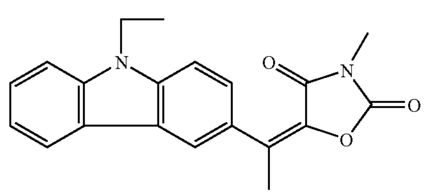
(VIII-51)
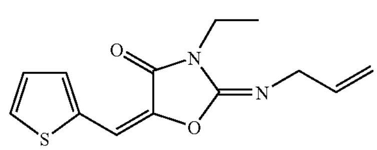

-continued
(VIII-52)
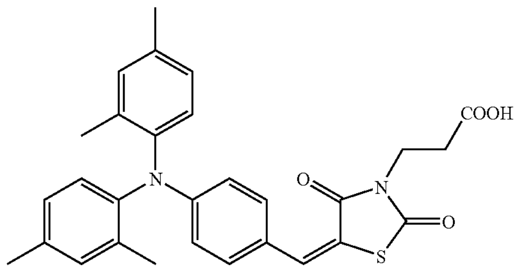
(VIII-53)
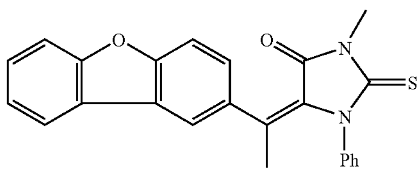
(VIII-54)
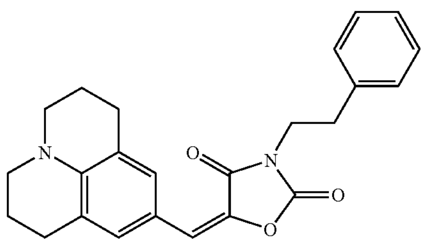
(VIII-55)
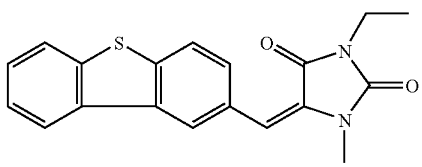
(VIII-56)
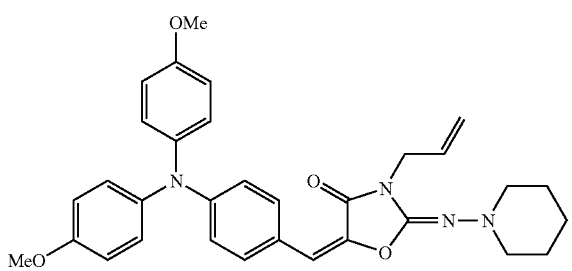
(VIII-57)
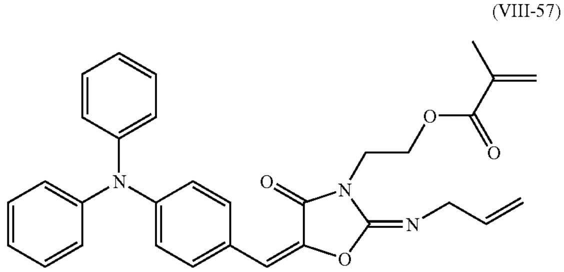
(VIII-58)
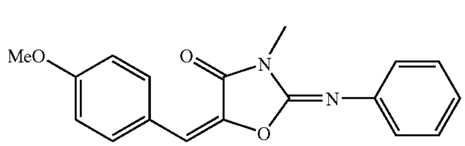
-continued
(VIII-59)
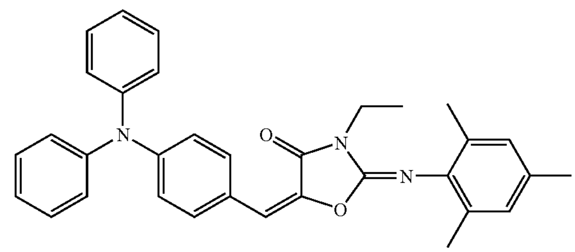
(VIII-60)
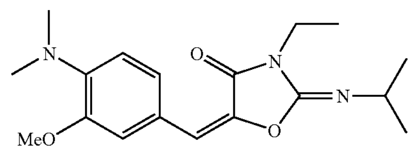
(VIII-61)
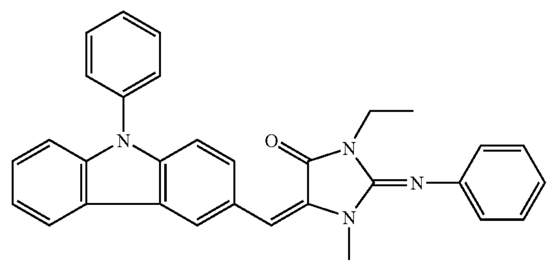
(VIII-62)
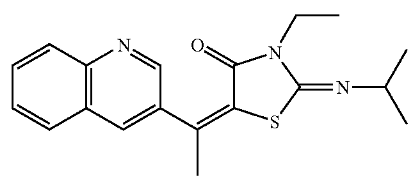
(VIII-63)
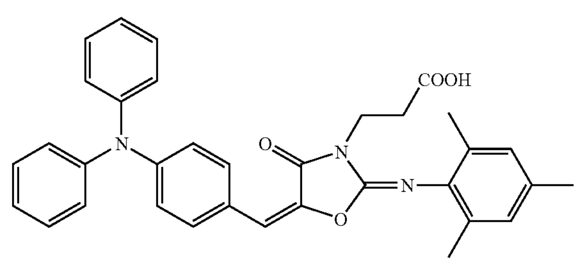
(VIII-64)
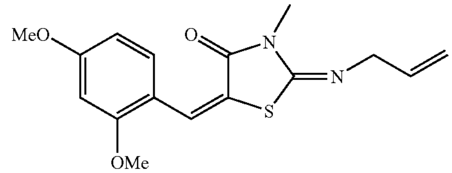
(VIII-65)
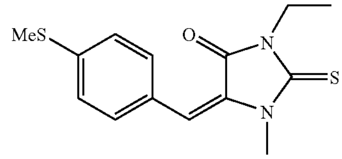

-continued
(VIII-66)
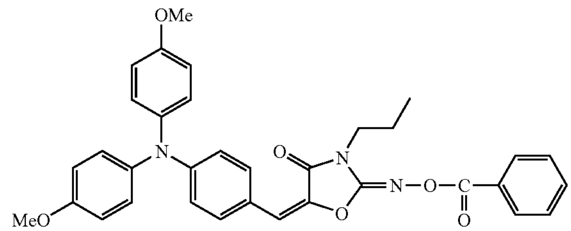
(VIII-67)
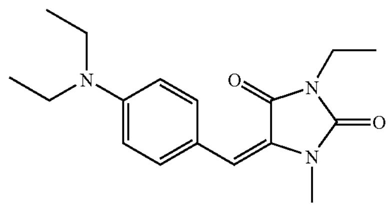
(VIII-68)
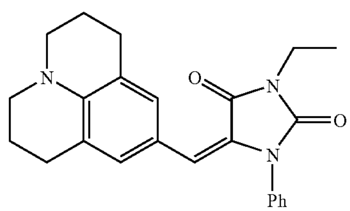
(VIII-69)
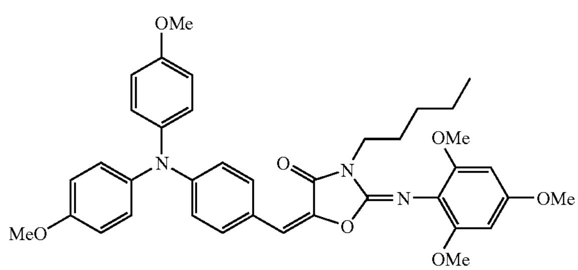
(VIII-70)
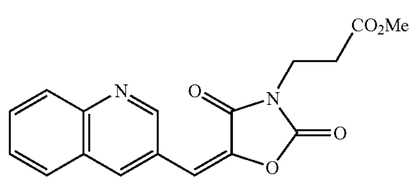
(VIII-71)
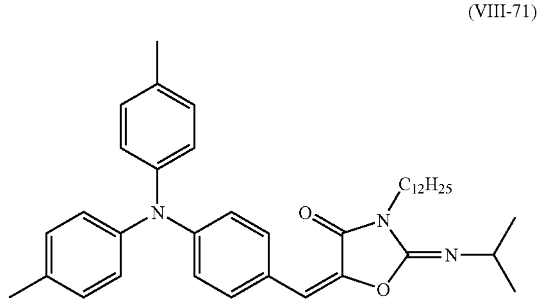
-continued
(VIII-72)
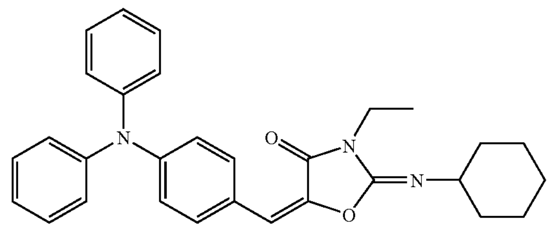
(VIII-73)
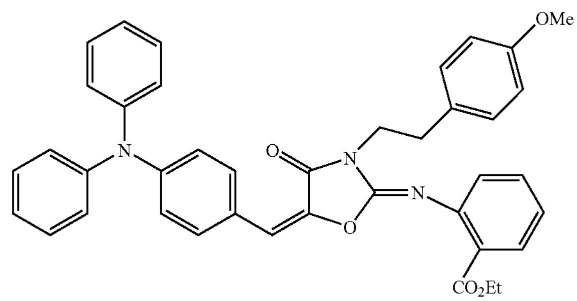
(VIII-74)
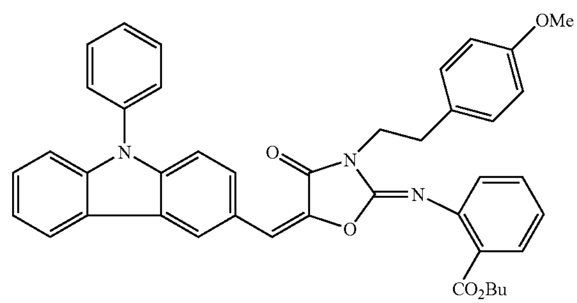
(VIII-75)
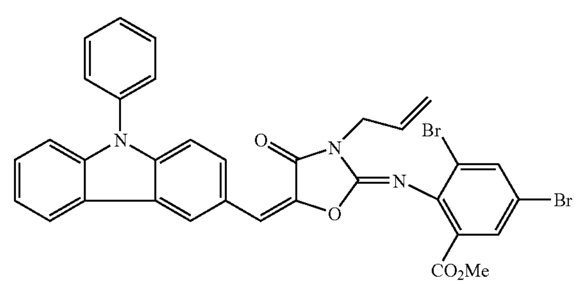
(VIII-76)
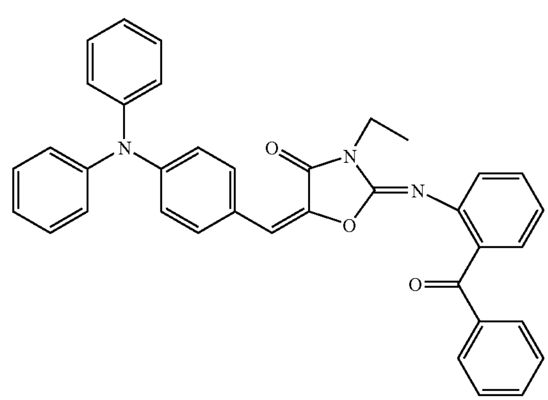

-continued
(VIII-77)
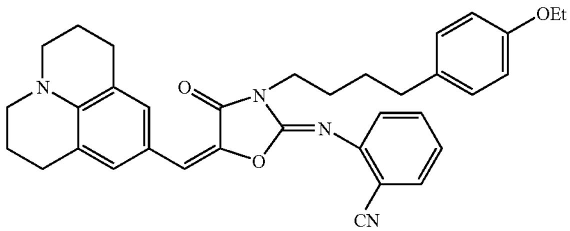
(VIII-78)
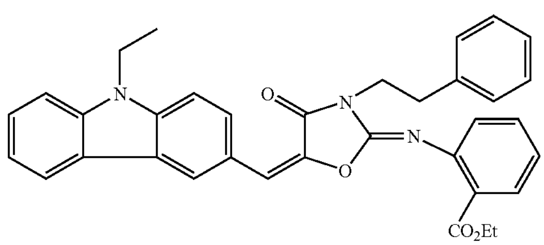
(VIII-79)
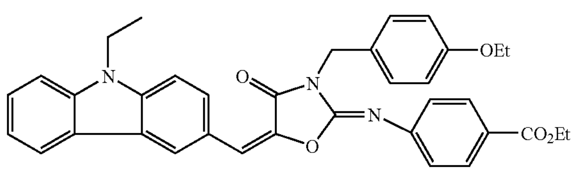
(VIII-80)
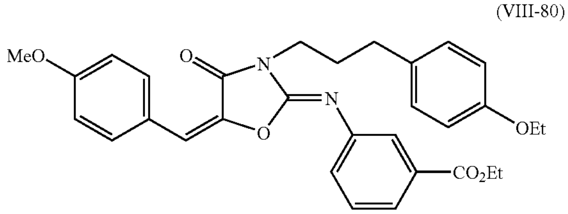
(VIII-81)
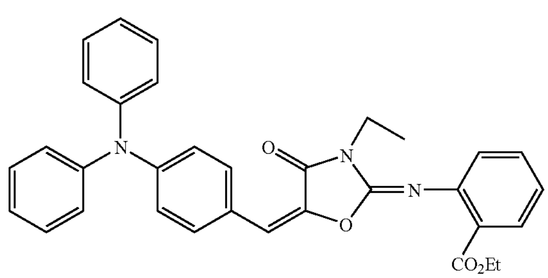
(VIII-82)
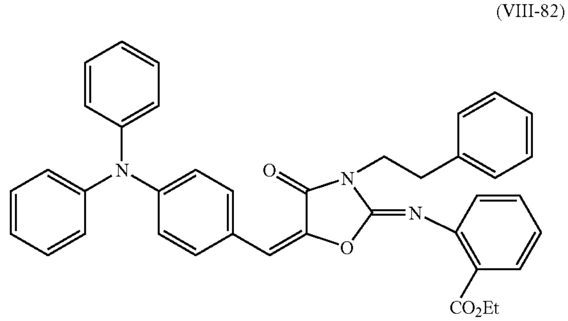
-continued
(VIII-83)
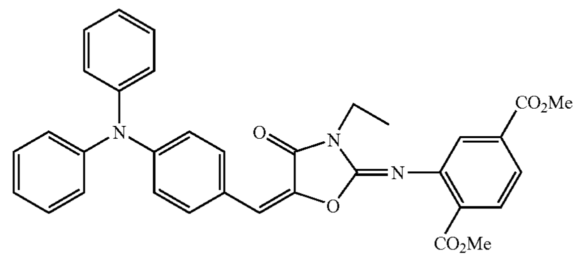
(VIII-84)
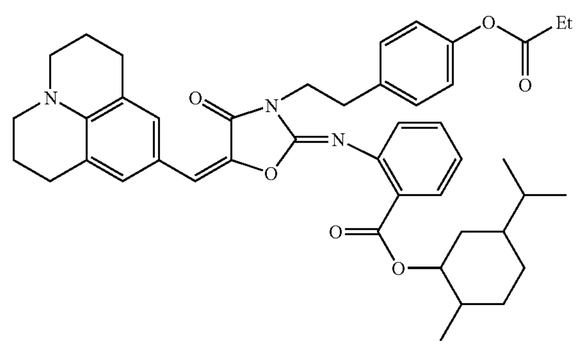
(VIII-85)
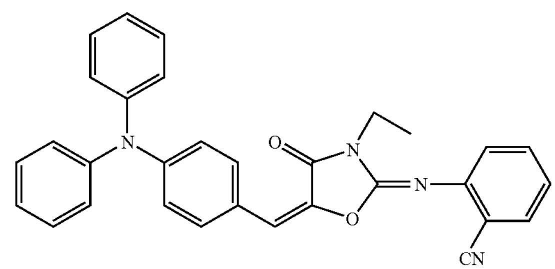
(VIII-86)
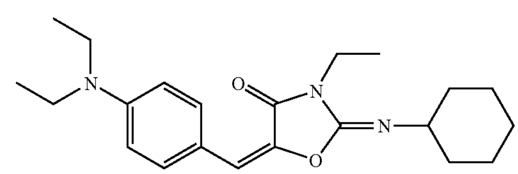
(VIII-87)
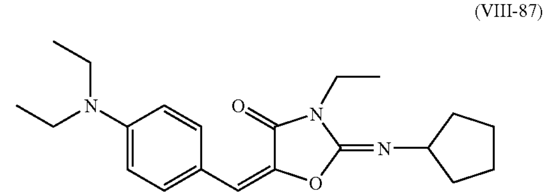
(VIII-88)
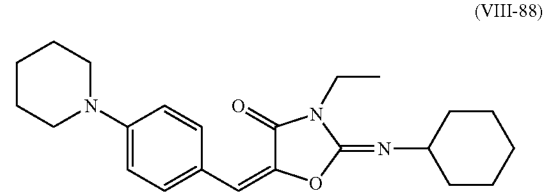

-continued
(VIII-89)
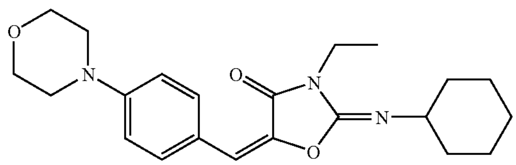
(VIII-90)
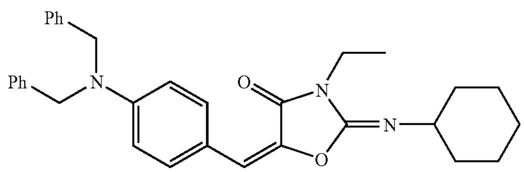
(VIII-91)
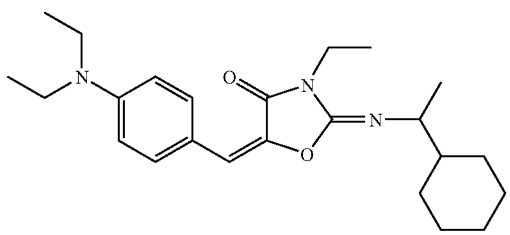
(VIII-92)
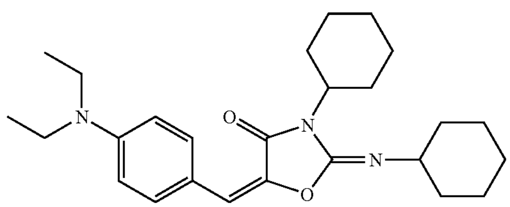
(VIII-93)
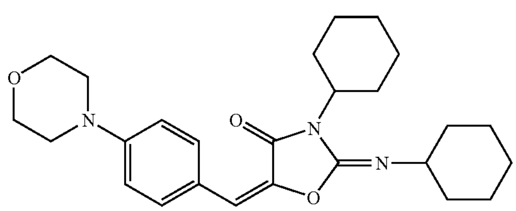
(VIII-94)
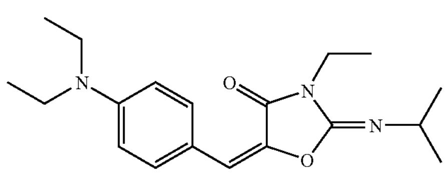
(VIII-95)
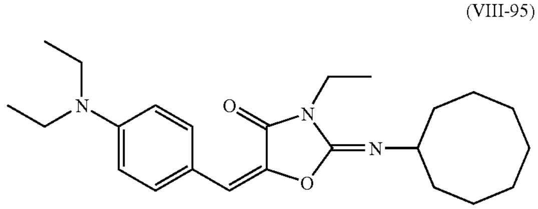
-continued
(VIII-96)
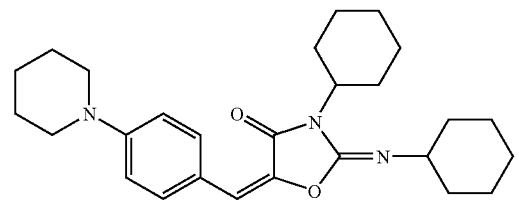
(VIII-97)
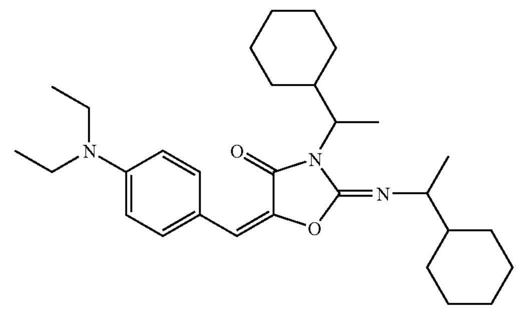
(VIII-98)
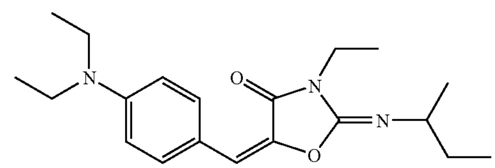
(VIII-99)
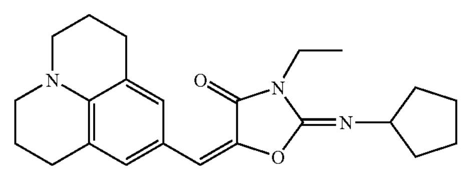
(VIII-100)
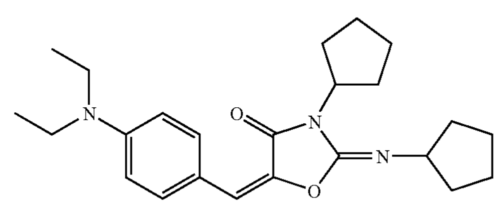
(VIII-101)
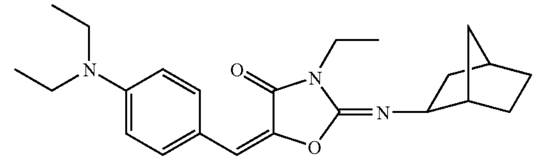
(VIII-102)
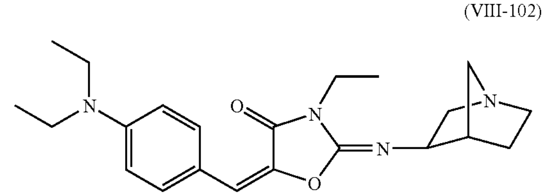

-continued
(VIII-103)
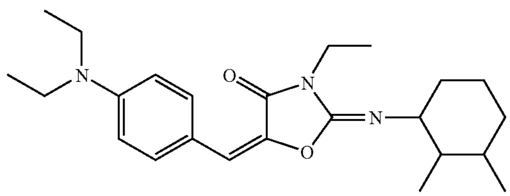
(VIII-104)
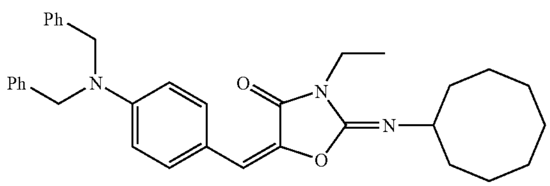
(VIII-105)
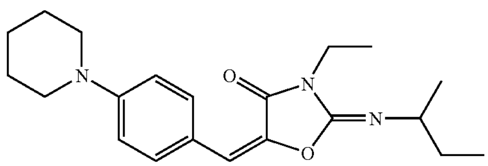
(VIII-106)
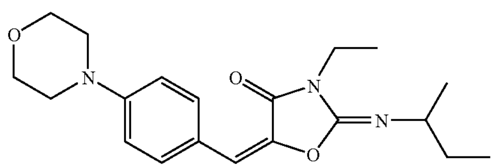
(VIII-107)
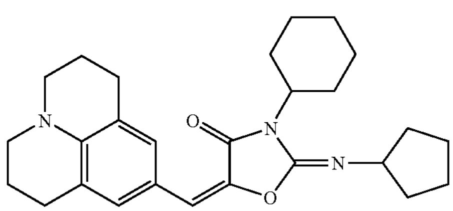
(VIII-108)
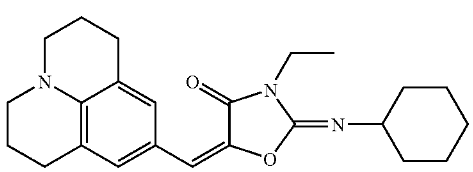
(VIII-109)
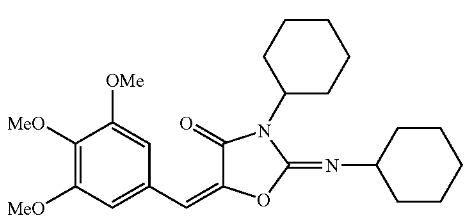
(VIII-110)
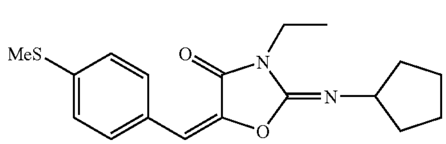
-continued
(VIII-111)
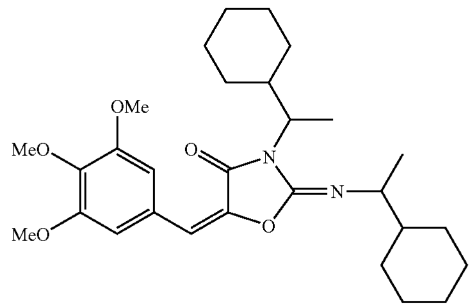
(VIII-112)
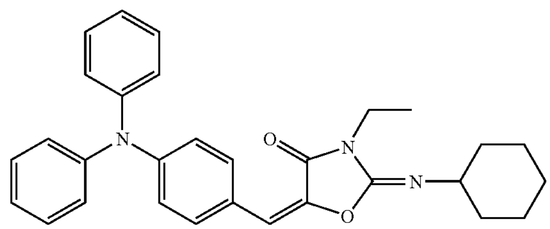
(VIII-113)
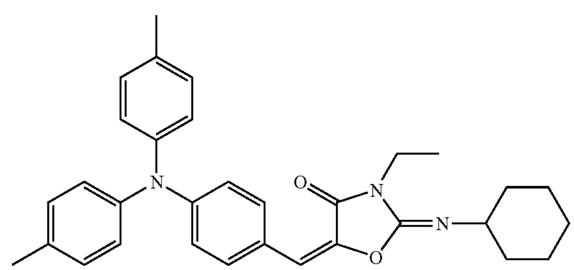
(VIII-114)
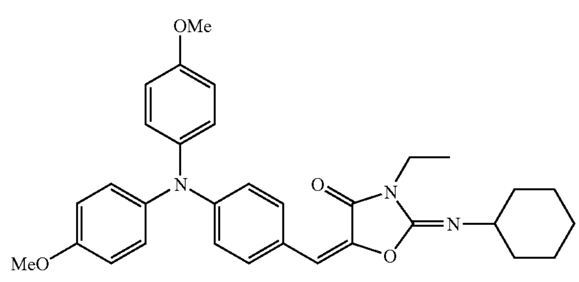
(VIII-115)
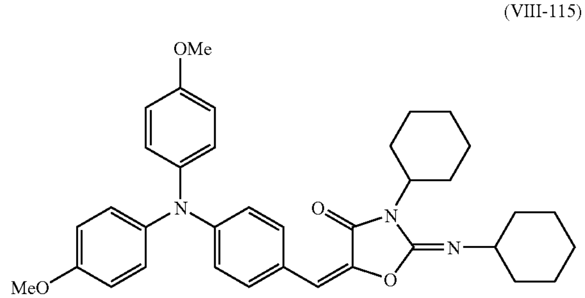

-continued (VIII-116)

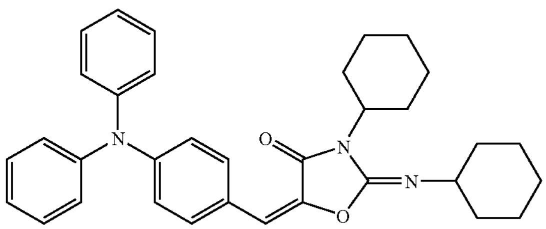

(VIII-117)

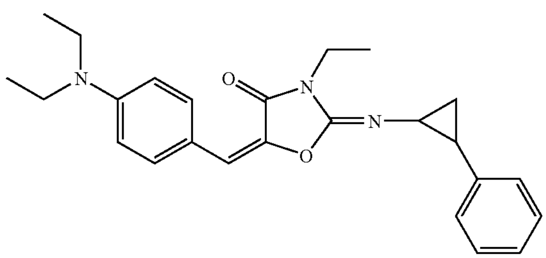

(VIII-118)

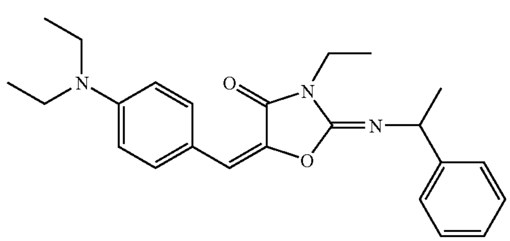

(VIII-119)

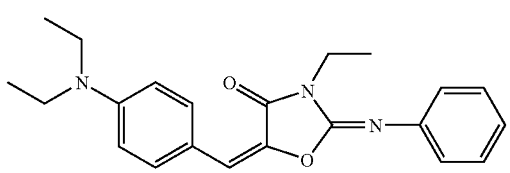

(VIII-120)

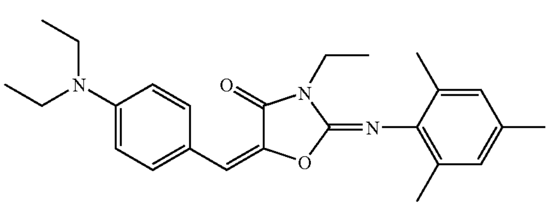

(VIII-121)

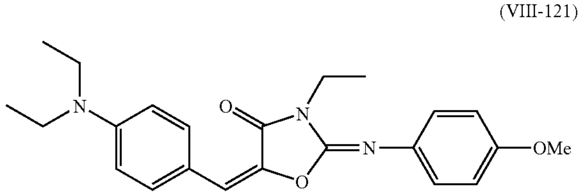

(VIII-122)

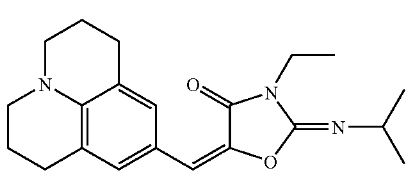

-continued (VIII-123)

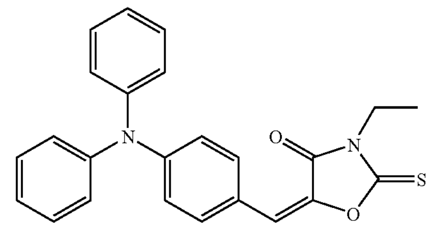

(VIII-124)

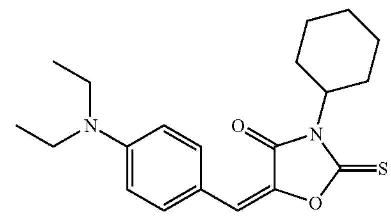

The compound represented by the formula (VI) according to the invention may be further chemically modified variously in order to modify the property of the curable composition.

For example, by binding the sensitizing dye and an addition-polymerization compound structure (e.g. acryloyl group or a methacryloyl group) by a method such as covalent binding, ionic binding, and hydrogen binding, a strength of an exposed film can be increased, and unnecessary precipitation of the sensitizing dye from a film after exposure can be suppressed.

In addition, by binding the sensitizing dye with a partial structure having the ability to generate a radical in the aforementioned photopolymerization initiator (e.g. reductive degradable site such as halogenated alkyl, onium, peroxide, and biimidazole, or an oxidative cleavable site such as borate, amine, trimethylsilylmethyl, carboxymethyl, carbonyl, and imine), particularly, photosensitivity in the low concentration state of an initiation system can be remarkably enhanced.

In the curable composition of the invention, compounds represented by the formulas (VI) to (VIII) may be used alone, or two or more kinds may be used in combination.

Compounds represented by the formulas (VI) to (VIII) remarkably exert the effect by adding them when a concentration of a pigment in the curable composition is very high, and a light transmittance of a formed colored pattern photosensitive layer) becomes extremely low, specifically, when a light transmittance at 365 nm of a photosensitive layer formed without addition of the sensitizing dye becomes 10% or lower. Particularly, among the formulas (VI) to (VIII), the compound represented by the formula (VIII) is most preferable and, specifically, compounds of (VIII 56) to (VIII 122) are most preferable.

Sensitizers may be used alone, or two or more kinds may used in combination. A content of the sensitizer in the curable composition of the invention is preferably 0.1% by mass to 20% by mass, more preferably 0.5% by mass to 15% by mass relative to a total solid content of the curable composition of the invention, from a viewpoint of the efficiency of light absorption into a deep part, and an initiation degradation efficiency.

<Cosensitizer>

It is also preferable that the curable composition of the invention contains a cosensitizer. In the invention, the cosensitizer has the action of further improving a sensitivity of the sensitizing dye and the initiator to active radiation, or suppressing inhibition of polymerization of the polymerizable compound due to oxygen.

Examples and other examples of such the cosensitizer include compounds described in the first aspect of the invention.

A content of these cosensitizers, from a viewpoint of improvement in a curing rate due to a balance between a polymerization growing rate and chain transfer, is preferably in a range of 0.1% by mass to 30% by mass, more preferably in a range of 0.5% by mass to 25% by mass, further preferably in a range of 1.0% by mass to 20% by mass relative to a mass of a total solid content of the curable composition.

In addition, it is preferable to further add a heat polymerization preventing agent in addition to the aforementioned sensitizer and cosensitizer. For example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and 2-mercaptobenzimidazole are useful.

<Coloring Agent>

When the curable composition of the invention contains a coloring agent, the coloring agent may be a dye or a pigment, and is preferably a coloring matter selected from a triallylmethane series, an anthraquinone series, an azomethine series, a benzylidene series, an oxonol series, a cyanine series, a phenothiazine series, a pyrolopyrazoleazomethine series, a xanthene series, a phthalocyanine series, a benzopyran series, an indigo series, a pyrazoleazo series, an anilinoazo series, a pyrazolotriazoleazo series, a pyridoneazo series, and an anthrapyridone series, and preferably a compound represented by the following formulas (III) to (V).

(III)

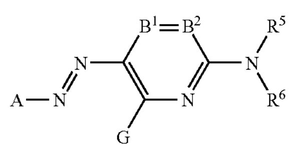

In the formula (III), A represents an aryl group, or a residue of a 5 to 6-membered aromatic heterocycle diazo component A-$NH_2$. $B^1$ and $B^2$ each independently represent —$CR^3$═, —$CR^4$═, or a nitrogen atom, provided that $B^1$ and $B^2$ do not represent a nitrogen atom at the same time. $R^5$ and $R^6$ each independently represent a hydrogen atom or a substituent. G, $R^3$ and $R^4$ each independently represent a hydrogen atom or a substituent. $R^3$ and $R^4$, and/or $R^5$ and $R^6$ may be bond to each other to for a 5-membered or 6-membered ring.

(IV)

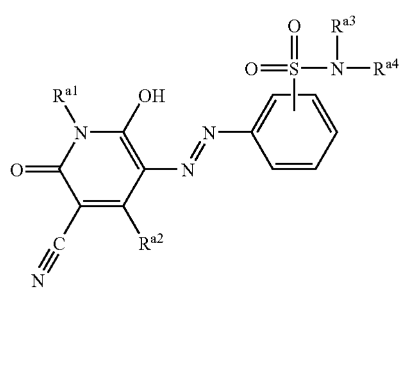

In the formula (IV), $R^{a1}$, $R^{a3}$ and $R^{a4}$ each independently represent a hydrogen atom, an alkyl group of a carbon number 1 to 21, an alkenyl group of a carbon number of 2 to 21, an aryl group of a carbon number of 6 to 21, or an aralkyl group of a carbon number of 7 to 21. Alternatively, $R^{a1}$ and $R^{a4}$ may be taken together with a nitrogen atom to which they bind, to form a heterocycle. $R^{a2}$ represents an alkyl group of a carbon number of 1 to 10, a methoxymethyl group, or a trifluoromethyl group.

(V)

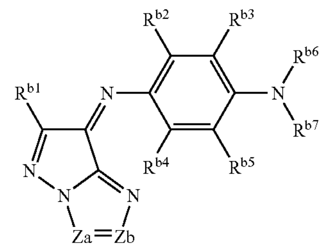

In the formula (V), $R^{b1}$ represents a hydrogen atom or a substituent, $R^{b2}$ to $R^{b5}$ each independently represent a hydrogen atom or a substituent, $R^{b6}$ and $R^{b7}$ each independently represent an alkyl group, an alkenyl group, or an aryl group, and Za and Zb each independently represent —N═, or —C($R^{b8}$)═. $R^{b8}$ represents a hydrogen atom, an alkyl group, an aryl group, or a heterocycle group. $R^{b2}$ and $R^{b3}$, $R^{b3}$ and $R^{b6}$, $R^{b4}$ and $R^{b5}$, $R^{b5}$ and $R^{b7}$ and/or $R^{b6}$ and $R^{b7}$ may be taken together to each independently form a 5-membered, 6-membered, or 7-membered ring.

Examples of the coloring agent represented by the formula (III) include coloring agents (coloring matter, dye) described in JP-A No. 2005-99677, JP-A No. 2005-250224, JP-A No. 2006-39301, JP-A No. 2006-58701, JP-A No. 2006-91190, JP-A No. 2006-243040, and JP-A No. 2006-243173, examples of the coloring agent represented by the formula (IV) include coloring agents (coloring matter, dye) described in JP-A No. 2006-124634, and examples of the coloring agent represented by the formula (V) include coloring agents (coloring matter, dye) described in JP-A No. 2006-58700, and JP-A No. 2006-72135, however the coloring agent used in the curable composition of the invention is not restricted to them.

—Dye—

When the curable composition of the invention contains a dye as the coloring agent, the known dyes can be used. For example, coloring agents described in JP-A No. 64-90403, JP-A No. 64-91102, JP-A No. 1-94301, JP-A No. 6-11614, Japanese Patent No. 2592207, U.S. Pat. No. 4,808,501, U.S. Pat. No. 5,667,920, U.S. Pat. No. 5,059,500, JP-A No. 5-333207, JP-A No. 6-35183, JP-A No. 6-51115, and JP-A No. 6-194828 an be used.

As a chemical structure, the aforementioned triallylmethane series, anthraquinone series, azomethine series, benzylidene series, oxonol series, cyanine series, phenothiazine series, pyrrolopyrazoleazomethine series, xanthene series, phthalocyanine series, benzopyran series, indigo series, pyrazoleazo series, anilinoazo series, pyrazolotriazoleazo series, pyridoneazo series, and anthrapyridone series dyes are preferable, and the triphenylmethane series, anthraquinone series, phthalocyanine series, benzylidene series, oxonol series, cyanine series, phenothiazine series, pyrrolopyrazoleazomethine series, xanthene series, phthalocyanine series, benzopyran series, and indigo series dyes are more preferable, and the pyrazoleazo series, anilinoazo series, pyrazolotriazoleazo series, phthalocyanine series, pyridoneazo series, and anthrapyridone series dyes are particularly preferable. As dye classification, an acid dye, direct dye, basic dye, mordant dye, acid mordant dye, azoic dye, dispersion dye, oil soluble dye, food dye, and/or a derivative thereof can be also usefully used. These dyes may be used alone, or two or more kinds may be used in combination.

—Pigment—

When the curable composition of the invention contains a pigment, the conventionally known various inorganic pigments or organic pigments can be used. Whether the pigment is an inorganic pigment or an organic pigment, considering that a high transmittance is preferable, it is preferable to use pigments which are as finer as possible. In addition, when handling property is also taken into consideration, an average particle diameter of the pigment is preferably 0.01 μm to 0.1 μm, more preferably 0.01 μm to 0.05 μm.

Examples of the inorganic pigment include metal compounds such as metal oxides, and metal complex salts, specifically, oxides of metals such as iron, cobalt aluminum, cadmium, lead, copper, titanium, magnesium, chromium, zinc, and antimony, further, composite oxides of those metals.

As the organic pigment, for example, the following pigments can be used, however the invention is not restricted to them.

C.I.Pigment Yellow 11, 24, 31, 53, 83, 93, 99, 108, 109, 110, 138, 139, 147, 150, 151, 154, 155, 167, 180, 185, 199;
C.I.Pigment Orange 36, 38, 43, 71;
C.I.Pigment Red 81, 105, 122, 149, 150, 155, 171, 175, 176, 177, 209, 220, 224, 242, 254, 255, 264, 270;
C.I.Pigment Violet 19, 23, 32, 39;
C.I.Pigment Blue 1, 2, 15, 15:1, 15:3, 15:6, 16, 22, 60, 66;
C.I.Pigment Green 7, 36, 37;
C.I.Pigment Brown 25, 28;
C.I.Pigment Black 1, 7;
carbon black.

In the invention, particularly, pigments having a basic N atom in a structure thereof can be preferably used. These pigments having a basic N atom exhibit favorable dispersity in the composition of the invention. Although the cause therefor has not been sufficiently elucidated, it is presumed that favorable affinity between the photosensitive polymerization component and the pigment influences thereon.

Examples of the pigment, which can be preferably used in the invention, include the following pigments, however the invention is not restricted to them.

C.I.Pigment Yellow 11, 24, 108, 109, 110, 138, 139, 150, 151, 154, 167, 180, 185,
C.I.Pigment Orange 36, 71,
C.I.Pigment Red 122, 150, 171, 175, 177, 209, 224, 242, 254, 255, 264,
C.I.Pigment Violet 19, 23, 32,
C.I.Pigment Blue 15:1, 15:3, 15:6, 16, 22, 60, 66,
C.I.Pigment Black 1.

These organic pigments can be used alone, or by variously combining them in order to enhance a color purity. Examples of the combination are shown below. For example, an anthraquinone-based pigment a perylene-based pigment, or a diketopyrrolopyrrole-based pigment alone as a red pigment, or a mixture of at least of one kind of them, and a disazo-based yellow pigment, an isoindoline-based yellow pigment, a quinophthalone-based yellow pigment or a perylene-based red pigment can be used. Examples of the anthraquinone-based pigment include C.I.Pigment Red 177, examples of the perylene-based pigment include C.I.Pigment Red 155, and C.I.Pigment Red 224, and examples of the diketopyrrolopyrrole-based pigment include C.I.Pigment Red 254, and a mixture with C.I.Pigment Yellow 139 is preferable from a viewpoint of color reproductivity. And a mass ratio of red pigment and the yellow pigment is preferably 100:5 to 100:50. When the ratio is 100:4 or less, it is difficult to suppress a light transmittance of 400 nm to 500 nm, and a color purity cannot be enhanced in some cases. On the other hand, when the ratio is 100:51 or more, a main wavelength moves to a shorter wavelength, and deviation from NTSC goal hue becomes great in some cases. Particularly, the mass ratio is optimally in a range of 100:10 to 100:30. In the case of a combination of red pigments, the ratio can be adjusted in conformity with a chromaticity.

In addition, as the green pigment, a halogenated phthalocyanine-based pigment can be used alone, or a mixture of this with a disazo-based yellow pigment, a quinophthalone-based yellow pigment, an azomethine-based yellow pigment or an isoindoline-based yellow pigment can be used. For example, as such the example, a mixture of C.I.Pigment Green 7, 36, 37 with C.I.Pigment Yellow 83, C.I.Pigment Yellow 133, C.I.Pigment Yellow 139, C.I.Pigment Yellow 150, C.I.Pigment Yellow 180 or C.I.Pigment Yellow 185 is preferable. A mass ratio of the green pigment and the yellow pigment is preferably 100:5 to 100:150. When the mass ratio is less than 100:5, it becomes difficult to suppress a light transmittance of 400 nm to 450 nm, and a color purity cannot be enhanced in some cases. On the other hand, when the mass ratio exceeds 100:150, a main wavelength moves to a longer wavelength, and deviation from a NTSC goal hue becomes great in some cases. As the mass ratio, a range of 100:30 to 100:120 is particularly preferable.

As the blue pigment, a phthalocyanine-based pigment can be used alone, or a mixture of this with a dioxazine-based purple pigment can be used. For example, a mixture of C.I.Pigment Blue 15:6 and C.I.Pigment Violet 23 is preferable. A mass ratio of blue pigment and the purple pigment is preferably 100:0 to 100:30, more preferably 100:10 or less.

In addition, as the pigment for a black matrix, carbon, titanium carbon, iron oxide or titanium oxide alone, or a mixture thereof is used, and a combination of carbon and titanium carbon is preferable. A mass ratio of carbon and titanium carbon is preferably in a range of 100:0 to 100:60. When the mass ratio is 100:61 or more, dispersion stability is reduced in some cases.

Furthermore, pigments described in JP-A No. 2003-315998, and JP-A No. 2005-331610 can be used. These pigments may be used alone, or two or more kinds may be used in combination. Alternatively, they may be used with a dye.

A primary particle diameter of the pigment, when used for a color filter, is 80 nm or less from a viewpoint of color unevenness and contrast, and is 5 nm or more from a viewpoint of dispersion stability. The primary particle diameter is preferably 5 to 75 nm, more preferably 5 to 55 nm, and particularly preferably 5 to 35 nm.

The primary particle diameter of the pigment can be measured by the known method such as electron microscope.

As a chemical structure, a pigment selected from the aforementioned triallylmethane series, anthraquinone series, azomethine series, benzylidene series, oxonol series, cyanine series, phenothiazine series, pyrrolopyrazoleazomethine series, xanthene series, phthalocyanine series, benzopyran series, indigo series, pyrazoleazo series, anilinoazo series, pyrazolotriazoleazo series, pyridoneazo series, and anthrapyridone series is preferable, and a pigment selected from the anthraquinone series, azomethine series, benzylidene series, cyanine series, a diketopyrrolopyrrole series, and a phthalocyanine series is more preferable.

When the curable composition of the invention is used in forming a colored pattern of a color filter, a content of the pigment is such that a mass ratio in a solid content of the curable composition is preferably 20% by mass or more and 85% by mass or less, more preferably 30% by mass or more and 80% by mass or less, particularly preferably 50% by mass or more and 75% by mass or less.

<Dispersant>

When the curable composition of the invention contains a pigment, the conventionally known pigment dispersant and surfactant can be added for the purpose of improving dispersity of the pigment.

Examples of the dispersant (pigment dispersant) which can be used in the invention include polymer dispersants [e.g. polyamidoamine and a salt thereof polycarboxylic acid and a salt thereof, high-molecular unsaturated acid ester, modified polyurethane, modified polyester, modified poly(meth)acrylate, (meth)acryl-based copolymer, naphthalenesulfonic acid formalin condensate], polyoxyethylene alkyl phosphate ester, polyoxyethylenealkylamine, alkanolamine, and a pigment derivative.

The polymer dispersant can be further classified into a straight polymer, a terminal-modified polymer, a graft polymer, and a block polymer depending on a structure thereof.

The polymer dispersant is adsorbed on a surface of the pigment, and acts so as to prevent re-aggregation. For this reason, examples of a preferable structure include a terminal-modified polymer, a graft polymer and a block polymer, which have an anchoring site for a pigment surface. On the other hand, the pigment derivative has the effect of promoting adsorption of the polymer dispersant by modifying a pigment surface.

As these dispersants, many kinds of compounds are used, and examples include phthalocyanine derivatives (commercially available product, EFKA-745, manufactured by EFKA), Solsperse 5000 (manufactured by Zeneca); cationic surfactants such as Organosiloxane Polymer KP341 (manufactured by Shin-Etsu Chemical Co., Ltd.), (meth)acrylic acid-based (co)polymer Polyflow No. 75, No. 90, No. 95 (manufactured by Kyoeisha Chemical Co., Ltd.), and W001 (manufactured by Yusho Co., Ltd.); nonionic surfactants such as polyoxyethylene lauryl ether, polyoxyethylene strearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester, anionic surfactants such as W004, W005, W017 (manufactured by Yusho Co., Ltd.); polymer dispersants such as EFKA-46, EFKA-47, EFKA-47EA, EFKA Polymer 100, EFKA Polymer 400, EFKA Polymer 401, EFKA Polymer 450 (all manufactured by Morishita & Co., Ltd.), Disperse Aid 6, Disperse Aid 8, Disperse Aid 15, Disperse Aid 9100 (manufactured by San Nopco Restricted); various Solsperse dispersants such as Solsperse 3000, 5000, 9000, 12000, 13240, 13940, 17000, 24000, 26000, 28000 (manufactured by Zeneca); ADEKA Pluronic L31, F38, L42, L44, L61, L64, F68, L72, P95, F77, P84, F87, P94, L101, P103, F108, L121, P-123 (manufactured by Asahi Denka Kogyo K.K.) and Isonet S-20 (manufactured by Sanyo Chemical Industries, Ltd.).

Examples also include "Disperbyk-101 polyamidoamine phosphate), 107 (carboxylic acid ester), 110 (copolymer containing acid group), 130 (polyamide), 161, 162, 163, 164, 165, 166, 170 (high-molecular copolymer)" manufactured by BYK Chemie, "BYK-P104, P105 (high-molecular unsaturated polycarboxylic acid)", "EFKA4047, 4050, 4010, 4165 (polyurethane-based), EFKA4330, 4340 (block copolymer), 4400, 4402 (modified polyacrylate), 5010 (polyester amide), 5765 (high-molecular-weight polycarboxylic acid salt), 6220 (fatty acid polyester), 6745 (phthalocyanine derivative), 6750 (azo pigment derivative)" manufactured by EFKA, "Ajispur PB821, PB822" manufactured by Ajinomoto Fine Techno Co., Inc., "Flowlen TG-710 (urethane oligomer)" manufactured by Kyoeisha Chemical Co., Ltd., "Polyflow No. 50E, No. 300 (acryl-based copolymer)", "Disperon KS-860, 873SN, 874, #2150 (aliphatic polyvalent carboxylic acid), #7004 (polyetherester), DA-703-50, DA-705, DA-725" manufactured by Kusumoto Chemicals Ltd., "Demol RN, N (naphthalenesulfonic acid formalin polycondensate), MS, C, SN-B (aromatic sulfonic acid formalin polycondensate)" manufactured by Kao Corporation, "Homogenol L-18 (high-molecular polycarboxylic acid)", "Emulgen 920, 930, 935, 985, (polyoxyethylene nonyl phenyl ether)", "Acetamine 86 (stearylamine acetate), 13240 (polyesteramine), 3000, 17000, 27000 (polymer having functional site on terminal part), 24000, 28000, 32000, 38500 (graft polymer)", "Nikkol T106 (polyoxyethylene sorbitan monooleate), MYS-IEX (polyoxyethylene monostearate)" manufactured by Nikko Chemicals Co., Ltd.

These dispersants may be used alone, or may be used by combining two or more kinds in the invention, particularly, it is preferable that the pigment derivative and the polymer dispersant are used by combining them.

A content of dispersant in the invention is preferably 1% by mass to 100% by mass, more preferably 3% by mass to 100% by mass, further preferably 5% by mass to 80% by mass relative to the pigment.

Specifically, when the polymer dispersant is used, its use amount is preferably in a range of 5% by mass to 100% by mass, more preferably, in a range of 10% by mass to 80% by mass relative to the pigment. In addition, when the pigment derivative is used, its use amount is preferably in a range of 1% by mass to 30% by mass, more preferably in a range of 3% by mass to 20% by mass, particularly preferably in the range of 5% by mass to 15% by mass relative to the pigment.

In the invention, when the pigment and the dispersant are used, from a viewpoint of a curing sensitivity and a color concentration, a total of contents of the pigment and the dispersant is preferably 35% by mass or more and 90% by mass or less, more preferably 45% by mass or more and 85% by mass or less, further preferably 50% by mass or more and 80% by mass or less relative to a total solid content constituting the curable composition.

<Binder>

The curable composition of the invention can contain a binder for the purpose of improving the film property. Although it is not necessarily required that the curable composition of the invention contains a cross-linking agent, when the composition contains it if desired, it is preferable that the composition contains at least one kind of binder.

The binder, which can be used in the invention, is not particularly restricted so long as it is an alkali-soluble polymer compound, and is preferably selected from a viewpoint of heat resistance, developability, and availability.

As the alkali-soluble binder, a binder, which is a linear organic high-molecular polymer, is soluble in an organic solvent, and can be developed with a weakly aqueous alkali solution, is preferable.

Examples of such linear organic polymer include polymers having a carboxylic acid at their side chain, for example methacrylic acid copolymers, acrylic acid copolymers, itaconic acid copolymers, crotonic acid copolymers, maleic acid copolymers and partially esterified maleic acid copolymers as described in the specifications of JP-A Nos. 59-44615, 59-53836 and 59-71048, and JP-B Nos. 54-34327, 58-12577 and 54-25957. Acidic cellulose derivatives having a carboxylic acid at the side chain are particularly useful. Other useful binders include polymers prepared by adding an acid anhydride to a polymer having a hydroxyl group, polyhydroxystyrene resins, polysiloxane resins, poly(2-hydroxyethyl(meth) acrylate), polyvinyl pyrrolidone, polyethylene oxide and polyvinyl alcohol.

The binder resin may be prepared by copolymerization of monomers having a hydrophilic group. Examples of such monomer include akoxyalkyl(meth)acrylate, hydroxyalkyl (meth)acrylate, glycerol(meth)acrylate, (meth)acrylamide, N-methylol acrylamide, sec- and tert-alkyl acrylamide, dialkylaminoalkyl(meth)acrylate, morpholino(meth)acrylate, N-vinyl pyrrolidone, N-vinyl caprolactam, vinyl imidazole, vinyl triazole, methyl(meth)acrylate, ethyl(meth)acryl ate, branched or linear propyl(meth)acrylate, branched or linear butyl(meth)acrylate, and phenoxyhydroxypropyl (meth)acrylate.

Other useful monomers having a hydrophilic group include monomers having tetrahydrofurfuryl group, phosphate, phosphate ester, quaternary ammonium salt, ethyleneoxy chain, propyleneoxy chain, sulfonic acid and salts thereof morpholinoethyl group or the like.

The binder may have a polymerizable groups at its side chain for improving cross-link efficiency. Polymers containing allyl groups, (meth)acrylic groups, allyloxyalkyl groups or the like at their side chain are useful. Examples of the polymer having such polymerizable group include KS resist 106 (trade name, manufactured by Osaka Organic Chemical Industries, Ltd.) and Cyclomer-P Series (trade name, manufactured by Daicel Chemical Industries, Ltd.).

Alcohol-soluble nylons and polyethers of 2,2-bis(4-hydroxyphenyl)propane and epichlorohydrin are also useful for enhancing the strength of cured coating films.

Among these binders, from the view point of heat resistance, polyhydroxystyrene resins, polysiloxane resins, acrylic resins, acrylamide resins and acrylic/acrylamide copolymer resins are preferable, and from the viewpoint of controlling developability, acrylic reins, acrylamide resins and acrylic/acrylamide copolymer resins are preferable. Preferable acrylic resins include copolymers comprising the monomers selected from benzyl(meth)acrylate, (meth) acrylic, hydroxyethyl(meth)acrylate, (meth)acrylamide or the like. KS-resist 106 (trade name, manufactured by Osaka Organic Chemical Industries, Ltd.) and Cyclomer-P Series (trade name, manufactured by Daicel Chemical Industries Co.) are favorably used as commercially available products.

In addition, other examples of the binder, which can be used in the invention, include an alkali-soluble phenol resin. The alkali-soluble phenol resin can be suitably used when the colored curable composition of the invention is formulated into a positive-type composition.

Examples of the alkali-soluble phenol resin include more specifically a novolak resin, and a vinyl polymer.

Examples of the novolak resin include a novolak resin obtained by condensing phenols and aldehydes under the presence of an acid catalyst. Examples of phenols, which are used for synthesizing the novolak resin, include phenol, cresol, ethylphenol, butylphenol, xylenol, phenylphenol, catechol, resorcinol, pyrogallol, naphthol, and bisphenol A.

Examples of aldehydes include formaldehyde, paraformaldehyde, acetaldehyde, propionaldehyde, and benzaldehyde.

Phenols and aldehydes can be used alone, or by combining two or more kinds.

Examples of the novolak include condensation products of metacresol, paracresol or a mixture thereof and formalin.

The novolak resin whose molecular weight distribution has been regulated using a means such as fractionation may be used, and the novolak resin may be used by mixing with a low-molecular component having a phenolic hydroxy group such as bisphenol C and bisphenol A.

As the binder, a polymer having a mass average molecular weight of 1000 to $2\times10^5$ in terms of polystyrene measured by a GPC (Gel Permeation Chromatography) method is preferable, a polymer having the molecular weight of 2000 to $1\times10^5$ is further preferable, and a polymer having the molecular weight of 5000 to $5\times10^4$ is particularly preferable.

A use amount of the binder in the colored curable composition of the invention is preferably 0 to 90% by mass, further preferably 0 to 60% by mass, particularly preferably 0 to 30% by mass relative to a total solid content in the composition.

<Cross-Linking Agent>

In the invention, by using the polyfunctional acrylate compound represented by formula (I), a reaction of curing a film more highly precedes than conventionally, and a film having favorable curability is obtained. By supplementally using a cross-linking agent in the composition, a further highly cured film can be obtained.

While the cross-linking agents which can be used in the invention is not particularly restricted so long as they are able to cure the film by a cross-linking reaction, examples of the cross-linking agent include (a) an epoxy resins b) a melamine compound, guanamine compound, glycoluryl compound or urea compound substituted by at least one substituent selected from a methylol group, alkoxymethyl group and acyloxymetyl group, and (c) a phenol compound, naphthol compound or hydroxyanthracene compound substituted by at least one substituent selected from a methylol group, alkoxymethyl group and acyloxymethyl group. Polyfunctional epoxy resins are particularly preferable among them.

[(a) Epoxy Resin]

While any resins may be used as the epoxy resin of component (a) so long as they contain epoxy groups and are able to form cross-links, examples of these compound include bisphenol A-glycidyl ether; ethyleneglycol diglycidyl ether; ethyleneglycol diglycidyl ether; butanediol diglycidyl ether; hexanediol diglycidyl ether; dihydroxyphenyl diglycidyl ether; phthalic acid diglycidyl ester; divalent glycidyl group-containing low molecular weight compounds such as N,N-diglycidylaniline; trivalent glycidyl group-containing low molecular weight compound represented by trimethylolpropane triglycidyl ether, trimethylolphenol triglycidyl ether and Tris P-PA triglycidyl ether; tetravalent glycidyl group-containing low molecular weight compounds represented by pentaerythritol tetraglycidyl ether and tetramethylol bisphenol-A-tetraglycidyl ether; polyvalent glycidyl group-containing low molecular weight compounds such as dipentaerythritol pentaglycidyl ether and dipentaerythritol hexaglycidyl ether; glycidyl group containing polymer compounds represented by polyglycidyl(meth)acrylate, 1,2-epoxy-4-(2-oxysilanyl)cyclohexane adduct of 2,2-bis(hydroxymethyl)-1-butanol.

[(b) Melamine Compound, Guanamine Compound, Glycoluryl Compound, or Urea Compound Substituted with at Least One Substituent Selected from Methylol Group, Alkoxymethyl Group, and Acyloxymethyl Group (Cross-Linking Agent (b))]

The number of substitution of the methylol group, the alkoxymethyl group, or the acyloxymethyl group contained in the cross-linking agent (b) component is 2 to 6 in the case of the melamine compound, 2 to 4 in the case of the glycoluryl compound, the guanamine compound, or the urea compound, and is preferably 5 to 6 in the case of the melamine compound, and 3 to 4 in the case of the glycoluryl compound, the guanamine compound, or the urea compound.

Hereinafter, the aforementioned (b) melamine compound, guanamine compound, glycoluryl compound and urea compound are collectively referred to as compound (methylol group-containing compound, alkoxymethyl group-containing compound, or acyloxymethyl group-containing compound) according to (b) in some cases.

The methylol group-containing compound according to (b) is obtained by heating the alkoxymethyl group-containing compound according to (b) in an alcohol under the presence of an acid catalyst such as hydrochloric acids sulfuric acid, nitric acid, and methanesulfonic acid. The acyloxymethyl group-containing compound according to (b) is obtained by mixing the methylol group-containing compound with acyl chloride with stirring, under the presence of a basic catalyst.

Specific examples of compound (b) having the substituents above include the following.

Examples of the melamine compound include hexamethylol melamine, hexamethoxymethyl melamine, compounds in which 1 to 5 methylol groups of hexamethylol melamine are methoxymethylated or mixtures thereof, hexamethoxyethyl melamine, hexaacyloxymethyl melamine and compounds in which 1 to 5 methylol groups of hexamethylol melamine are acyloxymethylated or mixtures thereof.

Examples of the guanamine compound include tetramethylol guanamine, tetramethoxymethyl guanamine, compounds in which 1 to 3 methylol groups of tetramethylol guanamine are methoxymethylated or mixtures thereof, tetramethoxyethyl guanamine, tetraacyloxymethyl guanamine and compounds in which 1 to 3 methylol groups of tetramethylol guanamine are acyloxymethylated or mixtures thereof.

Examples of the glycoluryl compound include tetramethylol glycoluryl, tetramethoxymethyl glycoluryl, compounds in which 1 to 3 methylol groups of tetramethylol glycoluryl are methoxymethylated or mixtures thereof, and compounds in which 1 to 3 methylol groups of tetramethylol glycoluryl are acyloxymethylated or mixtures thereof.

Examples of the urea compound include tetramethylol urea, tetramethoxymethyl urea, compounds in which 1 to 3 methylol groups of tetramethylol urea are methoxymethylated or mixtures thereof, and tetramethoxyethyl urea. The compounds above may be used alone, or as a combination thereof.

The compounds (b) may be used alone, or as a combination thereof.

[(c) Phenol Compound, Naphthol Compound or Hydroxyanthracene Compound Substituted with at Least One Substituent Selected from Methylol Group, Alkoxymethyl Group and Acyloxymethyl Group (Cross-Linking Agent (c))]

Cross-linking agent (c): the phenol compound, the naphthol compound or the hydroxyanthracene compound substituted with at least one substituent selected from the methylol group, the acyloxymethyl group and the alkoxymethyl group suppresses intermixing with an overcoating photoresist and, at the same time, further enhances a film strength by heat cross-linking as in the case of the cross-linking agent (b).

Hereinafter, these compounds are collectively referred to as compound (methylol group-containing compound, alkoxymethyl group-containing compound, or acyloxymethyl group-containing compound) according to (c).

The number of the methylol group, the acyloxymethyl group, or the alkoxymethyl group contained in the cross-linking agent (c) is minimally required to be 2 per molecule and, from a viewpoint of heat cross-linking property and storage stability, a compound in which all of a 2-position and a 4-position of the phenol compound as a skeleton are substituted is preferable. In addition, regarding the naphthol compound or the hydroxyanthracene compound as a skeleton, a compound in which all of an ortho-position and a para-position of an OH-group are substituted is preferable. A 3-position or a 5-position of the phenol compound as a skeleton may be unsubstituted, or may have a substituent. Also in the naphthol compound as a skeleton, positions other than an ortho-position of an OH-group may be unsubstituted, or may have a substituent.

The methylol group-containing compound according to the cross-linking agent (c) is obtained by using, as a raw material, a compound in which an ortho-position or a para-position (2-position or 4-position) of a phenolic OH group is a hydrogen atom, and reacting this compound with formalin under the presence of a basic catalyst such as sodium hydroxide, potassium hydroxide, ammonia, and tetraalkylammonium hydroxide. In addition, the alkoxymethyl group-containing compound according to (c) is obtained by heating the methylol group-containing compound in an alcohol under the presence of an acid catalyst such as hydrochloric acid, sulfuric acid, nitric acid, and methanesulfonic acid. The acyloxymethyl group-containing compound according to (c) is obtained by reacting the aforementioned methylol group-containing compound with acyl chloride under the presence of a basic catalyst.

Examples of the frame compound in component (C) include unsubstituted phenol compounds at the ortho- or para-position of the phenolic OH group, naphthol compounds; hydroxyanthracene compounds such as isomers of phenol and cresol; 2,3-xylenol, 2,5-xylenol, 3,4-xylenol and 3,5-xylenol; bisphenols such as bisphenol A; 4,4'-bishydroxybiphenyl; Tris P-PA (manufactured by Honshu Chemical Industry Co.); naphthol; dihydroxynaphthalene; and 2,7-dihydroxyanthracene.

Specific examples of component (c) include trimethylolphenol, tri(methoxymethyl)phenol, compounds in which 1 to 2 methylol groups of trimethylolphenol are methoxymethylated, trimethylol-3-cresol, tri(methoxymethyl)-3-cresol, compounds in which 1 to 2 methylol groups of trimethylol-3-cresol are methoxymethylated, dimethylol cresol such as 2,6-dimethylol-4-cresol, tetramethylol bisphenol A, tetramethoxymethyl bisphenol A, compounds in which 1 to 3 methylol groups of tetramethylol bisphenol A are methoxymethylated; tetramethylol-4,4'-bishydroxybiphenyl, tetramethoxymethyl-4,4'-bishydroxybiphenyl, hexamethylol derivatives of Tris P-PA, hexamethoxymethyl derivatives of Tris P-PA, compound in which 1 to 5 methylol groups of hexamethylol derivatives of Tris-P are methoxymethylated, and bishydroxymethyl naphthalenediol.

Examples of the hydroxyanthracene compounds include 1,6-dihydroxymethyl-2,7-dihydroxyanthracene.

Examples of the acyloxymethyl group-containing compound include compounds in which a part or all the methylol groups of the above methylol group-containing compound are acyloxymethylated.

Preferable compounds among these compounds are trimethylolphenol, bishydroxymethyl-p-cresol tetramethylol bisphenol A, hexamethylol derivatives of Tris P-PA (manufactured by Honshu Chemical Industry Co), or phenol compounds prepared by substituting the methylol groups of the hexamethylol derivatives above with alkoxymethyl group or both the methylol group and alkoxymethyl group.

The compounds including component (c) may be used alone, or as a combination thereof While the cross-linking compound is not necessarily contained in the colored curable composition of the invention, the total content is preferably 1 to 70% by mass, more preferably 5 to 50% by mass, and particularly preferably 7 to 30% by mass relative to the solid content of the composition, if any, although the total content of components (a) to (c) are different depending on the material used.

<Polymerizable Monomer>

The curable composition of the invention more highly proceeds a reaction of curing a film than conventionally by using the polyfunctional acrylate compound represented by the formula (I), and a film having the favorable curability is obtained. By supplementally using other polymerizable monomer in the composition a further highly cured film can be obtained.

The polymerizable monomer other than the polyfunctional acrylate compound represented by the formula (I) will be explained below.

As the polymerizable monomer other than the polyfunctional acrylate compound represented by the formula (I), a compound with an ethylenically unsaturated group having a boiling point of 100° C. or higher under a normal pressure, which has at least one addition-polymerizable ethylene group is preferable, and examples include monofunctional acrylates and methacrylates such as polyethylene glycol mono(meth) acrylate, polypropylene glycol mono(meth)acrylate, and phenoxyethyl(meth)acrylate; polyethylene glycol di(meth) acrylate, trimethylolethane tri(meth)acrylate, neopentyl glycol di(meth)acrylate, pentaerythritol tri(meth)acrylate, pentaerythritol tetra(meth)acrylate, dipentaerythritol penta (meth)acrylate, dipentaerythritol hexa(meth)acrylate, hexanediol(meth)acrylate, trimethylolpropane tri(acryloyloxypropyl) ether, tri(acryloyloxyethyl) isocyanurate, monomers obtained by adding ethylene oxide or propylene oxide to a polyfunctional alcohol such as glycerin and trimethylolethane, and (meth)acrylating this, urethane acrylates such as those described in JP-B No. 48-41708, JP-B No. 50-6034, and JP-A No. 51-37193, polyester acrylates described in JP-A No. 48-64183, JP-B No. 49-43191, and JP-B No. 52-30490, and polyfunctional acrylates and methacrylates such as epoxy acrylates which are reaction products of an epoxy resin and (meth)acrylic acid, and a mixture thereof.

Other examples include those introduced as photocurable monomers and oligomers in Journal of the Japanese Adhesive Association, Vol. 20, No. 7, p 300 to 308.

The content of the polymerizable monomer is preferably 0.1 to 90% by mass, more preferably 1.0 to 80% by mass, and particularly preferably 2.0 to 70% by mass relative to the solid content.

—Solvent—

Solvents may be usually contained in preparing the curable composition of the invention. While the solvent is not particularly restricted so long as the solvent satisfies solubility of each component of the composition and applicability of the curable composition, it is preferably selected by taking safety into consideration.

Specific examples of the preferable solvent include esters such as ethyl acetate, n-butyl acetate, isobutyl acetate, amyl formate, isoamyl acetate, isobutyl acetate, butyl propionate, isopropyl butylate and ethyl butylate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, 3-oxypropionic acid acryl esters such as methyl 3-oxypropionate and ethyl 3-oxypropionate; methyl 3-methoxypropionate, ethyl 3-methoxypropionate, methyl 3-ethoxypropionate and ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methyl propionate, ethyl 2-oxy-2-methylpropionate, methyl 2-methoxy-2-methylpropionate and ethyl 2-ethoxy-2-methylpropionate, methyl pyruvate, ethyl pyruvate, propyl pyruvate; methyl acetoacetate; ethyl acetoacetate; methyl 2-oxobutanate and ethyl 2-oxobutanate;

ethers such as diethyleneglycol dimethylether, tetrahydrofuran, ethyleneglycol monomethylether, ethyleneglycol monoethylether, methylcellosolve acetate, ethylcellosolve acetate, diethyleneglycol monomethylether, diethyleneglycol monoethylether, diethyleneglycol monobutylether, propyleneglycol methylether, propyleneglycol methylether acetate, propyleneglycol ethylether acetate, and propyleneglycol propylether acetate; ketones such as methylethyl ketone, cyclohexanone, 2-heptanone and 3-heptanone; and aromatic hydrocarbons such as toluene and xylene.

More preferable examples among them include methyl 3-ethoxypropionate, ethyl 3-ethoxypropionate, ethylcellosolve acetate, ethyl lactate, diethyleneglycol dimethylether, butyl acetate, methyl 3-methoxypropionate, 2-heptanone, cyclohexanone, ethylcarbitol acetate, butylcarbitol acetate, propyleneglycol methylether and propyleneglycol methylether acetate.

—Various Additives—

Various additives, for example fillers, polymer compounds other than those described above, surfactants, adhesion accelerating agents, antioxidants, UV absorbing agents and aggregation inhibitors may be contained in the colored curable composition of the invention.

Specific examples of the additives include fillers such as glass and alumina; polymer compounds such as polyvinyl alcohol, polyacrylic acid, polyethyleneglycol monoalkylether and polyfluoroalkyl acrylate, other than the binder resins; nonionic, cationic and anionic surfactants; adhesion accelerating agents such as vinyl trimethoxysilane, vinyl triethoxysilane, vinyl-tris(2-methoxyethoxy)silane, N-(2-aminoethyl)-3-aminopropylmethyl dimethoxysilane, N-(2-aminoethyl)-3-aminopropyl trimethoxysilane, 3-aminopropyl triethoxysilane, 3-glycidoxypropyl trimethoxysilane, 3-glycidoxypropylmethyl dimethoxysilane, 2-(3,4-epoxycyclohexyl)ethyl trimethoxysilane, 3-chloropropylmethyl dimethoxysilane, 3-chloropropyl trimethoxysilane, 3-methacryloxypropyl trimethoxysilane and 3-mercaptopropyl trimethoxysilane; antioxidants such as 2,2-thiobis(4-methyl-6-t-butylphenol) and 2,6-di-t-butylphenol; UV absorbing agents such as 2-(3-t-butyl-5-methyl-2-hydroxyphenyl)-5-chlorobenzotriazole and alkoxybenzophenone; and aggregation inhibitor such as sodium polyacrylate.

For accelerating alkali solubility of non-irradiated parts (non-image parts) in order to improve developability of the curable composition of the invention, organic carboxylic acids, preferably low molecular weight carboxylic acids with a molecular weight of not larger than 1000, may be added.

Specific examples thereof include aliphatic monocarboxylic acids such as formic acid, acetic acid, propionic acid, butyric acid, valeric acid, pivalic acid, caproic acid, diethylacetic acid, enathic acid and caprylic acid; aliphatic dicarboxylic acids such as oxalic acid, malonic acid, succinic acid, glutaric acid, adipic acid, pimelic acid, suberic acid, azelaic acid, cebacic acid, brassylic acid, methylmalonic acid, ethylmalonic acid, dimethylmalonic acid, methylsuccinic acid, tetramethylsuccinic acid and citraconic acid; aliphatic tricarbonic acids such as tricarballylic acid, aconitic acid and camphoronic acid; aromatic monocarboxylic acid such as benzoic acid, toluylic acid, cumic acid, hemellitic acid and mesitylenic acid; aromatic polycarboxylic acid such as phthalic acid, isophthalic acid, terephthalic acid, trimellitic acid, trimesic acid, mellophanic acid and pyromellitic acid; phenylacetic acid, hydratropic acid, hydrocinnamic acid, mandelic acid, phenylsuccinic acid, atropic acid, cinnamic acid, methyl cinnamate, benzyl cinnamate, cinnamilydenic acid, coumalic acid, umbellic acid and other carboxylic acid.

When the curable composition of the invention contains the pigment, it is preferable that the curable composition is prepared via a mixing and dispersing step of mixing the polyfunctional acrylate compound represented by the formula (I), the pigment, the radiation-sensitive compound and, if necessary, the alkali-soluble resin and other additives with a solvent, and mixing and dispersing them using various mixers and dispersing machines. It is preferable that the mixing and dispersing step comprises kneading dispersing treatment and subsequent fine dispersing treatment, however kneading dispersing can be omitted.

As a preferable process for producing the composition of the invention, a method of kneading dispersing-treating the coloring agent with the resin component so that a viscosity after kneading dispersing treatment becomes a relatively higher viscosity of 10,000 mPa·s or higher, desirably 100,000 mPa·s or higher, then, adding a solvent, fine dispersing-treating this so that a viscosity after fine dispersing treatment becomes a relatively low viscosity of 1,000 mPa·s or lower, desirably 100 mPa·s or lower and, further, adding a high boiling point solvent, followed by stirring and mixing, is preferable.

An instrument used in the kneading dispersing treatment is a double roll, a triple roll, a ball mill, a tron mill, a disperser, a kneader, a cokneader, a homogenizer, a blender, and a monoaxial or biaxial extruder, and disperses the materials while a strong shearing force is applied. Then, a solvent is added, and this is fine dispersing-treated with beads made of glass or zirconia having a particle diameter of 0.1 to 1 mm mainly using a vertical or horizontal sand grinder, a pin mill, a slit mill or an ultrasound dispersing machine. Alternatively, kneading dispersing treatment can be omitted. In this case, beads are dispersed with the pigment and the dispersant, or a surface treating agent, and the acryl-based copolymer in the invention and the solvent. Details of kneading and dispersing are also described in T. C. Patton "Paint Flow and Pigment Dispersion", 1964 published by John Wiley and Sons, and this method may be used.

By inclusion of the coloring agent, the curable composition of the invention can be suitably used for forming a colored pixel such as a color filter used in a liquid crystal display element (LCD) and a solid state image pickup element (e.g. CCD, CMOS, etc.), or may be suitably used in utility of preparing a printing ink, an inkjet ink, and a paint.

[Color Filter and Manufacturing Method Thereof]

The color filter of the invention is characterized in that the specified compound of the invention is used.

And, such the color filter can be manufactured by a manufacturing method, comprising a colored layer forming step of coating at least one kind of the colored curable composition of the invention on a support to form a colored layer, and a developing step of subjecting the colored layer to pattern light exposure through a mask, and developing this to form a colored pattern.

The color filter of the invention will be described in detail below referring to a manufacturing method thereof.

In the method of manufacturing the color filter of the invention, the colored curable composition of the invention is used. For the color filter of the invention, the colored curable composition of the invention is coated on a support by a coating method such as slit coating, an ink jet method, spin coating, cast coating, roll coating, and a screen printing method to form a radiation-sensitive colored curable composition layer (colored layer) (colored layer forming step), and this is exposed to light through a predetermined mask pattern, and is developed with a developer, thereby, a colored pattern (resist pattern) can be formed (developing step). Thereafter, if necessary, a curing step of curing the formed pattern by heating and/or light exposure can be conducted. The resulting colored pattern constitutes a pixel in the color filter.

A thickness of the colored curable composition layer formed of the colored curable composition is conveniently selected depending on the purpose, and the thickness is desirable when it is as small as possible so long as a desired color concentration is maintained. An upper limit is preferably 2.0 μm or less, more preferably 1.0 μm or less, particularly preferably 0.7 μm or less.

In order to use as the color filter for LCD (liquid crystal display element), a thickness of the colored curable composition layer is preferably 0.1 μm or more and less than 2.0 μm, more preferably 0.2 μm or more and 1.8 μm or less, particularly preferably 0.3 μm or more and 1.75 μm or less from a viewpoint that LCD can be thinned, and a color concentration is maintained.

In addition, in order to use as the color filter for IS (Image Sensor; image pickup element), the thickness is preferably 0.05 μm or more and less than 1.0 μm, more preferably 0.1 μm or more and 0.8 μm or less, particularly preferably 0.2 μm or more and 0.7 μm or less from a viewpoint that a color concentration is maintained, and disadvantage that light in an oblique direction does not reach a light receiving part and a difference in light collection becomes remarkable between an end and a center of a device, is reduced.

As light or radiation used in the developing step and the curing step, particularly, ultraviolet-ray such as a g-ray, h-ray, and an i-ray is preferably used.

In manufacturing of the color filter having a pixel of a plurality of hues, by repeating the developing step (and, if necessary, the curing step) in conformity with the desired color number, the color filter composed of the desired number of hues can be produced.

As a developer used in the method for manufacturing the color filter of the invention, any developer can be used so long as it has such a composition that an uncured part of the colored curable composition of the invention is dissolved and, on the other hand, a radiation-irradiated part (cured part) is not dissolved. Specifically, a combination of various organic solvents, or an aqueous alkali solution can be used.

Examples of the organic solvent, which can be used in development, include the aforementioned solvents which are used upon preparation of the composition of the invention.

As an aqueous alkaline solution which can be used in development, for example, an aqueous alkaline solution in which an alkaline compound such as sodium hydroxide, potassium hydroxide, sodium carbonate, sodium silicate, sodium metasilicate, aqueous ammonia, ethylamine, diethylamine, dimethylethanolamine, tetraethylammonium hydroxide, tetraethylammonium hydroxide, choline, pyrrole, piperidine, and 1,8-diazabicyclo-[5.4.0]-7-undecene is dissolved to a concentration of 0.001 to 10% by mass, preferably 0.01 to 1% by mass is used. When the developer consisting of such the aqueous alkaline solution is used, generally, after development, the color filter is washed with water.

Examples of the support which is used in the color filter of the invention include a soda glass, a Pyrex (registered trademark) glass, and a quartz glass which are used in a liquid crystal display element, those glasses with a transparent conduction film attached thereto a photoelectric conversion element substrate used in an image pickup element, for example, a silicone substrate, and a complementary metal oxide film semiconductor (CMOS). In these supports, a black stripe for isolating each pixel is formed in some cases.

Alternatively, on these supports, if necessary, an undercoating layer may be provided for improving adhesion with an upper layer, preventing diffusion of a substance, or flattening a support surface.

The color filter of the invention can be used in a liquid crystal display element and a solid-state image pickup element such as CCD and, in particular, is suitable in a CCD element and a CMOS element having high resolution exceeding one million pixels. The color filter of the invention can be used as a color filter which is disposed between a light receiving part of each pixel constituting CCD and a microlens for collecting light.

Exemplary aspect of the invention related to the first aspect will be listed below.

<1> A curable composition comprising: a compound (A) having at least one ethylenically unsaturated double bond; a photopolymerization initiator (B), a coloring agent (C); an alkali-soluble resin (D); and a compound (E) having in the molecule a partial structure of urethane, amide or urea.

<2> The curable composition of <1>, wherein the content of the compound (E) having a partial structure of urethane, amide or urea in a molecule relative to 100 parts by mass of the ethylenically unsaturated double bond compound (A), is 5 parts by mass or more and less than 25 parts by mass.

<3> The curable composition of <1> or <2>, wherein the compound (E) having in the molecule a partial structure of urethane, amide or urea is a compound having an isocyanurate skeleton.

<4> The curable composition of any one of <1> to <3>, wherein the molecular weight of the compound (E), having in the molecule a partial structure of urethane, amide or urea, is 100 to 5000.

<5> The curable composition of any one of <1> to <4>, wherein the photopolymerization initiator (B) is a bisimidazole compound.

<6> The curable composition of any one of <1> to <5> wherein the compound (E), having in the molecule a partial structure of urethane, amide or urea, is a reaction product of a compound having an isocyanate bond, and an alcohol compound represented by the formula (I').

Formula (I')

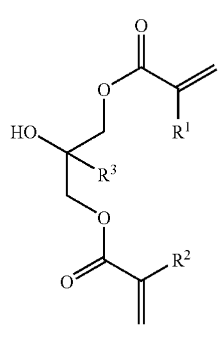

Wherein in the formula (I'), $R^1$ and $R^2$ each independently represent a hydrogen atom or an alkyl group. $R^3$ represents a hydrogen atom, an alkyl group, an alkoxy group, an allyl group, an aryl group, a functional group represented by the formula (II'), or a functional group represented by the formula (III').

Formula (II')

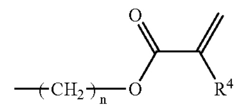

Formula (III')

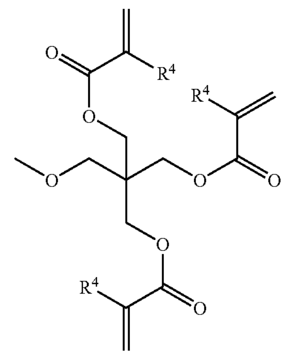

Wherein in the formula (II'), n denotes an integer of 1 to 10. And, in the formula (II') and the formula (III'), $R^4$ represents a hydrogen atom or an alkyl group and, in the formula (III'), plural $R^4$s present in the molecule may be the same or different from each other.

<7> The curable composition of any one of <1> to <6>, which further contains an alkoxysilane compound (F).

<8> The curable composition of any one of <1> to <7>, further comprising, in addition to the photopolymerization initiator (B), at least one compound of a mercapto compound, an aminobenzene derivative, an alkoxybenzene derivative, an alkylthiobenzene derivative, a thioxanthone derivative, and/or a coumarin derivative.

<9> A color filter, characterized in that it has a colored pattern using the curable composition of any one of <1> to <8>.

<10> A method for manufacturing a color filter, comprising: coating the curable composition of any one of <1> to <8> to form a colored curable composition layer on or above a support; exposing the curable composition layer to light through a mask; and developing the curable composition layer after light exposure to form a colored pattern.

The present inventors obtained the finding that a curable composition containing a specified polyfunctional acrylate compound has a favorable sensitivity, and gives the sufficient curability also in a curing system containing a coloring agent. Exemplary aspects of the invention related to the second aspect are listed below.

<1> A curable composition, comprising a compound represented by the following formula (I) and a photopolymerization initiator.

(I)

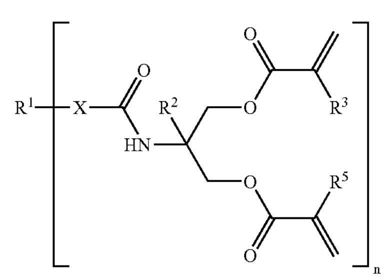

[In the formula (I), $R^1$ represents a n-valent organic group, $R^2$ represents a hydrogen atom or an alkyl group with 1 to 4 carbon atoms, $R^3$ and $R^5$ each independently represent a hydrogen atom or a methyl group, X represents —O—, —NH—, —$NR^4$—, or —S—, $R^4$ represents a hydrogen atom or a monovalent organic group, and n denotes an integer of 1 to 12]

<2> A curable composition containing a compound represented by the following formula (II) and a photopolymerization initiator.

(II)

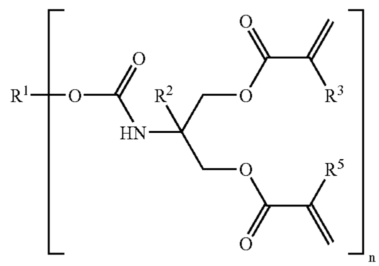

[In the formula (II), $R^1$ represents a n-valent organic group, $R^2$ represents a hydrogen atom or an alkyl group with 1 to 4 carbon atoms, $R^3$ and $R^5$ each independently represent a hydrogen atom or a methyl group, and n denotes an integer of 1 to 12]

<3> The curable composition of <1> or <2>, which contains a compound in which n is an integer of 2 to 9, in the formula (I) or (II), <4> The curable composition of any one of <1> to <3>, wherein in the formula (I) or (II), n is an integer of 2 to 12, and n-valent $R^1$ has a (meth)acrylate group as a substituent.

<5> The curable composition of any one of <1> to <4>, wherein in the formula (I) or (II), $R^1$ is an aliphatic residue, an aromatic residue, or a heterocycle residue optionally having any one of a hetero atom, an aromatic ring, and a heterocycle in a structure.

<6> The curable composition of any one of <1> to <5>, wherein the compound represented by the formula (I) or (II) is obtained by an urethanation reaction between a compound having at least one hydroxyl group in a molecule, and 1,1-(bisacryloyloxymethyl)ethyl isocyanate.

<7> The curable composition of any one of <1> to <6>, wherein the photopolymerization initiator contains at least one kind compound selected from the group consisting of a trihalomethyltriazine-based compound, a benzyldimethylketal compound, an α-hydroxyketone compound, an α-aminoketone compound, an acylphosphine-based compound, a phosphine oxide-based compound, a metallocene-based compound, an oxime-based compound, a triallylimidazole dimer, an onium-based compound, a benzothiazole-based compound, a benzophenone-based compound, an acetophenone-based compound and a derivative thereof, a cyclopentadiene-benzene-iron complex and a salt thereof, a halomethyloxadiazle compound, and a 3-aryl-substituted coumarin compound.

<8> The curable composition of any one of <1> to <6>, wherein the photopolymerization initiator contains at least one kind compound selected from the group consisting of a trihalomethyltriazine-based compound, an α-aminoketone compound, an acylphosphine-based compound, a phosphine oxide-based compound, an oxime-based compound, a triallylimidazole dimer, an onium-based compound, a benzophenone-based compound, and an acetophenone-based compound.

<9> The curable composition of any one of <1> to <8>, further comprising a sensitizer.

<10> The curable composition of any one of <1> to <9>, further comprising a coloring agent.

<11> The curable composition of any one of <1> to <10>, further comprising an alkali-soluble resin.

<12> The curable composition of <11>, wherein the alkali-soluble resin is a (meth)acryl-based resin.

<13> The curable composition of <10>, wherein the coloring agent is an organic or inorganic pigment.

<14> The curable composition of <13>, wherein the coloring agent is a pigment having a primary particle diameter of 80 nm or less.

<15> The curable composition of <10>, wherein the coloring agent is a dye.

<16> The curable composition of any one of <10> or <13> to <15>, wherein the coloring agent is a coloring matter selected from a triallylmethane series, an anthraquinone series, an azomethine series, a benzylidene series, an oxonol series, a cyanine series, a phenothiazine series, a pyrrolopyrazoleazomethine series, a xanthene series, a phthalocyanine series, a benzopyran series, an indigo series a pyrazoleazo series, an anilinoazo series, a pyrazolotriazoleazo series, a pyridoneazo series, and an anthrapyridone series.

<17> The curable composition of any one of <10> or <13> to <16>, wherein the curable composition contains at least one kind of compounds represented by the formulas (III) to (V) as the coloring agent.

(III)

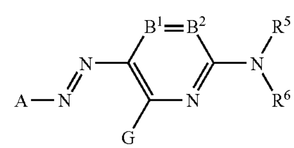

[In the formula (III), A represents an aryl group, or a residue of a 5- to 6-membered aromatic heterocycle diazo component A-$NH_2$, $B^1$ and $B^2$ each independently represent —$CR^3$═, —$CR^4$═, or a nitrogen atom, provided that $B^1$ and $R^2$ do not represent a hydrogen atom at the same time, $R^5$ and $R^6$ each independently represent a hydrogen atom or a substituent G, $R^3$ and $R^4$ each independently represent a hydrogen atom or a substituent, and $R^3$ and $R^4$, and/or $R^5$ and $R^6$ may be bond to each other to form a 5- or 6-membered ring]

(IV)

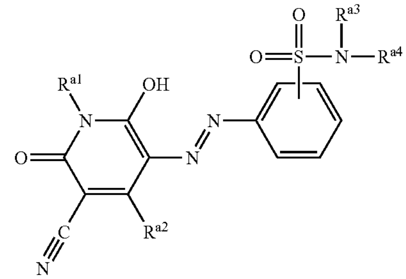

[In the formula (IV), $R^{a1}$, $R^{a3}$ and $R^{a4}$ each independently represent a hydrogen atom, an alkyl group of a carbon number of 1 to 21, an alkenyl group of a carbon number of 2 to 21, an aryl group of a carbon number of 6 to 21, or an aralkyl group of a carbon number of 7 to 21, or $R^{a3}$ and $R^{a4}$ may be taken together with a nitrogen atom to which they bind, to form a heterocycle, and $R^{a2}$ represents an alkyl group of a carbon number of 1 to 10, a methoxymethyl group, or a trifluoromethyl group]

(V)

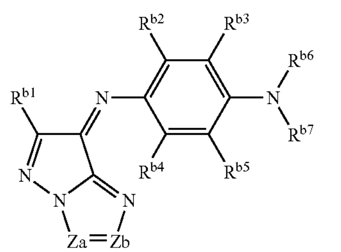

[In the formula (V), $R^{b1}$ represents a hydrogen atom or a substituent, $R^{b2}$ to $R^{b5}$ each independently represent a hydrogen atom or a substituent, $R^{b6}$ and $R^{b7}$ each independently represent an alkyl group, an alkenyl group, or an aryl group, $Z^a$ and $Z^b$ each independently represent —N═, or —C($R^{b8}$)═, $R^{b8}$ represents a hydrogen atom, an alkyl group, an aryl group, or a heterocycle group, $R^{b2}$ and $R^{b3}$, $R^{b3}$ and $R^{b6}$, $R^{b4}$ and $R^{b5}$, $R^{b5}$ and $R^{b7}$ and/or $R^{b6}$ and $R^{b7}$ may be taken together to each independently form a 5-membered, 6-membered, or 7-membered ring]

<18> The curable composition of any one of <10> or <13> to <17>, wherein a mass ratio of the coloring agent in a solid content of the curable composition is 20% by mass or more.

<19> The curable composition of any one of <10> or <13> to <17>, wherein a mass ratio of the coloring agent in a solid content of the curable composition is 30% by mass or more.

<20> A color filter, characterized in that it has a colored pattern using the curable composition of any one of <1> to <19> on a support.

<21> The color filter of <20>, wherein a film thickness of the color filter is 2.0 μm or less.

<22> The color filter of <20>, wherein a film thickness of the color filter is 1.0 μm or less.

<23> The color filter of <20>, wherein a film thickness of the color filter is 0.7 μm or less.

<24> A method for manufacturing a color filter, the method comprising: coating the curable composition of any one of <1> to <19> to form a colored curable composition layer on or above a support; exposing the colored curable composition layer to light through a mask; and developing the colored curable composition layer after exposure to form a colored pattern.

This manufacturing method, if necessary, may comprise a step of curing the pattern by heating and/or light exposure, or may repeat these steps plural times. Alternatively, by changing the coloring matter, a color filter having a colored pattern consisting of plural kinds of colors may be formed.

EXAMPLES

The first aspect according to the present invention will be further specifically explained below, however the aspect is not restricted to the following Examples. Unless otherwise specified, "%" and "part" are based on mass.

Example 1

<1-1. Kneading Dispersing Treatment of Pigment

First, the following respective components were kneading dispersing-treated with a double roll.

| | |
|---|---|
| C.I.Pigment Red 254 | 100 parts by mass |
| C.I.Pigment Red 177 | 40 parts by mass |
| Resin solution (benzyl methacrylate/methacrylic acid/hydroxyethyl methacrylate copolymer, molar ratio; 80/10/10, Mw: 10000, solvent: propylene glycol methyl ether acetate 60%, resin solid content concentration: 40%) | 60 parts by mass |
| Solvent: Propylene glycol methyl ether acetate | 140 parts by mass |

The resulting kneaded material was ground, a dispersant: (trade name: EFKA-46) was added at 10% relative to the pigment, propylene glycol monomethyl ether acetate was added so that a pigment concentration became 15%, and this was dispersed with a beads mill (Dyno mill: dispersing machine manufactured by Shinmaru Enterprises) to obtain a pigment dispersion R.

<1-2. Preparation of Colored Curable Composition>

[Colored Curable Composition 1]

| | |
|---|---|
| Pigment dispersion R (pigment concentration 15 wt %) [(C)Component] | 150 parts |
| Dipentaerythritol hexaacrylate [(A) component] | 10 parts |
| Isocyanurate compound M1 [(E) component] | 5 parts |
| 2,2'-Bis(O-chlorophenyl)-4,4',5,5'-tetraphenylbiimidazole[(B) component] | 2.0 parts |
| Michler's ketone | 0.6 parts |
| Mercaptobenzothiazole | 0.6 parts |
| Methacryloylpropyltrimethoxysilane [silane coupling agent] | 0.6 parts |
| Benzyl methacrylate/methacrylic acid = 80/20 molar ratio [Alkali-soluble resin: (D) component] | 8 parts |
| Hydroquinone monomethyl ether | 0.005 parts |
| Propylene glycol monomethyl ether acetate | 100 parts |

Examples 2 to 8

According to the same manner as that of Example 1 except that each compound used in the colored curable composition 1 of Example 1 was changed as described in the following Table 1, curable compositions of Examples 2 to 8 were obtained.

TABLE 1

| Component of curable composition | | Example 1 | Example 2 | Example 3 | Example 4 | Example 5 | Example 6 | Example 7 | Example 8 |
|---|---|---|---|---|---|---|---|---|---|
| Pigment dispersion A | (C) | 150 parts | 150 parts | 150 parts | 150 parts | 150 parts | 150 parts | 150 parts | 150 parts |
| Dipentaerythritol hexaacrylate | (A) | 10 parts | 10 parts | 10 parts | 10 parts | 10 parts | 10 parts | 10 parts | 10 parts |

TABLE 1-continued

| Component of curable composition | | Example 1 | Example 2 | Example 3 | Example 4 | Example 5 | Example 6 | Example 7 | Example 8 |
|---|---|---|---|---|---|---|---|---|---|
| M1 | (E) | 5 parts | — | — | — | — | — | 5 parts | 5 parts |
| M2 | | — | 5 parts | — | — | — | — | — | — |
| M3 | | — | — | 5 parts | — | — | — | — | — |
| M4 | | — | — | — | 5 parts | — | — | — | — |
| M5 | | — | — | — | — | 5 parts | — | — | — |
| M6 | | — | — | — | — | — | 5 parts | — | — |
| 2,2'-Bis(O-chlorophenyl)-4,4',5,5'-tetraphenylimidazole | (B) | 2 parts | — | — | — | 2 parts | 2 parts | 2 parts | 2 parts |
| Compound B | | — | — | — | — | — | — | 0.6 parts | 0.6 parts |
| Michler's ketone | | 0.6 parts | — | — | 0.8 parts | — | — | — | — |
| Thioxanthone | | | — | — | — | 0.6 parts | — | — | — |
| Coumarin | | | — | — | — | | 0.6 parts | — | — |
| Mercaptobenzothiazole | | 0.6 parts | — | — | — | 0.6 parts | 0.6 parts | 0.6 parts | — |
| Compound C | | — | — | — | — | — | — | — | 0.6 parts |
| 4-[o-Bromo-p-N,N-di(ethoxycarbonyl) aminophenyl]2,6-di(trichloromethyl)-S-triazine | (B) | — | 3.2 parts | — | — | — | — | — | — |
| Irgacure 369 | | — | — | — | 2.4 parts | — | — | — | — |
| Irgacure 907 | | — | — | 3.2 parts | | — | — | — | — |
| Methacryloylpropyl-trimethoxysilane | (F) | 0.6 parts | 0.6 parts | 0.6 parts | 0.6 parts | 0.6 parts | 0.6 parts | 0.6 parts | 0.6 parts |
| Alkali-soluble resin (BzMA/MAA = 8/2) | (D) | 8 parts | 8 parts | 8 parts | 8 parts | 8 parts | 8 parts | 8 parts | 8 parts |
| Hydroquinone monomethyl ether | Solvent | 0.005 parts | 0.005 parts | 0.005 parts | 0.005 parts | 0.005 parts | 0.005 parts | 0.005 parts | 0.005 parts |
| Propylene glycol monomethyl ether acetate | | 100 parts | 100 parts | 100 parts | 100 parts | 100 parts | 100 parts | 100 parts | 100 parts |

Details of the (E) component described in Table 1 are as follows:

Synthesis Example 1

Synthesis of M1

M1 is a reaction product of an alcohol compound (MA-2), (MA-3) and an isocyanate series (MU-22).

After MA-2 (0.1 mol) and MA-3 (0.2 mol) were dissolved in 100 ml of acetonitrile, 100 mg of bismuth tris(2-ethylhexanoate) (trade name: Neostan U-600 (manufactured by Nitto Chemical Industry Co., Ltd.)) was added to prepare a uniform solution. The solution was heated to 60° C., and 10 ml of a solution of MU-22 (0.1 mol) in acetonitrile was added dropwise. After addition, the mixture was stirred at 55° C. to 65° C. for 8 hours. After completion of the reaction, the reaction solution was cooled to room temperature, a solvent was distilled off, and the residue was purified by silica gel column chromatography to obtain (M1) which is an (E) compound having a partial structure of urethane, amide or urea in a molecule.

Synthesis Example 2

Synthesis of M2

M2 is a condensation reaction product of an alcohol compound (MA-8) and an isocyanate-based compound (MW-27).

After MA-8 (0.2 mole) was dissolved in 100 ml of acetonitrile, 100 mg of bismuth tris(2-ethylhexanoate) (trade name: Neostan U-600 (manufactured by Nitto Chemical Industry Co., Ltd.)) was added to a uniform solution. The solution was heated to 60° C., and 10 ml of a solution of MU-27 (0.1 mol) in acetonitrile was added dropwise. After addition, the mixture was stirred at 55° C. to 65° C. for 8 hours. After completion of the reaction, the reaction solution was cooled to room temperature, a solvent was distilled off, and the residue was purified by silica gel column chromatography to obtain (M2) which is an (E) component.

Similarly, the following compounds were reacted to obtain (M3) to (M6)

M3: Reaction product of an amine compound (A-2) and an isocyanate-based compound (MU-27)

M4: Reaction product of an amine compound (A-2) and a halogen-containing compound (C-2)

M5: Reaction product of an alcohol compound (MA-1) and an isocyanate-based compound (MU-21)

M6: Reaction product of an alcohol compound (MA-11) and an isocyanate-based compound (MU-23).

Comparative Example 1

Preparation of Curable Composition

| | |
|---|---|
| The pigment dispersion R (pigment concentration 15 wt %) [(C) component] | 150 parts |
| Dipentaerythritol hexaacrylate [(A) component] | 15 parts |
| 4-{o-Bromo-p-N,N-di(ethoxycarbonyl)aminophenyl} 2,6-di(trichloromethyl)-S-triazine [(B) component] | 3.2 parts |
| Benzyl methacrylate/methacrylic acid = 70:30 molar ratio, 50% PGMEA solution [Alkali-soluble resin: (D) component] | 8 parts |
| Hydroquinone monomethyl ether | 0.005 parts |
| PGMEA (propylene glycol monomethyl ether acetate) | 100 parts |

According to the above formulation, a curable composition of Comparative Example 1 was prepared as in Example 1.

Comparative Example 2

Preparation of Curable Composition

| | |
|---|---|
| [The pigment dispersion R (pigment concentration 15 wt %) [(C) component] | 150 parts |
| Dipentaerythritol hexaacrylate [(A) component] | 15 parts |
| Irgacure 369 [(B) component] | 2.4 parts |
| Michler's ketone | 0.8 parts |
| Benzyl methacrylate/methacrylic acid = 70:30 molar ratio, 50% PGMEA solution [Alkali-soluble resin: (D) component] | 8 parts |
| Hydroquinone monomethyl ether | 0.005 parts |
| PGMEA (propylene glycol monomethyl ether acetate) | 100 parts |

According to the above formulation, a curable composition of Comparative Example 2 was prepared as in Example 1.

Comparative Example 3

Preparation of Curable Composition

| | |
|---|---|
| [The pigment dispersion R (pigment concentration 15 wt %) [(C) component] | 150 parts |
| Dipentaerythritol hexaacrylate | 15 parts |
| 2,2'-Bis(O-chlorophenyl)-4,4',5,5'-tetrephenylbiimidazole | 2.0 parts |
| Michler's ketone | 0.6 parts |
| Mercaptobenzothiazole | 0.6 parts |
| Alkali-soluble resin (benzyl methacrylate/methacrylic acid = 70/30 molar ratio, 50% PGMEA solution) | 8 parts |
| Hydroquinone monomethyl ether | 0.005 parts |
| PGMEA (propylene glycol monomethyl ether acetate) | 100 parts |

According to the above formulation, a curable composition of Comparative Example 3 was prepared as in Example 1.

[2. Preparation of Color Filter]

<2-1. Formation of Curable Composition Layer>

Each curable composition obtained as described above was formulated into a resist solution, the solution was slit-coated on a 550 mm×650 mm glass substrate under the following condition, this was maintained under that state for 10 minutes, and subjected to vacuum drying and prebaking (100° C., 80 seconds) to form a curable composition coated film (curable composition layer).

(Slit Coating Condition)
Gap of opening at coating head tip: 50 μm
Coating rate: 100 mm/second
Clearance between substrate and coating head: 150 μm
Coating thickness (dry thickness): 2 μm
Coating temperature: 23° C.

<2-2. Light Exposure, Development>

Thereafter, using a 2.5 kw ultrahigh-pressure mercury lamp, the photocurable coated film was exposed to light in a pattern shape using a test photomask having a line width 20 μm and, after exposure, an entire surface of the coated film was covered with a 10% aqueous solution of an organic developer (trade name: CDK-1, manufactured by Fuji Film Arch), followed by allowing to stand for 90 seconds.

<2-3. Heat Treatment>

After allowing to stand, pure water was sprayed in a shower manner to wash the developer off, and such the coated film which had been subjected to photocuring treatment and developing treatment was heated in an oven at 220° C. for 1 hour (post-baking). Thereby, a colored resin film (color filter) was formed on the glass substrate.

[3. Assessment of Color Filter]

Storage stability of the above-prepared colored curable composition coating solution, and a light exposure sensitivity, substrate adhesion, developability, and a pattern cross-sectional shape of the curable composition coated film (colored layer) formed on the glass substrate using the colored curable composition were assessed as follows. Results are shown in Table 1.

<3-1. Light Exposure Sensitivity of Coated Film (Colored Layer)>

The color filter was exposed to light by changing an exposure amount in a range of 10 to 200 mJ/cm$^2$, and a light exposure amount at which a pattern line width after post-baking becomes 20 μm was assessed as a light exposure sensitivity. A smaller value of the light exposure sensitivity shows a higher sensitivity.

<3-2. Developability, Pattern Cross-Sectional Shape, Substrate Adhesion>

A substrate surface and a cross-sectional shape after post-baking were confirmed by an ordinary method with a light microscope, and SEM-photograph observation.

The presence or the absence of a residue on a not light-irradiated region (unexposed part) in a light exposing step was observed, and developability was assessed.

<3-2-1. Developability>

A: No residue was confirmed at an unexposed part.
B: A residue was slightly confirmed at an unexposed part, however this was at a level of no practical program.
C: A residue was remarkably confirmed at an unexposed part.

A cross-sectional shape of the formed pattern was observed. In a pattern cross-sectional shape, a forward taper is most preferable, and a rectangle is secondly most preferable. A reverse taper is not preferable.

For assessing substrate adhesion, whether a pattern defect is generated or not was observed. These assessment items were assessed based on the following criteria.

<3-2-2. Substrate Adhesion>

A: No pattern defect was observed.
B: Little pattern defect was observed however a partial damage was observed.
C: A pattern defect was remarkably observed.

<3-2-3. Pattern Cross-Sectional Shape>

A: A taper angle was in a range of 30 to 70 degree (forward taper).
B: A taper angle was in a range of 70 to 90 degree (forward taper).
C: A taper angle was 90 degree (rectangle).
D: A taper angle exceeded 90 degree (reverse taper).

TABLE 2

| | Developability | Substrate adhesion | Pattern cross-sectional shape | Light exposure sensitivity (mJ/cm$^2$) |
|---|---|---|---|---|
| Example 1 | A | A | B | 50 |
| Example 2 | A | B | C | 90 |
| Example 3 | A | B | C | 140 |
| Example 4 | A | B | C | 100 |
| Example 5 | A | A | B | 60 |
| Example 6 | A | B | B | 70 |

TABLE 2-continued

| | Developability | Substrate adhesion | Pattern cross-sectional shape | Light exposure sensitivity (mJ/cm$^2$) |
|---|---|---|---|---|
| Example 7 | A | A | A | 45 |
| Example 8 | A | A | A | 35 |
| Comparative example 1 | A | C | D | 120 |
| Comparative example 2 | A | C | D | 150 |
| Comparative example 3 | A | A | D | 50 |

As apparent in Table 2, the color filter in which a colored pattern was formed using the curable composition of the invention can form a pattern at a high sensitivity, is excellent in developability, and pattern forming property, and is suitable as a color filter.

The second aspect according to the invention will be further specifically explained below by way of Examples.

[Synthesis Example of Polyfunctional Acrylate Compound Represented by the Formula (I) of the Invention]

A specific method of synthesizing the exemplified Compound (I-1) is shown below. Other functional acrylates according to the invention can be synthesized by a similar scheme. A method of synthesizing polyfunctional acrylate is not restricted to the following method.

Synthesis Example 3

Synthesis of Exemplified Compound (I-1)

To 1.5 g (0.0136 mol) of hydroquinone was added 20 ml of acetonitrile to dissolve it, and 60 mg (0.095 mmol) of bismuth tris(2-ethylhexanoate) (trade name: Neostan U-600 (manufactured by Nitto Chemical Industry Co., Ltd.)) was added to obtain a uniform solution. The solution was heated to 60° C., and 10 ml of a solution of 6.72 g (0.028 mol) of 1,1-(bisacryloyloxymethyl)ethyl isocyanate (trade name: Karenz BEI (manufactured by Showa Denko K.K.)) in acetonitrile was added dropwise. After completion of addition, the mixture was stirred at 55° C. to 65° C. for 8 hours. After completion of the reaction, the reaction solution was cooled to room temperature, 30 ml of ethyl acetate was added, 50 ml of n-hexane was added, and a precipitated colorless crystal was filtered off. To this colorless crystal was added 30 ml, and a procedure of adding 50 ml of n-hexane, and filtering a precipitated colorless crystal off was further repeated two times, to obtain 1.2 g (0.0216 mol (yield: 48%)) of Compound (I-1). Hydroquinone manufactured by (Wako Pure Chemical Industries, Ltd.) was used.

Regarding the above-obtained Compound (I-1), a structure was confirmed by NMR. $^1$H-NMR (400 MHz, solvent: heavy chloroform, standard substance: tetramethylsilane) δ7.10 (4H, s), 6.48 ppm (4H, dd), 6.17 ppm (2H, d), 6.13 ppm (2H, d), 5.91 ppm (4H, dd), 5.45 ppm (2H, brs), 4.44 ppm (4H, d), 4.37 ppm (4H, d), 1.50 ppm (6H, s).

Synthesis Example 4

Synthesis of Exemplified Compound (I-3)

To 2.61 g (0.010 mol) of 1,3,5-tris(2-hydroxyethyl)-cyanuric acid was added 30 ml of acetonitrile to dissolve it, and 130 mg (0.20 mmol) of bismuth tris(2-ethylhexanoate) (trade name: Neostan U-600 (manufactured by Nitto Chemical Industry Co., Ltd.)) was added to obtain a uniform solution. The solution was heated to 60° C., and 10 ml of a solution of 7.53 g (0.032 mol) of 1,1-(bisacryloyloxymethyl)ethyl isocyanate (trade name: Karenz BEI (manufactured by Showa Denko K.K.)) in acetonitrile was added dropwise. After completion of addition, the mixture was stirred at 55° C. to 65° C. for 6 hours. After completion of the reaction, this reaction solution was concentrated under reduced pressure, and purified by silica gel column chromatography (eluent: ethyl acetate/n-hexane=1/1) to obtain 7.83 g (0.008 mol (yield: 80%)) of Compound (I-3). 1,3,5-Tris(2-hydroxyethyl)-cyanuric acid manufactured by Aldrich was used.

Regarding the above obtained Compound (I-3), a structure was confirmed by $^1$H-NMR (400 MHz, solvent: heavy chloroform, standard substance: tetramethylsilane) δ 6.42 ppm (6H, dd), 6.14 ppm (3H, d), 6.12 ppm (3H, d), 5.87 ppm (6H, dd), 5.43 ppm (3H, brs), 4.36 ppm (6H, d), 4.29 ppm (6H, t), 4.28 ppm (6H, d), 4.16 ppm (6H, t), 1.40 ppm (9H, s).

Synthesis Example 5

Synthesis of Exemplified Compound (I-5)

To 2.5 g (0.0184 mol) of pentaerythritol was added 30 ml of acetonitrile to dissolve it, and 125 mg (0.19 mmol) of bismuth tris(2-ethylhexanoate) (trade name: Neostan U-600 (manufactured by Nitto Chemical Industry Co., Ltd.)) was added to obtain a uniform solution. The solution was heated to 60° C., and 10 ml of a solution of 18.2 g (0.077 mol) of 1,1-(bisacryloyloxymethyl)ethyl isocyanate (trade name: Karenz BEI (manufactured by Showa Denko K.K.)) in acetonitrile was added dropwise. After completion of addition, the mixture was stirred at 55° C. to 65° C. for 6 hours. After completion of the reaction, this reaction solution was concentrated under reduced pressure, and purified by silica gel column chromatography (eluent: ethyl acetate/n-hexane=1/1) to obtain 15.8 g (0.0144 mol (yield: 78%)) of Compound (I-5). Pentaerythritol manufactured by Aldrich was used.

Regarding the above obtained Compound (I-5), a structure was confirmed by NMR. $^1$H-NMR (400 MHz, solvent: heavy chloroform, standard substance: tetramethylsilane) δ 6.44 ppm (8H, dd), 6.17 ppm (4H, d), 6.13 ppm (4H, d), 5.89 ppm (8H, dd), 5.22 ppm (4H, brs), 4.37 ppm (8H, d), 4.30 ppm (8H, d), 4.16 ppm (8H, s), 1.42 ppm (12H, s).

Synthesis Example 6

Synthesis of Exemplified Compound (I-6)

To 1.0 g (0.0039 mol) of dipentaerythritol was added 15 ml of acetonitrile to dissolve it, and 60 mg (0.094 mmol) of bismuth tris(2-ethylhexanoate) (trade name: Neostan U-600 (manufactured by Nitto Chemical Industry Co., Ltd.)) was added to obtain a uniform solution. The solution was heated to 60° C., and 5 ml of a solution of 5.38 g (0.0243 mol) of 1,1-(bisacryloyloxymethyl)ethyl isocyanate (trade name: Karenz BEI (manufactured by Showa Denko K.K.)) in acetonitrile was added dropwise. After completion of addition, the mixture was stirred at 55° C. to 65° C. for 6 hours. After completion of the reaction, this reaction solution was concentrated under reduced pressure, and purified by silica gel column chromatography (eluent: ethyl acetate/n-hexane=1/1) to obtain 4.0 g (0.0023 mol (yield: 59%)) of Compound (I-6). Dipentaerythritol manufactured by Aldrich was used.

Regarding the above obtained Compound (I-6), a structure was confirmed by NMR. $^1$H-NMR (400 MHz, solvent: heavy chloroform, standard substance: tetramethylsilane) δ6.42 ppm (12H, dd), 6.16 ppm (6H, 4), 6.12 ppm (6H, d), 5.87 ppm (12H, dd), 5.47 ppm (6H, brs), 4.38 ppm (12H, d), 4.32 ppm (12H, d), 4.03 ppm (12H, s), 3.31 ppm (4H, s), 1.42 ppm (18Hs).

Example 9

A1. Preparation of Curable Composition

Herein, an example in which a curable composition containing a coloring agent (pigment) was prepared for forming a color filter for use in a liquid crystal display element will be explained

[A1-1. Preparation of Pigment Dispersion]

A mixture of 40 parts by mass of a 100/60 (mass ratio) mixture primary particle diameter 32 nm) of C.I.Pigment Green 36 and C.I.Pigment Yellow 150 as a pigment, 50 parts by mass (about 22.6 parts by mass in terms of solid content) of BYK2001 (Disperbyk: manufactured by Big, Chemie (BYK), solid content concentration 45.1% by mass) as a dispersant, and 110 parts by mass of ethyl 3-ethoxypropionate as a solvent was mixed and dispersed with a beads mill for 15 hours to prepare a pigment dispersion (P1).

[A1-2. Preparation of Curable Composition (Coating Solution)]

Using the dispersion-treated pigment dispersion P1, components were stirred and mixed at the following composition ratio to prepare a curable composition solution.

| | |
|---|---|
| Preparation of liquid composition Pigment dispersion (P1) | 600 parts by mass |
| 2,2'-Bis(2-chlorophenyl)-4,4',5,5'-tetraphenyl-1,2'-biimidazole [photopolymerization initiator] | 30 parts by mass |
| Dipentaerythritol hexaacrylate [Ethylenically unsaturated bond-containing compound] | 50 parts by mass |
| Exemplified Compound (I-6) | 10 parts by mass |
| Alkali-soluble resin (Benzyl methacrylate/methacrylic acid/hydroxyethyl methacrylate copolymer, molar ratio: 80/10/10, Mw: 10000) | 10 parts by mass |
| Solvent: PGME | 900 parts by mass |
| 3-Methacryloxypropyltrimethoxysilane | 1 part by mass |
| Sensitizer (following compound, sensitizer α) | 12 parts by mass |
| Cosensitizer: 2-mercaptobenzimidazole | 12 parts by mass |

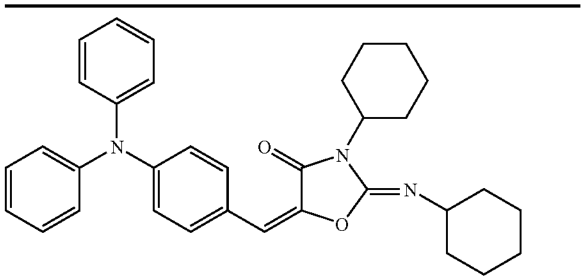

Sensitizer α

A2. Preparation of Color Filter

A2-1. Formation of Curable Composition Layer

The curable composition containing the above pigment was formulated into a resist solution, hie solution was slit-coated on a 550 mm×650 mm glass substrate under the following condition, and this was maintained under that state for 10 minutes, and subjected to vacuum drying and prebaking (100° C., 80 seconds) to form a curable composition coated film (curable composition layer).

[Slit Coating Condition]

Gap of opening at coating head tip: 50 μm
Coating rate 100 mm/second
Clearance between substrate and coating head: 150 μm
Coating thickness (dry thickness): 1.7 μm
Coating temperature: 23° C.

A2-2. Light Exposure, Development

Thereafter, using a 2.5 kw ultrahigh-pressure mercury lamp, the colored curable composition coated film was exposed to light in a pattern manner using a test photomask having a line width 20 μm and, after exposure, an entire surface of the coated film was covered with a 10% aqueous solution of an organic developer (trade name: CD, manufactured by Fuji Film Arch), followed by allowing to stand for 60 seconds.

A2-3. Heat Treatment

After allowing to stand, pure water was sprayed in a shower manner to wash the developer off, and such the coated film which had been subjected to photocuring treatment and developing treatment was heated in an oven at 220° C. for 1 hour (post-baking). Thereby, a colored curable composition film (color filter) was formed on the glass substrate.

A3. Performance Assessment

Storage stability of the above-prepared colored curable composition coating solution, and a light exposure sensitivity, substrate adhesion, developability, and a pattern cross-sectional shape of the coated film (colored curable composition layer) formed on the glass substrate using the colored curable composition were assessed as follows. Results are shown in Table 3 (change).

A3-1. Coating Solution Storage Stability

After the coating solution was stored at room temperature for one month, a viscosity of the solution was measured, and assessed according to the following determination criteria.

<Determination Criteria>

A: No increase in a viscosity was recognized.
B: Increase in a viscosity of 5% or more and less than 10% was recognized.
C: Increase in a viscosity of 10% or more was recognized.

A3-2. Light Exposure Sensitivity of Colored Curable Composition Layer Coated

The color filter was exposed to light by changing an exposure amount in a range of 10 to 100 mJ/cm$^2$, and a light exposure amount at which a pattern line width after post-baking becomes 20 μm was assessed as a light exposure sensitivity. A smaller value of the light exposure sensitivity shows a higher sensitivity.

A3-3. Developability, Pattern Cross-Sectional Shape, Substrate Adhesion

A substrate surface and a cross-sectional shape after post-baking were confirmed by an ordinary method with a light microscope, and SEM-photograph observation.

The presence or the absence of a residue on a not light-irradiated region (unexposed part) in a light exposing step was observed, and developability was assessed.

<Developability>

A: No residue was confirmed at an unexposed part.
B: A residue was slightly confirmed at an unexposed part, however this was at a level of no practical problem.
C: A residue was remarkably confirmed at an unexposed part.

A cross-sectional shape of the formed pattern was observed. In a pattern cross-sectional shape, a forward taper is most preferable, and a rectangle is secondly most preferable. A reverse taper is not preferable.

For assessing substrate adhesion, whether a pattern defect is generated or not was observed. These assessment items were assessed based on the following criteria.

<Substrate Adhesion>

A: No pattern defect was observed.

B: Little pattern defect was observed, however a partial damage was observed.

C: A pattern defect was remarkably observed.

Examples 10 to 23

According to the same manner as that of Example 9 except that the exemplified Compound (I-6) was replaced with exemplified Compounds shown in the following Table 3 in the curable composition of Example 9, colored patterns were obtained, and assessed as in Example 9. Results are shown in Table 3.

Comparative Examples 4, 5

According to the same manner as that of Example 9 except that the exemplified Compound (I-6) was replaced with compounds shown in Table 3 in the curable composition of Example 9, colored patterns were obtained, and assessed as in Example 9. Results are shown in Table 3.

From results of Table 3, it is seen that the colored curable compositions of Examples using the polyfunctional acrylate compound according to the invention are excellent in storage stability in its solution state as compared with Comparative Examples using other polyfunctional acrylate compounds, and are excellent in a light exposure sensitivity, developability, substrate adhesion, and a pattern cross-sectional shape when this colored curable composition is used.

Example 24

An example in which a curable composition containing a coloring agent (pigment) was prepared for forming a color filter for use in a solid-state image pickup element will be explained.

[B1. Preparation of Resist Solution]

Components according to the following formulation were mixed, and dissolved to prepare a resist solution.

<Resist Solution Formulation>

| | |
|---|---|
| Propylene glycol monomethyl ether acetate (PGMEA: solvent) | 19.20 parts by mass |
| Ethyl lactate | 36.67 parts by mass |

TABLE 3

| | Monomer | Storage stability | Light exposure sensitivity ($mJ/cm^2$) | Developability | Substrate adhesion | Pattern cross-sectional shape ($mJ/cm^2$) |
|---|---|---|---|---|---|---|
| Example 9 | Exemplified compound (I-6) | A | 35 | A | A | Forward taper |
| Example 10 | Exemplified compound (I-3) | A | 40 | A | A | Forward taper |
| Example 11 | Exemplified compound (I-4) | A | 55 | A | B | Forward taper |
| Example 12 | Exemplified compound (I-5) | A | 40 | A | A | Forward taper |
| Example 13 | Exemplified compound (I-12) | A | 40 | A | A | Forward taper |
| Example 14 | Exemplified compound (I-16) | A | 45 | A | A | Forward taper |
| Example 15 | Exemplified compound (I-20) | A | 45 | B | A | Forward taper |
| Example 16 | Exemplified compound (I-22) | A | 50 | B | A | Forward taper |
| Example 17 | Exemplified compound (I-27) | A | 60 | A | A | Rectangle |
| Example 18 | Exemplified compound (I-30) | A | 35 | B | A | Forward taper |
| Example 19 | Exemplified compound (I-33) | A | 60 | A | B | Rectangle |
| Example 20 | Exemplified compound (I-34) | A | 45 | A | A | Forward taper |
| Example 21 | Exemplified compound (I-40) | A | 35 | A | B | Rectangle |
| Example 22 | Exemplified compound (I-44) | A | 45 | A | A | Forward taper |
| Example 23 | Exemplified compound (I-56) | A | 55 | A | A | Rectangle |
| Comparative example 4 | Pentaerythritol tetraacrylate | B | 75 | C | C | Reverse taper |
| Comparative example 5 | Dipentaerythritol hexaacrylate | B | 65 | B | C | Reverse taper |

-continued

| | |
|---|---|
| Binder polymer [40% PGMEA solution of benzyl methacrylate/methacylic acid/methacrylic acid-2-hydroxyethyl copolymer (molar ratio = 60/22/18)] | 30.51 parts by mass |
| Dipentaetythritol hexaacrylate [(C) Ethylenically unsaturated bond-containing compound] | 12.20 parts by mass |
| Polymerization inhibitor (p-methoxyphenol) | 0.0061 parts by mass |
| Fluorine surfactant (F-475, manufactured by Dainippon Ink and Chemicals, Incorporated) | 0.83 parts by mass |
| Trihalomethyltriazine-based photopolymerization initiator (TAZ-107, manufactured by Midori Chemical Co., Ltd.) [(B) photopolymerization intiator] | 0.586 parts by mass |

[B2. Preparation of Silicon Substrate with Undercoating Layer]

A six-inch silicon wafer was heat-treated in an oven at 200° C. for 30 minutes. Then, the resist solution was coated on this silicon wafer so that a dry film thickness became 2 μm, and this was further heated to dry in an oven at 220° C. for 1 hour to form an undercoating layer, to obtain a silicon wafer substrate with an undercoating layer.

[B3. Preparation of Pigment Dispersion]

A mixture of 40 parts by mass of a 70/30 (mass ratio) (primary particle diameter 32 nm) of C.I.Pigment Green 36 and C.I.Pigment Yellow 139 as a pigment, 50 parts by mass (about 22.6 parts by mass in terms of solid content) of BYK2001 (Disperbyk; manufactured by Big Chemie (BYK), solid content concentration 45.1% by mass) as a dispersant and 110 parts by mass of propylene glycol monomethyl ether as a solvent was mixed and dispersed with a beads mill for 15 hours to prepare a pigment dispersion (P1).

[B4. Preparation of Curable Composition (Coating Solution)]

Using the dispersion-treated pigment dispersion P1, components were stirred and mixed according to the following composition ratio to prepare a curable composition solution.

| | |
|---|---|
| Preparation of liquid composition Pigment dispersion (P1) | 600 parts by mass |
| Oxime-based photopolymerization initiator [photopolymerization initiator] (CGI-124, manufactured by Ciba Specialty Chemicals) | 30 parts by mass |
| TO-1382 (manufactured by Toagosei CO., Ltd.) [ethylenically unsaturated bond-containing compound] | 61 parts by mass |
| Exemplified Compound (I-6) | 8 parts by mass |
| Solvent: PGMEA | 900 parts by mass |
| 3-Methacryloxypropyltrimethoxysilane | 1 part by mass |

[B5. Manufacturing and Assessment of Color Filter Resulting from Colored Photosensitive Resin Composition]

—Formation of Pattern and Assessment of Sensitivity—

The B4. curable composition (coating solution) as prepared above was coated on the undercoating layer of the silicon wafer substrate with the undercoating layer obtained in B2. to form a coated film (colored curable composition layer). And, this was heat-treated (pre-baking) for 120 seconds using a hot plate at 100° C. so that a dry film thickness of this coated film became 0.7 μm.

Then, using an i-ray stepper light exposing apparatus FPA-3000i5+ (manufactured by Canon Inc.), light exposure was performed at various exposure amounts of 50 to 1600 mJ/cm$^2$ through an Island pattern mask having a pattern of 1.2 μm square at a wavelength of 365 nm.

Thereafter, the Irradiated silicon wafer substrate on which the coated film had been formed was placed on a horizontal rotation table of a spin shower developing machine (Model DW-30, manufactured by Chemitronics Co., Ltd.), and paddle development was performed eat 23° C. for 60 seconds using CD-2000 (manufactured by Fuji Film Electronics Materials Co., Ltd.) to form a colored pattern on a silicon wafer.

The silicon wafer substrate on which the colored pattern had been form was fixed on the horizontal rotation table in a vacuum chuck manner and, while the silicon wafer substrate was rotated at a rotation number of 50 r.p.m. with a rotation device, pure water was supplied in a shower manner through an ejection nozzle from a position above its rotation center to rinse-treat the substrate, followed by spray drying. Thereafter, using length measuring SEM "S-9260A" (manufactured by Hitachi High-Technologies Corporation), a size of the colored pattern was measured. An exposure amount at which a pattern line width becomes 1.2 μm was assessed as a light exposure sensitivity. A smaller value of a light exposure sensitivity shows a higher sensitivity. Results of measurement assessment are shown in the following Table 4.

The presence or the absence of a residue on a not light-irradiated region (unexposed part) in a light exposing step was observed, and developability was assessed.

<Developability>

A: No residue was confirmed at an unexposed part.

B: A residue was slightly confirmed at an unexposed part, however this was at a level of no practical problem.

C: A residue was remarkably confirmed at an unexposed part.

A cross-sectional shape of the formed pattern was observed. A pattern cross-sectional shape is preferably a rectangle, and a reverse taper is not preferable.

For assessing substrate adhesion, whether a pattern defect is generated or not was observed. These assessment items were assessed based on the following criteria.

<Substrate Adhesion>

A: No pattern defect was observed.

B: Little pattern defect was observed, however a partial damage was observed.

C: A pattern defect was remarkably observed.

In addition, for solution stability with time (storage stability), after the coating solution was stored at room temperature for one month, a viscosity of the solution was measured, and was assessed according to the following determination criteria.

<Determination Criteria>

A: No increase in a viscosity was recognized.

B: Increase in a viscosity of 5% or more and less than 10% was recognized.

C: Increase in a viscosity of 10% or more was recognized.

Examples 25 to 30

According to the same manner as that of Example 24 except that the exemplified Compound (I-6) was replaced with exemplified Compounds shown in the following Table in the curable composition of Example 24, colored patterns were obtained, and were assessed as in Example 24. Results are shown in Table 4.

Comparative Example 6

According to the same manner as that of Example 24 except that the exemplified Compound (I-6) was replaced with a compound shown in the following Table 4 in the curable composition of Example 24, a colored pattern was obtained, and was assessed as in Example 24. Results are summarized in Table 4.

TABLE 4

| | Monomer | Storage stability | Light exposure sensitivity (mJ/cm²) | Developability | Substrate adhesion | Pattern cross-sectional shape (mJ/cm²) |
|---|---|---|---|---|---|---|
| Example 24 | Exemplified compound (I-6) | A | 150 | A | A | Rectangle |
| Example 25 | Exemplified compound (I-1) | A | 250 | A | A | Rectangle |
| Example 26 | Exemplified compound (I-8) | A | 200 | A | A | Rectangle |
| Example 27 | Exemplified compound (I-10) | A | 150 | A | A | Rectangle |
| Example 28 | Exemplified compound (I-15) | A | 150 | B | A | Rectangle |
| Example 29 | Exemplified compound (I-17) | A | 250 | A | A | Rectangle |
| Example 30 | Exemplified compound (I-21) | A | 250 | A | A | Rectangle |
| Example 31 | Exemplified compound (I-6) | A | 400 | A | A | Rectangle |
| Example 32 | Exemplified compound (I-8) | A | 450 | A | A | Rectangle |
| Example 33 | Exemplified compound (I-9) | A | 400 | B | A | Rectangle |
| Example 34 | Exemplified compound (I-35) | A | 500 | A | A | Rectangle |
| Example 35 | Exemplified compound (I-43) | A | 550 | A | A | Rectangle |
| Example 36 | Exemplified compound (I-52) | A | 750 | A | B | Rectangle |
| Example 37 | Exemplified compound (I-55) | A | 650 | A | A | Rectangle |
| Example 38 | Exemplified compound (I-59) | A | 700 | A | B | Rectangle |
| Compraitive example 6 | Pentaerythritol tetraacrylate | A | 550 | B | B | Reverse taper |
| Comparative example 7 | Dipentaerythritol hexaacrylate | B | 1000 | B | C | Reverse taper |

Example 31

An example in which a curable composition containing a coloring agent (dye) was prepared for forming a color filter for use in a solid state pickup element will be explained below.

[C1. Preparation of Resist Solution and Manufacturing of Silicon Substrate with Undercoating Layer]

According to the same manner as that of Example 24 [B1. Preparation of resist solution], [B2. Manufacturing of silicon substrate with undercoating layer], a silicon substrate with an undercoating layer was made.

[C2. Preparation of Curable Composition (Coating Solution)]

Compounds according to the following formulation were mixed, and dissolved to prepare a colored curable composition.

| | |
|---|---|
| Cyclohexanone [Solvent] | 80 parts by mass |
| Following Compound A [Dye] | 6.0 parts by mass |
| Acid Red 57 [Dye] | 6.0 parts by mass |
| Dipenaterythritol hexacrylate [Ethylenically unsaturated bond-containing compound] | 4.0 parts by mass |
| Exemplified Compound (I-6) | 2.0 parts by mass |

-continued

| | |
|---|---|
| Oxime-based photopolymerization initiator [Photopolymerization initiator] (CGI-124, manufactured by Ciba Specialty Chemicals) | 2.0 parts by mass |

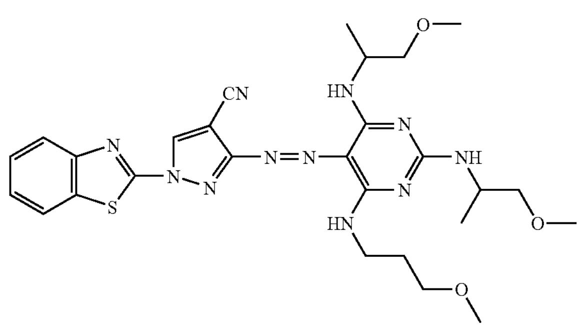

Compound A

[C3. Manufacturing and Assessment of Color Filter Resulting from Colored Curable Composition]

According to the same manner as that of the [B5. Manufacturing and assessment of color filter resulting from colored curable composition], manufacturing and assessment of the color filter were performed. Results are shown in the above Table 4.

Examples 32 to 38

According to the same manner as that of Example 31 except that the exemplified Compound (I-6) was replaced with exemplified Compounds shown in the above Table 4 in the curable composition of Example 31, colored patterns were obtained, and assessed as in Example 31. Results are shown in the above Table 4.

Comparative Example 7

According to the same manner as that of Example 31 except that the exemplified Compound (I-6) was replaced with compounds shown in the above Table 4 in the curable composition of Example 31, colored patterns were obtained, and assessed as in Example 31. Results are shown in the above Table 4.

From results of the above Table 4, it is seen that colored curable compositions of Examples using the polyfunctional acrylate compound according to the invention are excellent in storage stability in its solution state as compared with Comparative Examples using other functional acrylate and, further, are excellent in a light exposure sensitivity, developability, substrate, adhesion, and a pattern cross-sectional shape when this colored cured composition is used.

According to the first aspect according to the invention, a curable composition which, even when a coloring agent is contained at a high concentration, is excellent in film coating property, is cured at a high sensitivity, exhibits favorable pattern forming property, is wide in a latitude upon development, and is excellent in adhesion with a hard surface of a substrate, can be provided.

Further, according to the first aspect according to the invention, by using the curable composition of the invention, a color filter provided with a colored pattern, which is excellent in resolution and adhesion with a support, and a manufacturing method, which can manufacture the color filter at high productivity, can be provided.

According to the second aspect according to the invention, a curable composition which is cured at an extremely high sensitivity, and is also favorable in storage stability can be provided. Furthermore, according to the second aspect according to the invention, a color filter provided with a colored pattern of a desired cross-sectional shape, which exhibits a high sensitivity also in a curing system containing a coloring matter absorbing an active energy ray, is small in a development residue at an unexposed part, and is excellent in adhesion with a substrate at an exposed part, and a manufacturing method of the color filter which is excellent in productivity can be provided.

All publications, patent applications, and technical standards mentioned in this specification are herein incorporated by reference to the same extent as if each individual publication, patent application, or technical standard was specifically and individually indicated to be incorporated by reference.

What is claimed is:

1. A curable composition, comprising: a compound (A) having at least one ethylenically unsaturated double bond; a photopolymerization initiator (B); a coloring agent (C); an alkali-soluble resin (D); and a compound (E) having in the molecule a partial structure of urethane, amide, or urea, said compound (E) having an isocyanurate skeleton and being a reaction product of a compound having an isocyanate bond and an alcohol compound represented by the following formula (I'):

Formula (I')

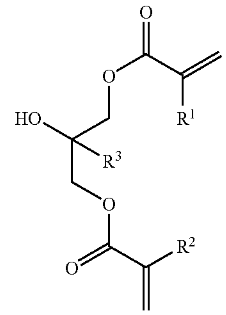

wherein in the formula (I'), $R^1$ and $R^2$ each independently represents a hydrogen atom or an alkyl group and $R^3$ represents an alkyl group, an alkoxy group, an allyl group, an aryl group, a functional group represented by the following formula (II'), or a functional group represented by the following formula (III'):

Formula (II')

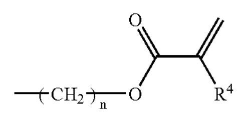

Formula (III')

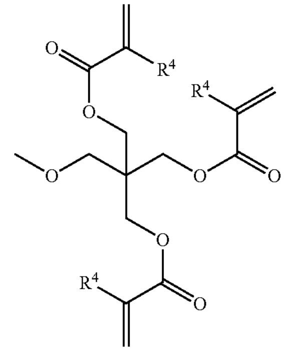

wherein in the formula (II'), n denotes an integer of 1 to 10 and, in the formula (II') and the formula (III'), $R^4$ represents a hydrogen atom or an alkyl group and, in the formula (III'), plural $R^4$s present in the molecule may be the same or different from each other, and wherein the molecular weight of the compound (E), having in the molecule a partial structure of urethane, amide or urea, is 100 to 5000.

2. The curable composition according to claim 1: wherein the content of the compound (E), having a partial structure of urethane, amide or urea, relative to 100 parts by mass of the ethylenically unsaturated double bond compound (A), is 5 parts by mass or more and less than 25 parts by mass.

3. The curable composition according to claim 1, wherein the photopolymerization initiator (B) is a bisimidazole compound.

4. The curable composition according to claim 1, further comprising an alkoxysilane compound (F).

5. The curable composition according to claim 1, further comprising, in addition to the photopolymerization initiator (B), at least one compound of a mercapto compound, an aminobenzene derivative, an alkoxybenzene derivative, an alkylthiobenzene derivative, a thioxanthone derivative, or a coumarin derivative.

6. A color filter comprising a colored pattern formed using the curable composition of claim 1.

7. A method for manufacturing a color filter, the method comprising:

coating the curable composition of claim 1 to form a colored curable composition layer on or above a support;

exposing the curable composition layer to light through a mask; and developing the curable composition layer after exposure to form a colored pattern.

* * * * *